(12) United States Patent
Yang et al.

(10) Patent No.: US 11,722,116 B2
(45) Date of Patent: Aug. 8, 2023

(54) ACOUSTIC RESONATORS AND FILTERS THAT SUPPORT FIFTH GENERATION (5G) WIRELESS COMMUNICATIONS STANDARDS

(71) Applicant: Board of Trustees of the University of Illinois, Urbana, IL (US)

(72) Inventors: Yansong Yang, Urbana, IL (US); Ruochen Lu, Champaign, IL (US); Songbin Gong, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 351 days.

(21) Appl. No.: 17/247,040

(22) Filed: Nov. 24, 2020

(65) Prior Publication Data

US 2021/0159874 A1 May 27, 2021

Related U.S. Application Data

(60) Provisional application No. 62/939,817, filed on Nov. 25, 2019.

(51) Int. Cl.
*H03H 9/02* (2006.01)
*H03H 3/02* (2006.01)
(Continued)

(52) U.S. Cl.
CPC .......... *H03H 9/02228* (2013.01); *H03H 3/02* (2013.01); *H03H 9/02031* (2013.01);
(Continued)

(58) Field of Classification Search
CPC .. H03H 9/02228; H03H 3/02; H03H 9/02031; H03H 9/173; H03H 9/176;
(Continued)

(56) References Cited

U.S. PATENT DOCUMENTS

| 4,642,507 A | 2/1987 | Suthers et al. |
| 2014/0009032 A1* | 1/2014 | Takahashi .......... H03H 9/02228 29/25.35 |

OTHER PUBLICATIONS

"5G New Radio Solutions: Revolutionary Applications Here Sooner Than you Think," Skyworks Solutions, Inc., San Irvine, CA, USA, available at www.skyworksinc.com, accessed Feb. 11, 2021, 16, pages.

(Continued)

*Primary Examiner* — Rakesh B Patel
*Assistant Examiner* — Jorge L Salazar, Jr.
(74) *Attorney, Agent, or Firm* — Lowenstein Sandler LLP

(57) ABSTRACT

An apparatus includes a piezoelectric thin film suspended above a carrier substrate, where the piezoelectric thin film is of one of lithium niobate ($LiNbO_3$) or lithium tantalate ($LiTaO_3$) adapted to propagate an acoustic wave in a Lamb wave mode excited by a component of an electric field that is oriented in a longitudinal direction along a length of the piezoelectric thin film. A signal electrode is disposed on, and in physical contact with, the piezoelectric thin film and oriented perpendicular to the longitudinal direction. A ground electrode disposed on, and in physical contact with, the piezoelectric thin film and oriented perpendicular to the longitudinal direction, where the ground electrode is separated from the signal electrode by a gap comprising a longitudinal distance and in which the acoustic wave resonates. A release window is formed within the piezoelectric thin film adjacent to the ground electrode.

30 Claims, 34 Drawing Sheets

(51) Int. Cl.
  *H03H 9/17* (2006.01)
  *H03H 9/56* (2006.01)
(52) U.S. Cl.
  CPC ............ *H03H 9/173* (2013.01); *H03H 9/176* (2013.01); *H03H 9/562* (2013.01); *H03H 9/564* (2013.01); *H03H 9/568* (2013.01); *H03H 2003/021* (2013.01)
(58) Field of Classification Search
  CPC ........ H03H 9/562; H03H 9/564; H03H 9/568; H03H 2003/021; H03H 9/02559; H03H 9/542
  USPC .......................................... 333/133, 193–196
  See application file for complete search history.

(56) References Cited

OTHER PUBLICATIONS

"5G Spectrum GSMA Public Policy Position," GSMA 2019, available at http://gsma.com/spectrum/wp-content/uploads/2019/09/5G-Spectrum-Positions.pdf, Mar. 2020, 12 pages.
"GTI 5G Device RF Component Research Report," GTI [Online], available at http://gitgroup.org/news/gti/2019-11-22/14446.html.
Accatino, L. et al., "Elliptical Cavity Resonators for Dual-Mode Narrow-band Filters," IEEE Trans. Microw. Theory Techn., vol. 25, No. 12, pp. 2393-2401, Dec. 1997.
Aigner, R. et al., "BAW Filters for 5G Bands," 2018 IEEE International Electron Devices Meeting (IEDM), 2018, pp. 14.5.1-14.5.4.
Akgul, M. et al., "A Negative-Capacitance Equivalent Circuit Model for Parallel-Plate Capacitive-Gap-Transduced Micromechanical Resonators", IEEE Trans, Ultrason., Ferroelectr., Freq. Control, vol. 61, No. 5, pp. 849-869, May 2014.
Assila, N. et al., "High-Frequency Resonator Using A1 Lamb Wave Mode in LiTaO3 Plate," IEEE Trans. Ultrason. Ferreelectr. Freq. Contral, vol. 66, No. 9, pp. 1529-1535, Sep. 2019.
Bjursrom, J. et al., An Accurate Direct Extraction Technique for the MBVD Resonator Model, Proc. 34th Eur. Microw. Conf., vol. 3, Oct. 2004, pp. 1241-1244.
Bunch, J.S. et al., "Electronechanical Resonators form Graphene Sheets," Science, vol. 315, No. 5811, pp. 490-493, Jan. 2007.
Cassella, C. et al., "Aluminum Nitride Cross-Sectional Lame Mode Resonators," J. Microelectromech. Syst., vol. 25, No. 2, pp. 275-285, Apr. 2016.
Chen, A, et al., "Compact Ka-Band Substrate Integrated Waveguide Filter with Spurlines for Satellite Communication Systems," Proc. IEEE 9th U.K.-Europe-China Workshop Millimetre Waves Terahertz Techno. (UCMMT), Sep. 2016, pp. 10-11.
Chen, G. et al., "High-Q X Band Aluminum Nitride Combined Overtone Reasonators," Proc. Joint Conf. IEEE Int. Freq. Control. Symp. Eur. Freq. Time Forum (EETF/IFC), Apr. 2019, pp. 1-3.
Chen, X.P. et al., "Substrate Integrated Waveguide Filters: Design Techniques and Structure Innovations," IEEE Microw. Mag., vol. 15, No. 6, pp. 121-133, Sep. 2014.
Chitara, B. et al., "High-Frequency Electromechanical Resonators Based on Thin GaTe," Nanotechnology, vol. 28, No. 42, Oct. 2017, Art. No. 42LT02.
Colombo, L., et al., "X-Cut Lithium Niobate Laterally Vibrating MEMS Resonator with Figure of Merti of 1560," J. MicroElectromech. Syst., vol. 27, No. 4, pp. 602-604, Aug. 2018.
Gong, S. et al., "Design and Analysis of Lithium-Niobate-Based High Electromechanical Coupling FR-MEMS Resonators for Wide-Band Filtering," IEEE Trans. Microw. Theory Techn., vol. 61, No. 1, pp. 403-414, Jan. 2013.
Gong, S. et al., "Figure-of-Merit Enhancement for Laterally Vibrating Lithium Niobate MEMS Resonators," IEEE Trans. Electron Devices, vol. 60, No. 11, pp. 3888-3894, Nov. 2013.
Grigorievskii, V.I. et al., "Cubic Frequency Temperature Dependence in Perodic Structures of Recessed Electrodes on Quatz," 2012 IEEE International Ultrasonics Symposium, 2012, pp. 803-806.
Hara, M. et al., "Super-High Frequency Band Filters Configured with Air-Gap-Type Thin-Film Bulk Acoustic Resonators," Jpn. J. Appl. IPhys., vol. 49, No. 7, Jul. 2010, Art No. 07HD13.
Hartmann, C.S., et al., "Overview of Design Challenges for Single Phase Unidirectional SAW Filters," Proceedings, IEEE Ultrasonic Symposium, 1989, vol. 1, pp. 79-89.
Hill, M.J., et al. "A High-Q Reconfigurable Planar EBG Cavity Resonator," IEEE Microw. Wireless Compon. Lett., vol. 11, No. 6, pp. 255-257, Jun. 2001.
Iborra, E. et al., "Optimization of Thin AlN Sputtered Films for X-Band BAW Resonators," Proc. IEEE Int. Ultrason. Symp., Oct. 2010, pp. 1688-1691.
Kadota, M. et al., "LiNbO3 Thin Film for A1 Mode of Lamb Wave Resonators," Phys. Status Solidi, vol. 208, No. 5, pp. 1068-1071, May 2011.
Kimura, T. et al., "Applicability Investigation of SAW Devices in the 3 to 5 GHz Range," 2018 IEEE/MTT-S International Microwave Symposium—IMS, 2018. pp. 846-848.
Kimura, T. et al., "Comparative Study of Acoustic Wave Devices Using Thin Piezoelectric Plates in the 3-5 GHz Range," IEEE Trans. Microw. Theory Tech., vol. 67, No. 3, pp. 915-921, Mar. 2019.
Kimura, T. et al., "High Q SAW Resonator Using Upper-Electrodes on Grooved-Electrodes in LiTaO3," in IEEE MTT-S Int. Microw. Symp. Dig., May 2010, pp. 1740-1743.
Kiumura, T. et al., "A High Velocity and Widdeband SAW on a Thin LiNbO3 Plate Bonded on a Si Substrate in the SHF Range," IEEE International Ultrasonics Symposium, IUS, vol. 2019, Oct. 2019, pp. 1239-1248.
Kourani, A. et al., "A Ku-Band Oscillator Utilitzing Overtone Lithium Niobate RF-MEMS Resonator for 5G," IEEE Microw. Wireless Compon. Lett., vol. 30, No. 7, pp. 681-684, Jul. 2020.
Larson, J.D. et al., "Modified Butterworth-Van Dyke Circuit for FBAR Resonators and Automated Measurement System," Proc. IEEE Ultrason. Symp., vol. 1, Oct. 2000, pp. 863-868.
Liang, X.P. et al., "Modeling of Cylindrical Dielectric Resonators in Rectangular Waveguides and Cavitites," IEEE Trans. Microw. Theory Techn., vol. 41, No. 12, pp. 2174-2181, Dec. 1993.
Loebl, H.P. et al., "Piezoelectric Thin AlN Films for Bulk Acoustic Wave (BAW) Resonators," Mater. Chem. Phys., vol. 79, Nos. 2-3, pp. 143-146, Apr. 2003.
Lu, R. et al., "5-GHz Antisymmetric Mode Acoustic Delay Lines in Lithium Niobate Thin Film," IEEE Trans. Microw. Theory Tech., pp. 1-17, Jul. 2019.
Lu, R. et al., "5-GHz Antisymmetric Mode Acoustic Delay Lines in Lithium Niobate Thin Film," IEEE Trans. Microw. Theory Techn., vol. 68, No. 2, pp. 573-589, Feb. 2020.
Lu, R. et al., "A1 Resonators in 128° Y-Cut Lithium Niobate with Electromechanical Coupling of 46.4%," J. Microelectromechanical Syst., vol. 29, No. 3, pp. 313-319, Jun. 2020.
Lu, R. et al., "Accurate Extraction of Large Electromechanical Coupling in Piezoelectric MEMS Resonators," J. Microelectromech. Syst., vol. 28, No. 2, pp. 209-218, Apr. 2019.
Lu, R. et al., "GHz Broadband SHO Mode Lithium Niobate Acoustic Delay Lines," IEEE Trans. Ultrason. Ferroelectr. Freq. Control vol. 67, No. 2, pp. 402-412, Feb. 2020, doi:10.1109/TUFF.2019.2943355.
Manzaneque, T. et al., "Low-Loss and Wideband Acoustic Delay Lines," IEEE Trans. Microw. Theory Tech., vol. 67, No. 4, 2019.
Mccloy, J.S. et al., "Millimeter-Wave Dielectric Properties of Single-Crystal Ferroelectric and Dielectric Materials," IEEE Trans. Ultrason. Ferroelectr., Freq. Control, vol. 58, No. 1, pp. 18-29, Jan. 2011.
Olsson R.H. et al., "A High Electromechanical Coupling Coefficient SH0 Lamb Wave Lithium Niobate Micromechanical Resonator and a Method for Fabrication," Sens. Actuators A, Phys., vol. 209, pp. 183-190, Mar. 2014.
Papapolymerou, J. et al., "A Micromachined High-Q X-Band Resonator," IEEE Microw. Guided Wave Lett., vol. 7, No. 6, pp. 168-170, Jun. 1997.
Piazza, G. et al. "Low Motional Resistance Ring-Shaped Contour-Mode Aluminum Nitride Piezoelectric Micromeckanical Resona-

(56) References Cited

OTHER PUBLICATIONS tors for UHF Applications," Proc. 18th IEEE Int. Conf. Micro Electro Mech. Syst. (MEMS), Jan./Feb. 2005, pp. 20-23.
Piazza, G. et al., "Piezoelectric Aluminum Nitride Vibrating Contour-Mode MEMS Resonators," J. Microelectromech. Syst., vol. 15, No. 6, pp. 1406-1418, Dec. 2006.
Plessky, V. et al., "5GHz Laterally-Excited Bulk-Wave Resonators (XBARs) based on Thin Platelets of Lithium Niobate," Electron. Lett., vol. 55, No. 2, pp. 98-100, Jan. 2019.
Psychogiou, D. et al., "Hybrid Acoustic-Wave-Lumped-elements Resonators (AWLRS) for High-Q Bandpass Filters with Quasi-Elliptic Frequency Response," IEEE Trans. Microw. Theory Techn., vol. 63, No. 7, pp. 2233-2244, Jul. 2015.
Psychogiou, D. et al., "Tunable Coaxial Cavity Resonator-Based Filters Using Actuated Liquid Metal Posts," IEEE Microw. Wireless Compon. Lett., vol. 29, No. 12, pp. 763-766, Dec. 2019.
Rinaldi, M. et al., "5-10 GHz AlN Contour-Mode Nanoelectromechanical Resonators," Proc. IEEE 22nd Int. Conf. Micro Electro Mech. Syst., Jan. 2009, pp. 916-919.
Ruby, R. et al., "Method of Extracting Unloaded Q Applied Across Different Resonator Technologies," 2008 IEEE Ultrasonics Symposium, 2008, pp. 1815-1818.
Ruby, R. et al., "Positioning FBAR Technolgoy in the Frequency and Timing Domain," IEEE Trans. Ultrason. Ferroelectr. Freq. Control, vol. 59, No. 3, pp. 334-345, Mar. 2012.
Satoh, Y. et al., "Development of 5GHz FBAR Filters for Wireless Systems", Fujitsu Laboratories Ltd., Akashi, Japan, published 2004, 4 pages.
Schafer, M. et al., "Process and Design Challenge for SMR-Type Bulk Acoustic Wave (BAW) Filters at Frequencies above 5 GHz," Proc. IEEE Int. Ultrason. Symp. (IUS), Oct. 2019, pp. 1696-1699.
Schermer, R.T. et al., "Millimeter-Wave Dielectric Properties of Highly Refractive Single Crystal Characterized by Waveguide Cavity Resonance," Adv. Mater. Interfaces, vol. 67, No. 3, pp. 1-36, 2019.
Semnani, A. et al., "Field Emission Mitigation in X-Band Silicon-Etched Cavity Resonators," IEEE MTT-S Int. Micro. Symp. Dig., May 2016, pp. 1-4.
Shen, Y. et al., "452 MHz Bandwidth, High Rejection 5.6 GHz UNII XBAW Coexistence Filters Using Doped AlN-on-Silicon," IEDM Tech. Dig. Dec. 2019, vol. 5, No. 6, pp. 1-4.
Smith, W.R. et al., "Analysis of Interdigital Surface Wave Transducers by Use of an Equivalent Circuit Model," IEEE Trans. Microw. Theory Tech. vol. 17, No. 11, pp. 856-864, Nov. 1969.
Song, Y.H. et al., "Analysis and Removal of Spurious Response in SH0 Lithium Niobate MEMS Resonators," IEEE Trans. Electron Devices, vol. 63, No. 5, pp. 2066-2073, May 2016.
Takai, T. et al., "I.H.P. SAW Technology and its Application to Microacoustic Components (Invited)," Proc. IEEE Int. Ultrason. Symp. (IUS), Sep. 2017, pp. 1-8.
Tanski, W.J., "Surface Acoustic Wave Resonators on Quartz," IEEE Trans. Sonics Ultrason, vol. 26, No. 2, pp. 93-104, Mar. 1979.
Turner, P.J. et al., "5GHz Band n79 Wideband Microacoustic Filter Using Thin Lithium Niobate Membrane," Electron. Lett., vol. 55, No. 17, pp. 942-944, Aug. 2019.
Van Beek, J.T.M. et al., "A 10 MHz Piezoresistive MEMS Resonator with High Q," Proc. IEEE Int. Freq. Control Symp. Expo., Jun. 2006, pp. 475-480.
Wakino, K. et al., "Miniaturization Technolgies of Dielectric Resonator Filters for Mobile Communications," IEEE Trans. Microw. Theory Techn., vol. 24, No. 7, pp. 1295-1300, Jul. 1994.
Wang, K. et al., "VHF Free-Free Beam High-Q Micromechanica Resonators," J. Microelecgtromech. Syst., vol. 9, No. 3, pp. 347-360, Sep. 2000.
Wang, R. et al., "Deisgn Fabrication of S0 Lab-Wave Thin Film Lithium Niobate Micromechanical Resonators," J. Microelectromech. Syst., vol. 24, No. 2, pp. 300-308, Apr. 2015.
Yang, Y. et al., "1.7 GHz Y-Cut Lithium Niobate MEMS Resonators with FoM of 336 and fQ of 9.15x^12," 2018 IEEE/MTT-S International Microwave Symposium-IMS, 2018, pp. 563-566.
Yang, Y. et al., "4.5 GHz Lithium Niobate MEMS Filters with 10% fractional Bandwidth for 5G Front-Ends," J. Microelectromech. Syst., vol. 28, No. 4, pp. 575-577, Aug. 2019.
Yang, Y. et al., "5GHz Lithium Niobate MEMS Resonators with High FoM of 153," 2017 IEEE 30th International Conference on Micro Electro Mechanical Systems (MEMS), 2017, pp. 942-945.
Yang, Y. et al., "A 1.65 GHz Lithium Niobate A1 Resonator with Electromechanical Coupling of 14% and Q of 3112," 2019 IEEE 32nd International Conference on Micron Electro Mechanical Systems (MEMS), 2019, pp. 875-878.
Yang, Y. et al., "High Q Antisymmetric Mode Lithium Niobate MEMS Resonators with Spurious Mitigation," J. Microelectromechinaical Syst., vol. 29, No. 2, pp. 135-143, Apr. 2020.
Yang, Y. et al., "Scaling Accoustic Filters Towards 5G," 2018 IEEE Inemational Electron Device Meeting (IEDM), 2018, vol. Dec. 2018, pp. 39.6.1-39.6.4.
Yang, Y. et al., "Toward Ka Band Acoustics: Lithium Niobate Asymmetrical Mode Piezoelectric MEMS Resonators," 2018 IEEE International Frequency Control Symposium (IFCS), 2018, pp. 1-5.
Yu, Y. et al., "Monolithic Silicon Micromachined Ka-Band Filters," Proc. Int. Conf. Microw. Millim. Wave Technol., vol. 3, Apr. 2008, pp. 1397-1400.
Zuo, C. et al., "Hybrid Filter Design for 5G Using IPD and Acoustic Technologies," 2019 IEEE International Ultrasonics Symposium, 2019, pp. 1-4.

* cited by examiner

1040 – Etching Mask (SiO₂) Definition

1050 – ICP-RIE of LiNbO₃

1060 – Device Released Using HF
414

1010 – Transferred LiNbO₃ Thin Film

1020 – Top Electrodes Definition

1030 – Deposit PECVD SiO₂ Thin Film

LiNbO₃  SiO₂  Al

1000

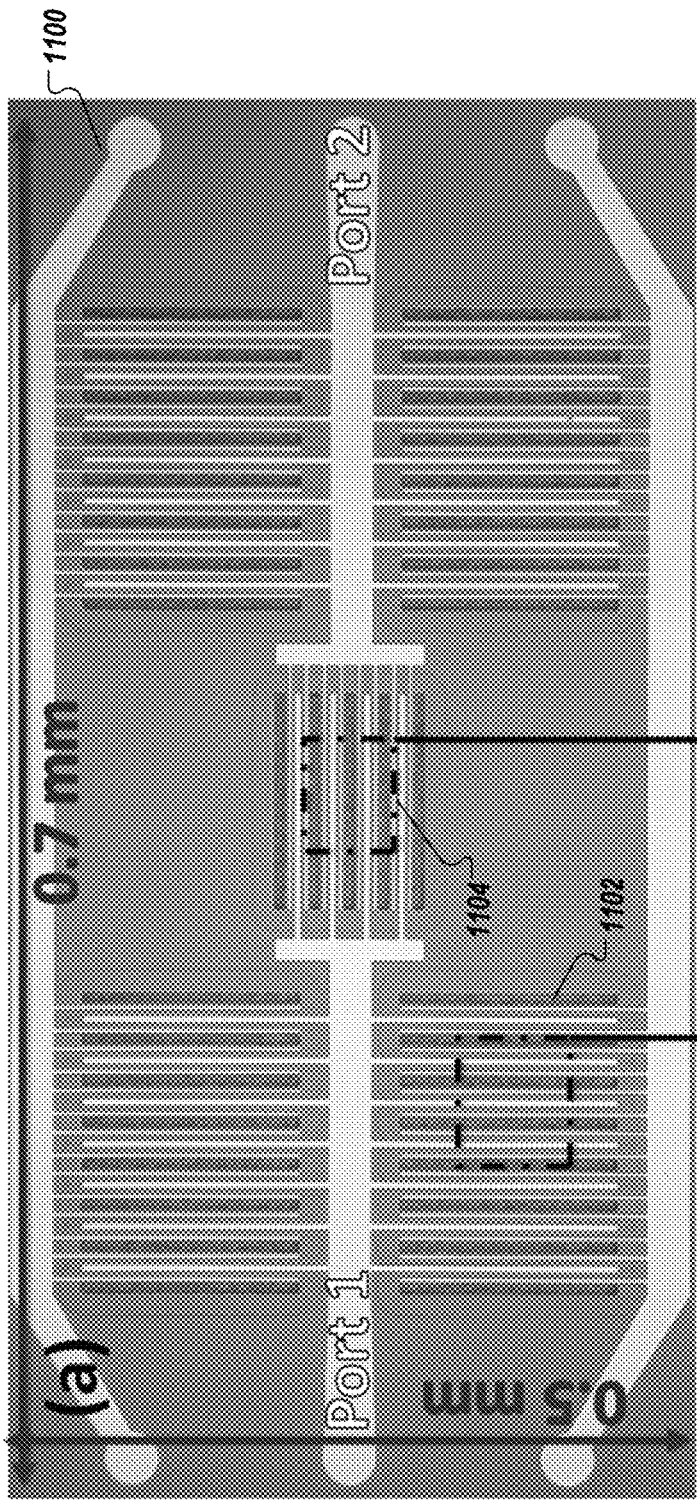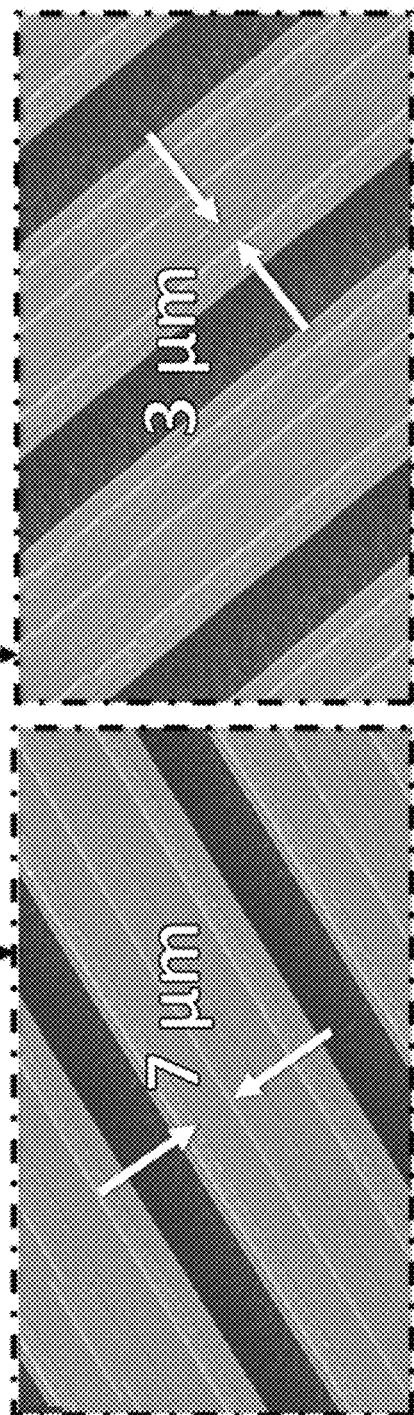
FIG. 24
FIG. 24A
FIG. 24B

ACOUSTIC RESONATORS AND FILTERS THAT SUPPORT FIFTH GENERATION (5G) WIRELESS COMMUNICATIONS STANDARDS

RELATED APPLICATIONS

This application claims the benefit under 35 U.S.C. § 119(e) of U.S. Provisional Patent Application No. 62/939,817, filed Nov. 25, 2019, which is incorporated herein by this reference in its entirety.

FEDERALLY SPONSORED RESEARCH OR DEVELOPMENT

This disclosure was made with government support under contract numbers HR0011-15-C-0008, HR0011-17-C-0107, and sub-award contract number GG11856.150042-02 awarded by the Defense Advanced Research Projects Agency-Microsystem Technology Office (DARP-MTO) Near Zero Power RF and Sensor Operations (NZERO). The government has certain rights in the invention.

BACKGROUND

As frequency bands below 6 gigahertz (GHz) have already been fully allocated, the demand for more physical bandwidth to support increasing mobile data traffic has pushed 5G wireless systems towards higher frequencies. A mobile radio frequency (RF) front-end beyond 10 GHz that can exceed the performance of its sub-6 GHz counterparts can contribute to wireless connectivity promised by fifth generation (5G) wireless communications. One of the challenges in implementing front-ends at frequencies greater than 10 GHz lies in the lack of high-performance miniature filters that can reject interference while allowing efficient access to the spectrum.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 24 is an optical image of a fabricated ladder filter that includes series resonators and shunt resonators according to some embodiments.

FIG. 24A is a zoomed-in SEM optical image of the electrode gap of shunt resonators according to some embodiments.

FIG. 24B is a zoomed-in SEM optical image of the electrode gap of series resonators according to some embodiments.

DETAILED DESCRIPTION

Figure 1:
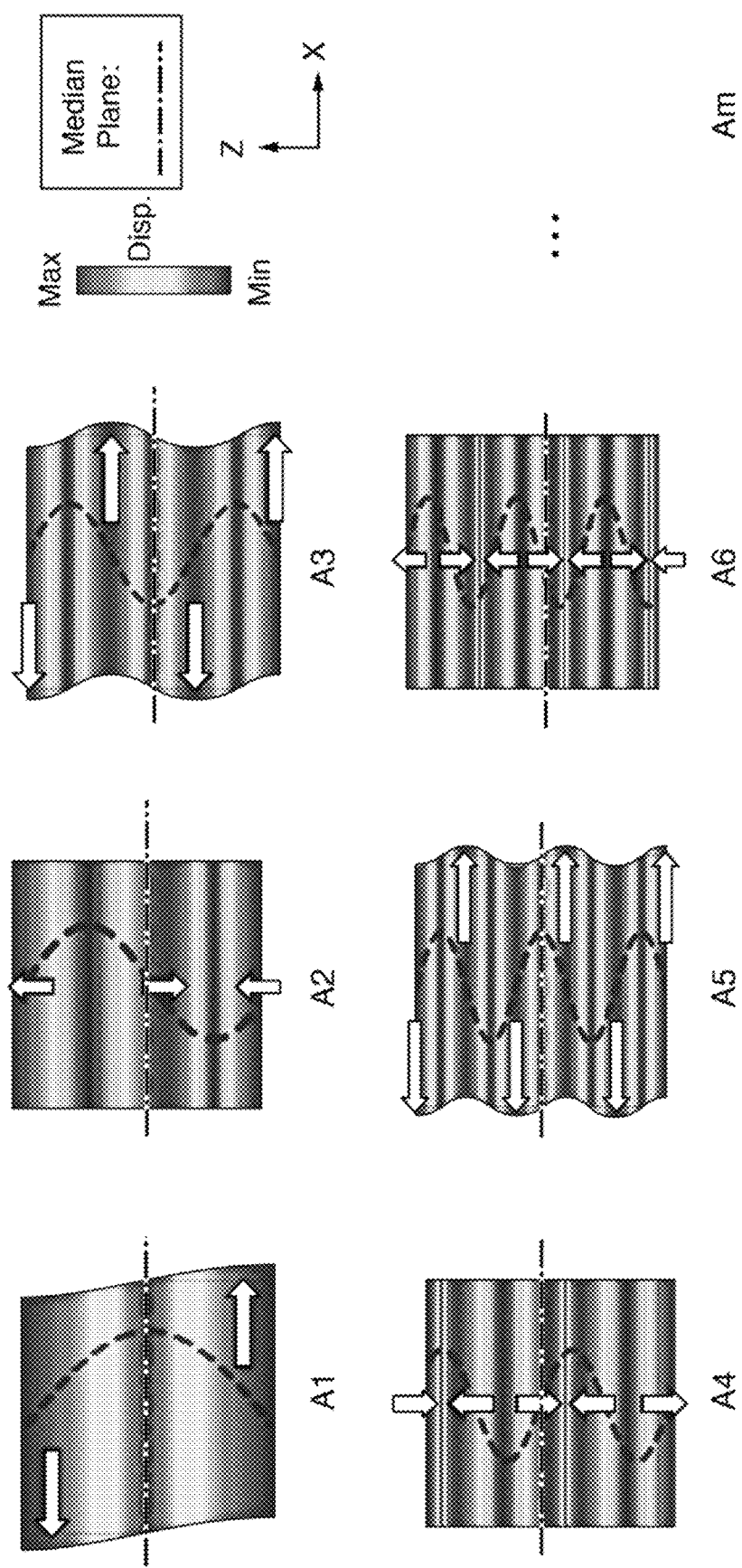
FIG. 1 is a set of finite-element analysis (FEA)-simulated images illustrating displacement modes for various Lamb wave modes with corresponding displacement directions within a piezoelectric thin film (such as lithium niobate, $LiNbO_3$) according to some embodiments.

By way of introduction, the present disclosure relates to scaling of acoustic resonators and filters towards fifth generation (5G) and other high-frequency wireless communication frequencies. Microelectromechanical system (MEMS) filters are a first step towards scaling electromechanical filters towards 5G frequencies. Scaling of the center, or primary resonance, frequency is possible by resorting to a higher order asymmetrical Lamb wave mode in piezoelectric thin film MEMS-based resonators. In some embodiments, the piezoelectric thin film is lithium niobate (LiNbO$_3$), lithium tantalate (LiTaO$_3$), or a combination thereof, for example.

Some commercial solutions for 4G front-end filters can be surface acoustic wave (SAW) filters and film-bulk-acoustic-resonator (FBAR) filters. Their resonances can be largely limited to frequencies below 6 GHz. One promising candidate for enabling acoustic or micro-electro-mechanical system (e.g., MEMS filters) at frequencies greater than 6 GHz can be higher-order asymmetric Lamb wave resonators based on LiNbO$_3$. These resonators can have different orders of modes over a wide frequency range (e.g., 1-30 GHz), and can thus potentially enable 5G front-end filters.

Radio frequency filters are components often employed in front ends of transceivers for selecting the input signal, improving the signal to noise ratio, avoiding spectrum growth, and duplexing transmitting and/or receiving paths.

Such filters can be implemented across the entire microwave frequency range (300 MHz-30 GHz) with various technologies for addressing requirements in size, cost, weight, and performance. Recently, due to the cellular market demand for larger bandwidth (BW) and higher data rates, the sub-6-GHz spectrum has become increasingly crowded with little available spectrums for the expansion of 5G systems. As a result, 5G systems, despite varying standards around the globe, have in some cases turned to millimeter-wave frequency ranges (24.25-40 GHz for bands n257-n260, dubbed as 5G high-band). Frequencies up to 66 GHz can currently be utilized. Emerging 5G systems can be expected to impose stringent requirements on the size and performance of radio frequency (RF) filters.

Aspects of the present disclosure address the above challenges and opportunities, among others that will be discussed, by using acoustic filters, transducers, and the like that incorporate $LiNbO_3$ or $LiTaO_3$ resonators. In some embodiments, such an acoustic filter can include a pair of shunt resonator arrays coupled to a ground potential, a pair of impedance elements coupled to the ground potential, and a series resonator array coupled between the pair of shunt resonator arrays and further coupled between the pair of impedance elements. The pair of shunt resonator arrays, and the series resonator array, can each include an acoustic resonator as disclosed herein. Other types of resonator-based filters will be discussed herein.

In various embodiments, the acoustic resonator includes a piezoelectric thin film suspended above a carrier substrate. In one embodiment, the piezoelectric thin film is composed of Z-cut $LiNbO_3$, which was the focus of study, but other cuts of $LiNbO_3$ or $LiTaO_3$ are envisioned, including an X cut or a Y cut of these materials. The Y cut can, for example, be a more specific-angled Y cut, to include 128° Y or 36° Y. The piezoelectric thin film is adapted to propagate an acoustic wave in a Lamb wave mode excited by a component of an electric field that is oriented in a longitudinal direction along a length of the piezoelectric thin film. A signal electrode is disposed on, and in physical contact with, the piezoelectric thin film and oriented perpendicular to the longitudinal direction. A ground electrode is disposed on, and in physical contact with, the piezoelectric thin film and oriented perpendicular to the longitudinal direction. The ground electrode and signal electrode can be ones of multiple interdigitated electrodes of the resonator. The ground electrode can be separated from the signal electrode by a gap that defines a longitudinal distance and in which the acoustic wave resonates. A release window can be formed within the piezoelectric thin film adjacent to the ground electrode.

In some embodiments, a second ground electrode is disposed on, and in physical contact with, the piezoelectric thin film and oriented perpendicular to the longitudinal direction. The second ground electrode can also be separated from the signal electrode by a second gap that defines the longitudinal distance, and where the acoustic wave also resonates within the second gap. A second release window can be formed within the piezoelectric thin film adjacent to the second ground electrode. A resonant frequency of the Lamb wave mode is determined at least in part by the longitudinal distance of the gap (and the second gap). That longitudinal distance, for example, can be between 1 micron (µm) and 25 µm. In another embodiment, the longitudinal distance is between 2 µm and 7 µm.

In some embodiments, the disclosed acoustic filters can operate at frequencies greater than 10 GHz. The frequency scaling of this class of resonator devices and its impact on electromechanical coupling ($k_t^2$) will be described herein.

Further, spurious modes response and energy confinement of asymmetric Lamb wave modes will be described. A film thickness of 500 nm can be chosen as an illustrative example to show a scaling of a third-order asymmetric (A3) mode to 10.8 GHz, but other thickness and modes will be discussed. One of the resonators described herein can have a $k_t^2$ of 3.6% and a mechanical quality factor, Q, of 337 at 10.8 gigahertz (GHz). One of the filters described herein can have a 3 decibel (dB) bandwidth of 70 megahertz (MHz) and an insertion loss (IL) of 3.7 dB at 10.8 GHz.

Some electromechanical resonators using $LiNbO_3$ or $LiTaO_3$ piezoelectric thin films can operate in a frequency range of between 10-60 GHz. For example, described herein are a new class MEMS resonator operating at frequencies upwards of 60 GHz for 5G wireless communications. A wide range of the operating frequencies can be achieved by using different orders of the antisymmetric Lamb wave modes in Z-cut $LiNbO_3$ or $LiTaO_3$ as the piezoelectric thin film, for example. In one embodiment, the piezoelectric thin film is 400 nm-thick. A resonance of 55 GHz is demonstrated, a high operating frequency for piezoelectric MEMS devices. The fabricated devices can exhibit an extracted Q value of 340 and an fxQ product of $1.87 \times 10^{13}$ in a footprint of $2 \times 10^{-3}$ mm². The performance can indicate a strong potential of $LiNbO_3$ asymmetric mode devices for front-end applications in 5G high-band, for example.

State-of-the-art passive RF filters operating at room temperature and below 66 GHz can be broadly categorized into two types: electromagnetic (EM) filters or electromechanical filters. Either type can further be divided into resonant and nonresonant filters. The resonant filters rely on networking resonators for synthesizing desired frequency domain response, whereas nonresonant filters use wave propagation in structures that either have dispersion-dependent or frequency-dependent transductions. Nonresonant filters can be used in infrastructure applications, but often do not have sharp roll-off and low insertion loss (IL) requirements concurrently for cellular applications. It should be noted that resonators can be described herein as resonant filters.

Between electromagnetic (EM) and electromechanical resonators, the EM resonators at RF have a much longer history, dating back to the early development of radar systems. These EM resonators utilize EM cavities that are filled with low loss dielectric materials and can be bounded with reflective boundaries to both confine energy and induce resonance. To achieve a high quality factor (Q) and low IL, the dielectric and conduction should be carefully managed regarding material selections and designs. To minimize the resonator size, the high permittivity (ε) materials with low loss tangents are preferred to reduce phase velocity and wavelength (high ε materials are typically lossy in high frequency range). However, as the unloaded Q of the small resonator is approximately proportional to the cubic root of the volume, small size and low loss are often not simultaneously attainable. Table 1 indicates by example some possible representative state-of-the-art EM resonators with extremely high Q factors compared to the various resonators disclosed herein. The challenging problem with employing EM resonators for handheld applications may remain in their overly large size.

TABLE 1

| Referenced Device | Frequency | Unloaded Q | Size |
|---|---|---|---|
| Si Cavity | 8-12 GHz | 526 | >500 mm² |
| Coaxial Waveguide | 9.9 GHz | 400 | >400 mm² |

TABLE 1-continued

| Referenced Device | Frequency | Unloaded Q | Size |
|---|---|---|---|
| Microstrip-coupled Cavity | 10.6 GHz | 448 | >200 mm$^2$ |
| Evanescent-mode Cavity | 11.15 GHz | 558 | >240 mm$^2$ |
| Si SIW | 30.9 GHz | 341 | >4 mm$^2$ |
| Present Work | 13 GHz | 372 | $2 \times 10^{-3}$ mm$^2$ |
|  | 21.6 GHz | 566 | $2 \times 10^{-3}$ mm$^2$ |
|  | 30.2 GHz | 715 | $2 \times 10^{-3}$ mm$^2$ |
|  | 38.8 GHz | 539 | $2 \times 10^{-3}$ mm$^2$ |
|  | 47.4 GHz | 474 | $2 \times 10^{-3}$ mm$^2$ |
|  | 55.7 GHz | 340 | $2 \times 10^{-3}$ mm$^2$ |

Further, electromechanical resonators, which can resort to acoustic standing waves, have a much smaller size due to the orders of magnitude lower phase velocities of acoustic waves than EM waves. However, accessing the mechanical resonances for electrical signal processing can require an electromechanical transduction mechanism, of which the efficiency is measured by $k_t^2$. The electromechanical coupling has significant implications on filter performance because the bandwidth (BW) of a filter, regardless of its resonator composition, can be set by the inter-resonator coupling.

In EM resonator-based filters, the coupling can be tuned exclusively in the electrical domain inductively, capacitively, or collectively with both. In contrast, the inter-resonator coupling of electromechanical resonator-based filters can be set by both the inter-coupling between resonators in the electrical domain and the electromechanical coupling ($k_t^2$) between electrical and mechanical domains. Whereas the former could be tuned over a wide range simply by adjusting the coupling capacitance and inductance, $k_t^2$ can have some limits set by transduction mechanisms, their involved fabrication limitations, and material properties. In fact, the inter-coupling between resonators is set to one ("1") in common electromechanical filter topologies so the BW can be maximized to the limit allowed by $k_t^2$.

TABLE 2

| Referenced Device | f(GHz) | Q | $k_t^2$ | FoM | f · Q |
|---|---|---|---|---|---|
| LiTaO$_3$ SAW | 2 | 1000 | 7% | 70 | $2.0 \times 10^{12}$ |
| I.H.P SAW | 1.9 | 4000 | 8% | 320 | $7.6 \times 10^{12}$ |
| I.H.P SAW | 3.5 | 1900 | 8% | 152 | $6.65 \times 10^{12}$ |
| AlN FBAW | 2 | 3670 | 4.7% | 172 | $7.34 \times 10^{12}$ |
| AlN FBAW | 5.1 | 913 | 6.4% | 58.4 | $4.56 \times 10^{12}$ |
| ScAlN BAW | 3 | 2400 | 8.2% | 197 | $7.2 \times 10^{12}$ |
| AlN XBAW | 5.66 | 1479 | 10.24% | 152 | $8.4 \times 10^{12}$ |
| LiNbO$_3$ S0 | 0.5 | 1300 | 21.7% | 280 | $0.65 \times 10^{12}$ |
| LiNbO$_3$ SH0 | 0.35 | 2150 | 14.5% | 365 | $0.75 \times 10^{12}$ |
| LiNbO$_3$ S0 | 0.05 | 5110 | 30.7% | 1569 | $0.26 \times 10^{12}$ |
| LiNbO$_3$ A1 | 4.35 | 527 | 29% | 153 | $2.3 \times 10^{12}$ |
| LiNbO$_3$ A1 | 1.7 | 5341 | 6.3% | 336 | $9.2 \times 10^{12}$ |
| LiNbO$_3$ A1 | 1.65 | 3112 | 14% | 435 | $5.1 \times 10^{12}$ |

Modern electro-mechanical filters (seen in Table 2) in the frequency range from 300 MHz to 6 GHz almost all resort to piezoelectric transduction as it offers higher $k_t^2$ than electrostatic, piezoresistive, and opto-electro-mechanical devices. Piezoelectric transduction is a predominately linear effect with insignificant second-order and third-order non-linear coefficients. Several piezoelectric materials have been extensively researched, among which aluminum nitride (AlN), lithium tantalite (LiTaO$_3$), and lithium niobate (LiNbO$_3$) have been commercially successful for enabling surface acoustic wave (SAW) and film bulk acoustic wave (FBAW or BAW) devices. However, their resonances are mostly confined to below 6 GHz for several reasons. SAW devices require narrow interdigital electrodes with sub-200-nm width to scale the resonant frequencies to be over 3.5 GHz, which leads to high loss and poor power handling. Some FBAW or BAW devices are commonly limited in the radio bands below 6 GHz as the edge effects and spurious modes are more pronounced in higher frequencies. Efforts have been made to scale the FBAW device to be 30 GHz. However, the thickness of AlN thin film needs to be thinned down to be 100 nm, and sub-nm-thin ruthenium (Ru) is applied as the electrodes, which would produce high thermal resistance to the surrounding. Overall, significant performance compromises have to be made in scaling conventional piezoelectric resonators to function over 6 GHz.

To overcome these limitations, in some cases, an acoustic wave mode can be selected for resonance in a material that features a large figure-of-merit (FoM=Q×$k_t^2$) and f×Q product and can be excited in the higher order modes. Therefore, the devices with resonance scaling toward millimeter-wave frequencies can still produce reasonable FoM and f×Q product without performance compromises. Some acoustic modes (e.g., fundamental symmetric (S0), fundamental shear-horizontal (SH0), and first-order symmetric (A1)) in LiNbO$_3$ and LiTaO$_3$ can have a high FoM. Among these acoustic wave modes, a first-order antisymmetric Lamb wave (A1) mode has been demonstrated with a record-breaking FoM of 435 in LiNbO$_3$, which can support piezoelectric resonators over 1 GHz. Therefore, A1 mode devices can be considered as a resonator technology for sub-6-GHz applications. Due to performances of the A1 mode devices, higher-order asymmetric (and antisymmetric) modes can be scaled up with the great performance for the resonant frequencies beyond 6 GHz.

Described herein are asymmetric (some of which can also be antisymmetric in some embodiments) Lamb wave modes in Z-cut LiNbO$_3$ thin films at high orders for the applications up to 60 GHz, for purposes of exhibiting various embodiments that can also include Z-cut LiTaO$_3$, Y-cut LiNbO$_3$ or LiTaO$_3$, or X-cut LiNbO$_3$ or LiTaO$_3$. Resonant frequencies and coupling factors of the antisymmetric modes of various orders are described below. Next, the excitation and energy confinement of various orders are analyzed. In addition, the origins of spurious modes are identified, subsequently leading to the optimized design. Based on these studies, a film-thickness of 400 nm is chosen to support the thirteenth-order symmetric (A13) mode up to 55 GHz in one embodiment. The fabricated resonator can be measured with an extracted mechanical Q of 340 at 55 GHz. Such resonator technology can exhibit a unique platform for front-end applications in filtering and frequency synthesis for 5G high-band.

In disclosed embodiments, antisymmetric Lamb waves are a class of Lamb wave sometimes characterized by their anti-symmetry of vibration about a median plane of the plate over which the waves are guided and propagating. Specifically, in two sides of the median plane, vibrations of may have equal displacement components in the direction perpendicular to the median plane but different components in the direction along the median plane. While antisymmetric Lamb waves are illustrated in FIG. 1, asymmetric Lamb wave modes (that don't have perfect anti-symmetry) can also be created in the disclosed resonators and filters, as will be discussed throughout this disclosure.

FIG. 1 is a set of finite-element analysis (FEA)-simulated images illustrating displacement modes for various Lamb wave modes with corresponding displacement directions within a piezoelectric thin film (such as lithium niobate, LiNbO$_3$) according to some embodiments. These Lamb wave modes include a first-order asymmetric (A1) mode, a second-order asymmetric (A2) mode, a third-order asymmetric (A3) mode, and a fourth-order asymmetric (A4) mode, a fifth-order symmetric (A5) mode, and a sixth-order symmetric (A6) mode. To visualize the vibrations of the antisymmetric modes of various orders, COMSOL-based finite-element analysis (FEA) can be used to simulate the displacement mode shapes in a 2D Z-cut LiNbO$_3$ plate with fixed thickness where the top and bottom surfaces can be set as free surfaces, and the boundary in the lateral direction can be set as the infinite extent.

In various embodiments, the order of the mode can be decided by the number of half-wavelength periodicities in the vertical direction, and the $m^{th}$ order antisymmetric Lamb wave can be abbreviated as Am. Due to the physical boundary condition for the free surfaces of the plate, the components of stress in the thickness direction at the top and bottom surfaces are zero. Overmoding antisymmetric Lamb waves in a fixed-thickness plate can yield a higher resonant frequency, provided the intended higher order mode can somehow be excited in the LiNbO$_3$ slab with transducers. It is worth noting that arrows denote the displacement directions. The stress field for each mode order is plotted in the black dashed lines.

Based on the coupling matrix of the Z-cut LiNbO$_3$, antisymmetric Lamb wave modes are caused by the electric field in the same direction of wave propagation (which is the longitudinal direction) to be efficiently excited, and several prior works on A1 mode can be demonstrated. According to Hooke's law of elasticity, to generate an acoustic wave in a piezoelectric material, the mechanical deformations and electric properties should be piezoelectrically coupled. The mutual energy is used to quantitatively measure the coupling between the electrical and mechanical domains $$U_m = \frac{1}{4}\int(TdE+EdT)dV \tag{1}$$

where V is the volume of the piezoelectric body, T is the stress tensor, and E is the electric-field strength vector. The specified acoustic wave can only be generated in a case when $U_m$ is nonzero.

Figure 2:
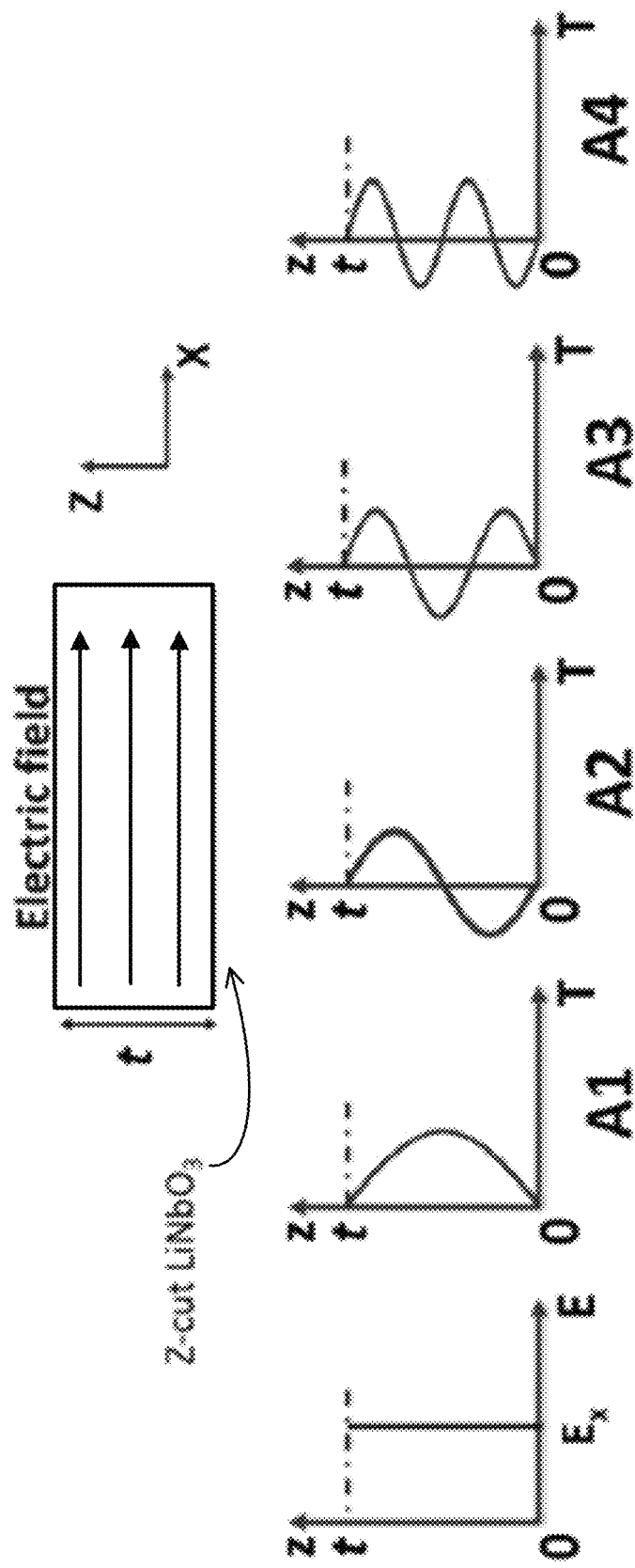
FIG. 2 is a set of graphs illustrating distribution of electrical and stress fields of the first-order asymmetric (A1) mode, a second-order asymmetric (A2) mode, a third-order asymmetric (A3) mode, and a fourth-order asymmetric (A4) mode within a piezoelectric thin film according to some embodiments.
Figure 3A:
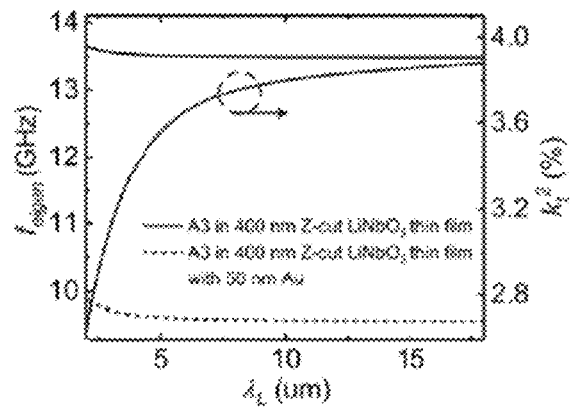
FIGS. 3A-3F are graphs that plot calculated dispersion and electromechanical coupling coefficients ($k_t^2$) of the A3 mode, a fifth-order symmetric (A5) mode, a seventh-order asymmetric (A7) mode, a ninth-order asymmetric (A9) mode, an eleventh-order asymmetric (A11) mode, or a thirteenth-order asymmetric (A13) mode within a piezoelectric thin film according to some embodiments.
Figure 3B:
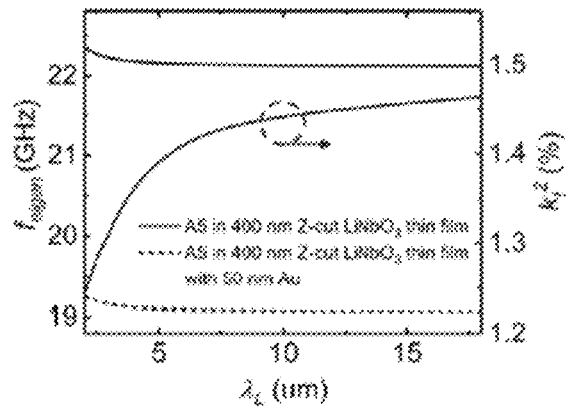
Figure 3C:
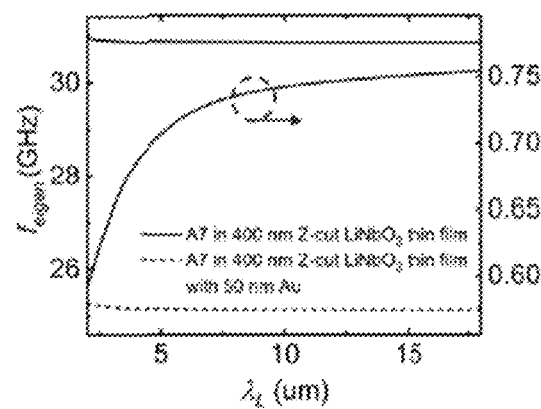
Figure 3D:
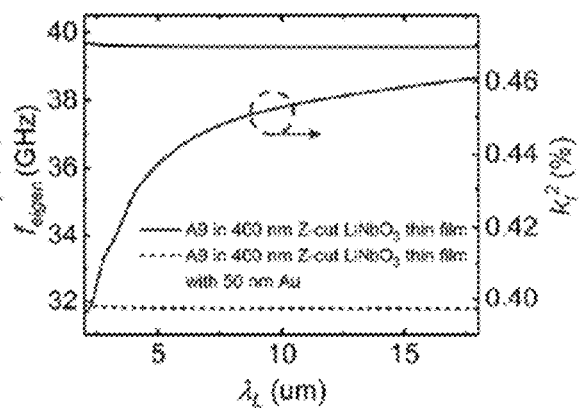
Figure 3E:
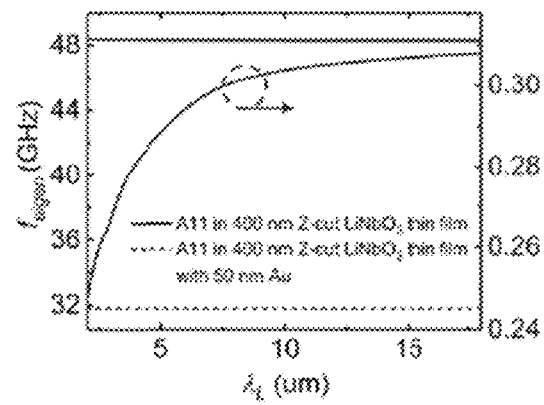
Figure 3F:
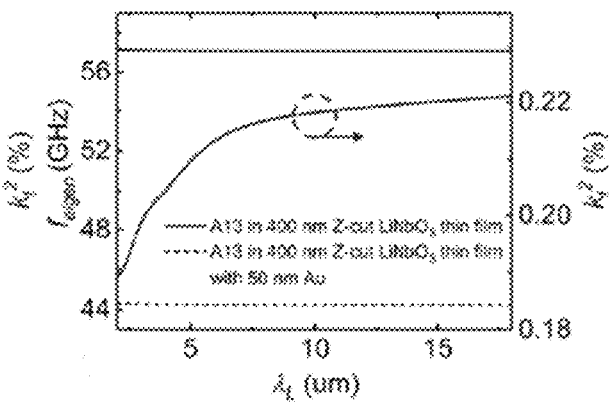

FIG. 2 is a set of graphs illustrating distribution of electrical and stress fields of the first-order asymmetric (A1) mode, a second-order asymmetric (A2) mode, a third-order asymmetric (A3) mode, and a fourth-order asymmetric (A4) mode within a piezoelectric thin film according to some embodiments. To verify the excitation of higher order asymmetric (A)-modes with a longitudinal electric field, in FIG. 2, the E-field is simplified as longitudinally (also referred to as laterally herein) polarized with a uniform magnitude across the thickness of the plate. Thus, the integration of stress and the longitudinal electrical fields vanish for even-order modes and lead to zero $U_m$. On the other hand, odd-order modes can be excited due to the nonzero integral of $U_m$. For the purpose of frequency scaling up to 60 GHz, an over-moding approach should focus on the odd-order modes.

FIGS. 3A-3F are graphs that plot calculated dispersion and electromechanical coupling coefficients ($k_t^2$) of the A3 mode, a fifth-order symmetric (A5) mode, a seventh-order asymmetric (A7) mode, a ninth-order asymmetric (A9) mode, an eleventh-order asymmetric (A11) mode, or a thirteenth-order asymmetric (A13) mode within a piezoelectric thin film according to some embodiments. Resonant frequencies and electromechanical couplings of the higher odd-order A-modes can be well predicted. To simplify the relationship among the resonant frequencies of different orders, the resonator body can be treated as a 2-D cavity. The resonant frequency of an odd-order mode in a 2D cavity with a thickness of t and a length of l can be characterized by:

$$f_0^{mn} = \sqrt{\left(\frac{mv_t}{2t}\right)^2 + \left(\frac{nv_L}{2l}\right)^2} \tag{2}$$

where m and n are mode orders in the vertical (z-axis) and longitudinal (x-axis) directions, respectively. The velocities $v_t$ and $v_L$ are acoustic velocities in the vertical and longitudinal directions respectively. The asymmetric (and antisymmetric modes) of interest herein have a longitudinal mode order n of 1 with a vertical mode order m that takes a value among 3, 5, 7, 9, 11, and 13. It should be worth noting that Equation (2) makes an assumption that the longitudinal boundaries are mechanically free, similar to the as the top and bottom surfaces. This assumption will be revisited later. Equation (2) further implies that a composite mode of order $f_0^{mn}$ with n taking an odd value larger than one (e.g., 1) can emerge as a spurious mode near the intended mode at $f_0^{m1}$. Such a phenomenon can be observed for other high coupling resonators with 2D nature.

For modes with n=1, l is equal to half of the longitudinal wavelength ($\lambda_L/2$). Thus, Equation (2) can be rewritten as $$f_0^{m1} = \frac{v_L}{2L}\sqrt{(\alpha m)^2 + (2t/\lambda_L)^2} \tag{3}$$

where $\alpha$ is the ratio between the velocity of vertical and longitudinal directions, e.g., as shown:

$$\alpha = \sqrt{c_{44}/c_{11}}. \tag{4}$$

For a resonator in thin-film LiNbO$_3$ with a large wavelength ($t/\lambda_L < 0.1$), resonant frequencies of each higher order modes can be approximated as $$f_0^{m1} \approx \frac{v_t}{2t}m. \tag{5}$$

A thinner LiNbO$_3$ plate (e.g., piezoelectric thin film) can yield a higher resonant frequency for a certain order. In order to achieve a resonant frequency of up to 60 GHz, a thickness of the LiNbO$_3$ plate (e.g., thin film) can be chosen to be 400 nm. However, it should be noted that a 400 nm film is depicted at least in some descriptions herein, but a variety of thicknesses of piezoelectric thin films can support the described modes. To validate a 2D analysis, COMSOL-based FEA can be used to calculate the eigenfrequency ($f_{eigen}$) variation of each odd-order A-mode in a 400 nm-thick Z-cut LiNbO$_3$ thin film.

FIG. 3 illustrates calculated dispersion curves of A3 to A13 modes according to some embodiments. In addition to resonant frequencies, each mode can be further characterized by an electromechanical coupling ($k_t^2$)

$$k_t^2 = \frac{e^2}{\varepsilon^{S}c_E} \cdot S_m^2 \cdot l_n^2 \tag{6}$$

where e is a piezoelectric efficient, $\varepsilon^S$ is a permittivity under constant strain, and $c^E$ is the stiffness under the constant electric field. $s_m^2$ is a scaling factor capturing the dependence of $k_t^2$ on the stress and electric field distributions of the mth order mode in the vertical direction. Similarly, $l_n^2$ represents the dependence of $k_t^2$ on the stress field distribution of nth order mode in the longitudinal direction, which depends on the geometry of the device. The expression of $v_m^2$, for example, as part of the Berlincourt Formula, is given as $$S_m^2 = \frac{x(z)u_x(z)dz^2}{2(z)dz \cdot u^2(z)dz}. \quad (7)$$

By using a simplified field distribution, for example, as shown in FIG. 2 for integration, $v_m^2$, can be formulated as a function of mode order m $$S_m^2 = \frac{1}{m^2} \quad (8)$$

where $l_n^2$ in Equation (7) can be dependent on the ratio between the vertical and longitudinal dimensions ($t/\lambda_L$) and typically can increase with respect to m. For the resonator in the thin-film LiNbO$_3$ slab (e.g., thin film) with a large wavelength ($t/\lambda_L < 0.1$), the electromechanical coupling of each higher order modes can be approximated as $$k_t^2 \approx \frac{e^2}{\varepsilon^s c} \cdot \frac{1}{m^2}. \quad (9)$$

To further understand an effect of overmoding on $k_t^2$ and a dispersive relationship between $l_n^2$ and $t/\lambda_L$, a simulation such as a COMSOL-based FEA can be used to calculate $k_t^2$ as a function of $\lambda_L$ in a 400 nm-thick LiNbO$_3$ plate for each odd mode. As shown in FIG. 3, the results suggest that a larger $\lambda_L$ (e.g., a smaller ratio of $t/\lambda_L$) can lead to a larger id for each mode and $k_t^2$ tends to be (e.g., approximately) constant when $\lambda_L$ is increased to be over 10 μm. To maximize id in the designed device, the wavelengths of the excited modes should be over 10 μm. Additionally, a larger wavelength can lead to a larger footprint. In each specified application, the tradeoff between $k_t^2$ and size can be considered. Based on an analysis described herein, the design of the transducer, which can generate a longitudinal (e.g., lateral) electric field, should be considered. To reduce fabrication complications, one design is to have interdigital electrodes patterned exclusively on top of a LiNbO$_3$ thin film.

Figure 4A:
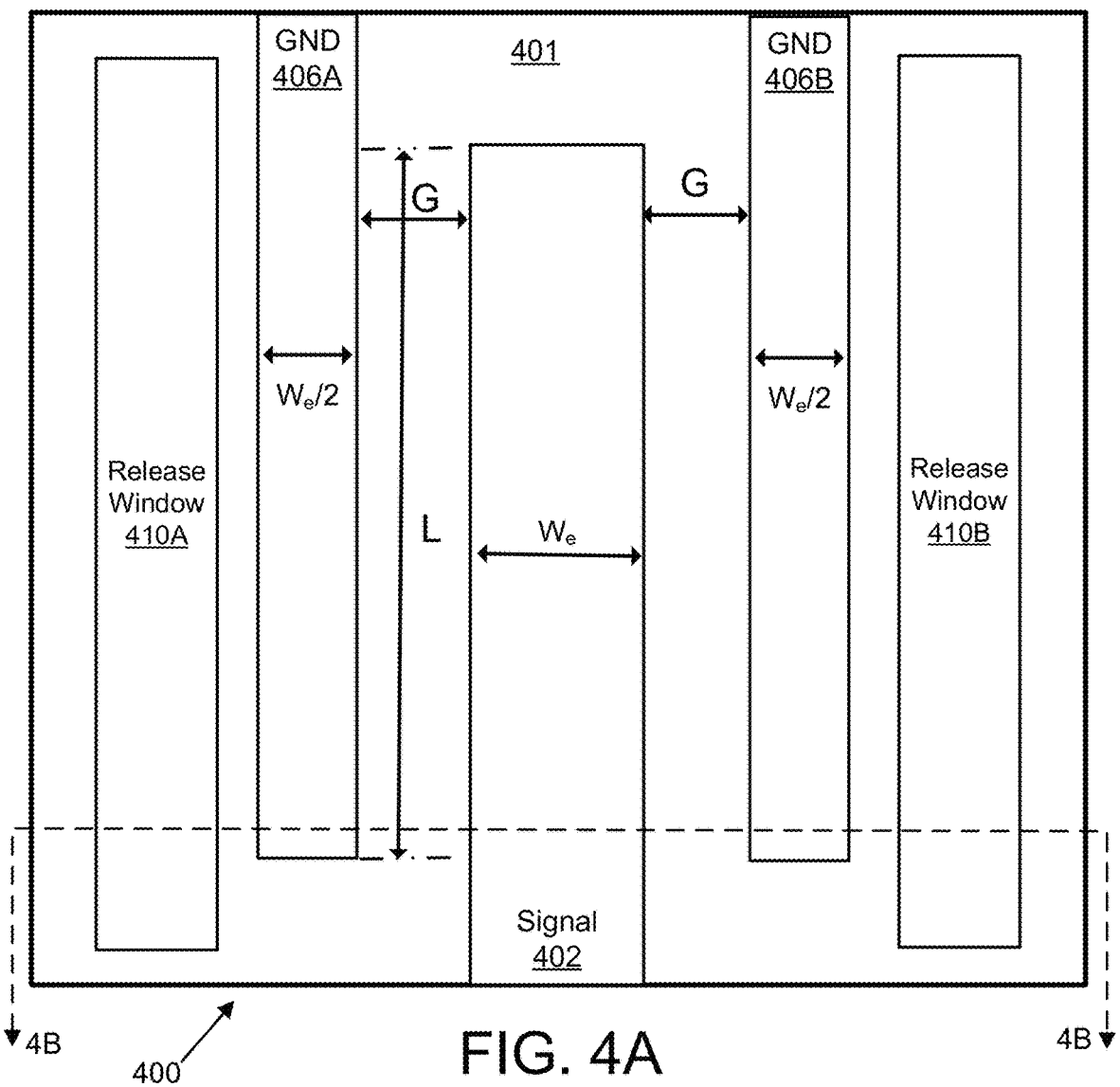
FIGS. 4A-4B are schematic diagrams of a top and cross-sectional view, respectively, of an asymmetric mode resonator according to various embodiments.
Figure 4B:
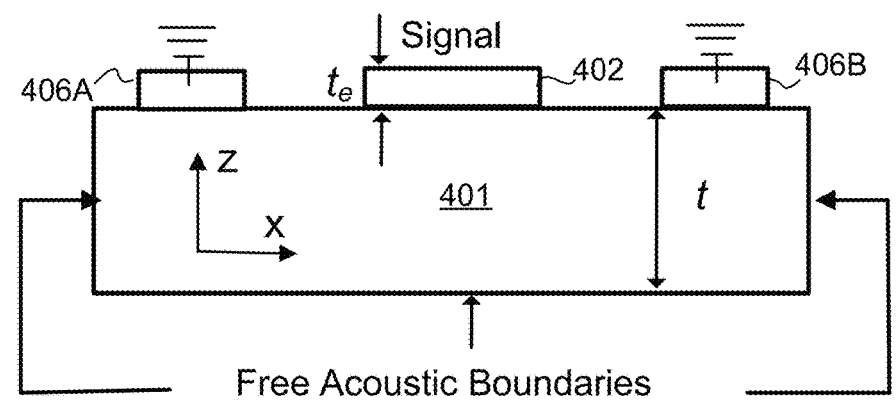

FIGS. 4A-4B are schematic diagrams of a top and cross-sectional view, respectively, of an asymmetric mode resonator 400 (or acoustic resonator) according to various embodiments. As seen in FIGS. 4A-4B, the design of the resonator 400 in this work has three interdigital electrodes (IDTs) connected to signal and ground, respectively, to induce longitudinally alternating electric fields in the mechanically-suspended piezoelectric thin film.

More specifically, a piezoelectric thin film 401 can be suspended above a carrier substrate (not shown). The piezoelectric thin film 401 can include Z-cut LiNbO$_3$ or LiTaO$_3$ adapted to propagate an acoustic wave in a Lamb wave mode excited by a component of an electric field that is oriented in a longitudinal direction (x-direction) along a length of the piezoelectric thin film. In some embodiments, the carrier substrate can also be LiNbO$_3$ or LiTaO$_3$ (or some form of silicon or silicon dioxide). In other embodiments, the piezoelectric thin film 401 is a Y cut or an X cut of these materials.

In various embodiments, a signal electrode 402 is disposed on, and in physical contact with, the piezoelectric thin film 401 and oriented perpendicular to the longitudinal direction. A first ground electrode 406A can be disposed on, and in physical contact with, the piezoelectric thin film 401 and oriented perpendicular to the longitudinal direction. The first ground electrode 406A can be separated from the signal electrode 402 by a gap (G) defined by a longitudinal distance and in which the acoustic wave resonates. A second ground electrode 406B can be disposed on, and in physical contact with, the piezoelectric thin film 401 and oriented perpendicular to the longitudinal direction. The second ground electrode 406 B can also be separated from the signal electrode by a second gap (G) defined by the longitudinal distance, and where the acoustic wave also resonates within the second gap. The signal electrode 402 can be of a width ($W_e$) and each of the first and second ground electrodes 406A and 406B can each be of a width that is half of the width of the signal electrode 402, e.g., $W_e/2$.

Further, a first release window 410A can be formed within the piezoelectric thin film 401 adjacent to the first ground electrode 406A, e.g., on a side of the first ground electrode opposite that of the signal electrode 402. A second release window 410B can be formed within the piezoelectric thin film 401 adjacent to the second ground electrode 406B, e.g., on a side of the second ground electrode opposite that of the signal electrode 402. A cavity (414 in FIG. 10) formed between the carrier substrate and the piezoelectric thin film 401, where a length (L) of the gap (G) between the signal electrode 402 and each ground electrode is a length of the cavity.

Figure 5:
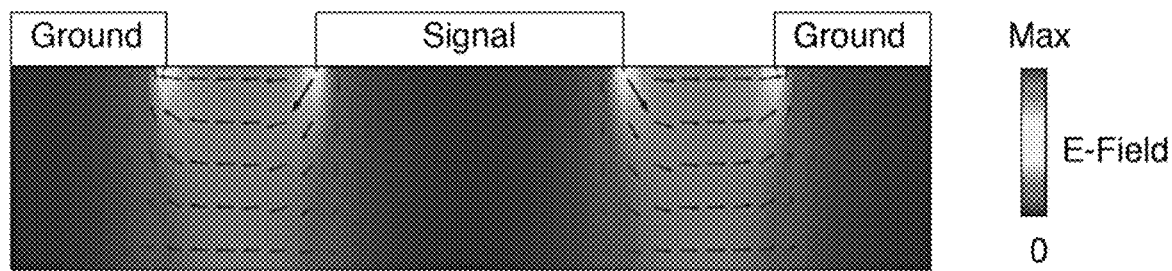
FIG. 5 is an FEA-simulated image representing an electric field distribution with electric field lines within a piezoelectric thin film according to an embodiment.

FIG. 5 is an FEA-simulated image representing an electric field distribution with electric field lines within a piezoelectric thin film according to an embodiment. An electric field can be excited by top-only interdigital electrodes (IDTs) within the piezoelectric thin film can be non-uniform, and can have components that can couple to the unwanted spurious modes near the A-modes. As seen in FIG. 5, the FEA-simulated distribution of electric field excited by top-only IDTs illustrate that the electric field can be decomposed into longitudinal and vertical components. To qualitatively understand the effect of the vertical components, an idealized vertical E-field can be applied in a 400 nm-thick Z-cut LiNbO$_3$ plate.

Figure 6:
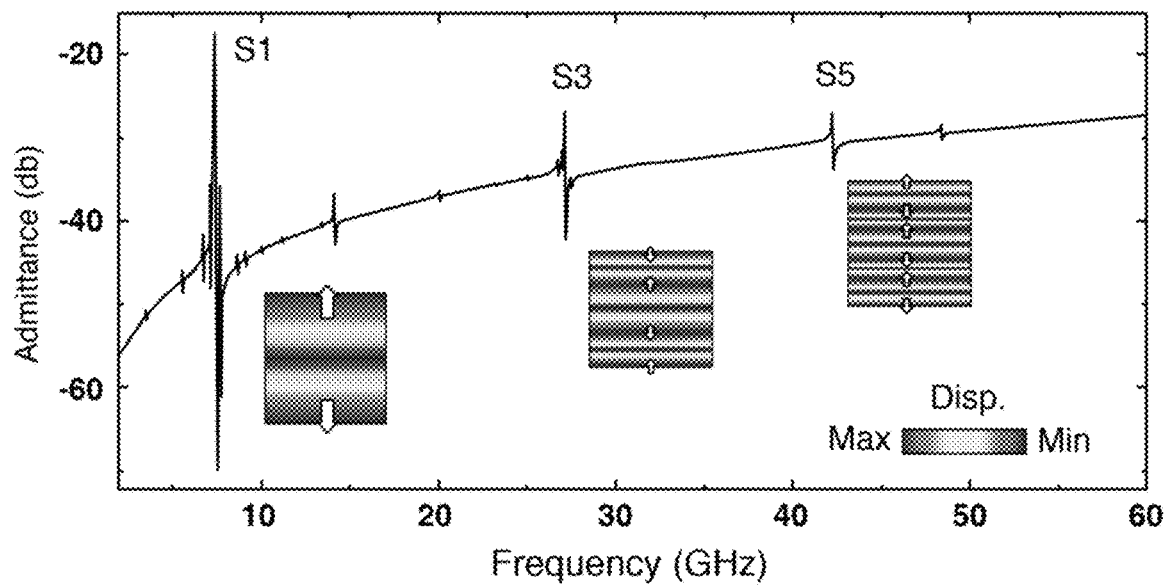
FIG. 6 is a graph of different orders of symmetric Lamb wave modes, and corresponding FEA-simulated images (inset) excited by a vertical electric field in a piezoelectric thin film according to some embodiments.

FIG. 6 is a graph of different orders of symmetric Lamb wave modes, and corresponding FEA-simulated images (inset) excited by a vertical electric field in a piezoelectric thin film according to some embodiments. In one embodiment, the piezoelectric thin film is a 400 nm-thick Z-cut LiNbO$_3$ thin film. As illustrated in FIG. 6, symmetric Lamb wave modes can be excited by an E-field with at least a vertical component in a Z-cut LiNbO$_3$ thin film in our targeted frequency range. The displacement mode shapes of these S-modes are shown in the inset of FIG. 6. To mitigate spurious modes, the E-field distribution can be optimized in A1 mode resonators by using an optimal electrode gap (G), as will be discussed in more detail.

In addition to some non-uniformity of the electric field (e.g., E-field), leakages of acoustic waves can be an origin of the spurious modes. For example, in A1 mode devices, spurious modes can originate from insufficient confinement between electrodes in the longitudinal direction. For higher order A-modes, the acoustic energy confinement between the interdigital electrodes can be studied to encourage the spurious-free responses.

Further, in addition to the spurious modes, the acoustic energy confinement can also affect quality factor of the devices. The energy confinement can be more critical at higher frequencies due to acoustic losses, including damping loss of metal, which can often increase with the square of frequency. To minimize damping loss, the vibration of A-modes can be restricted in the cavity of LiNbO$_3$ between the interdigital electrodes. Therefore, the energy confinement of the higher order modes between interdigital electrodes needs to be studied to ensure a high-Q and spurious-free response Similar to the EM waves, the confinement of acoustic waves fundamentally depends on the mismatching of the acoustic impedances between two media.

Figure 7:
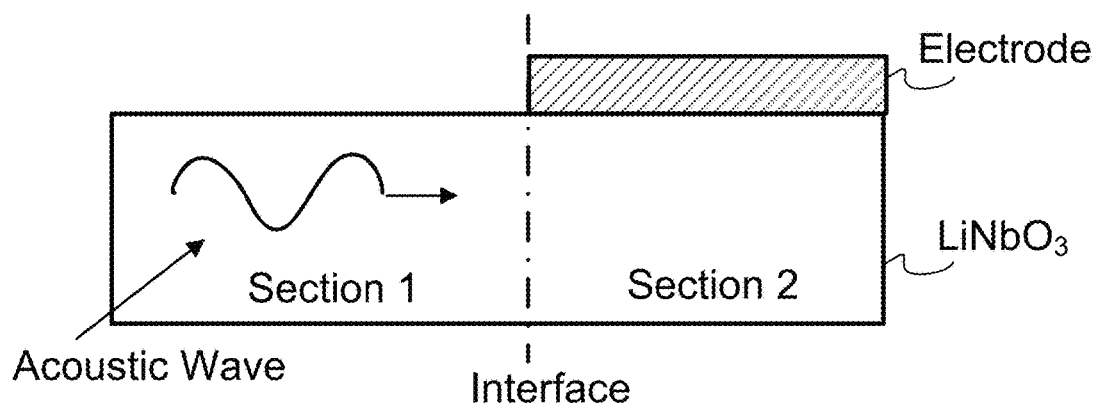
FIG. 7 is a simplified image of a two-dimensional model of an acoustic wave propagating in a piezoelectric plate with and without top electrodes according to an embodiment.
Figure 8A:
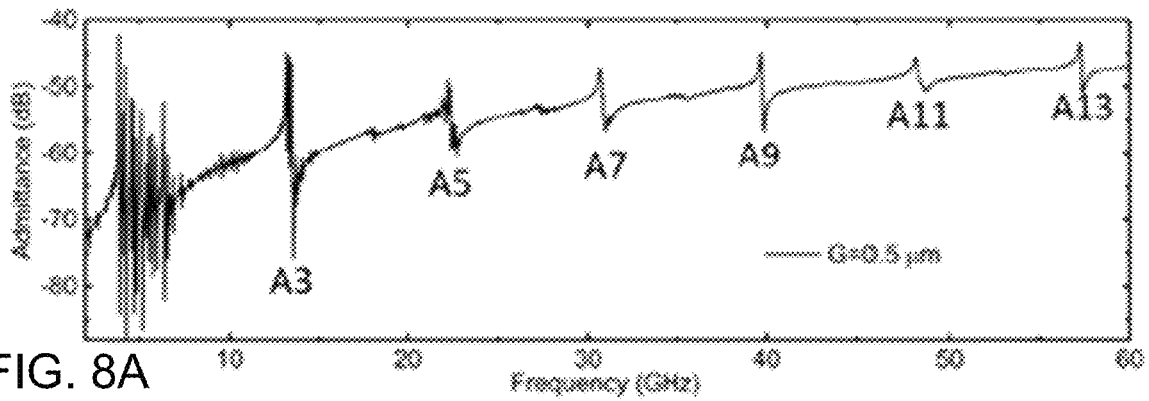
FIGS. 8A-8D are graphs that illustrate FEA-simulated results of resonators with inter-electrode gaps (G) of 0.5 microns (μm), 1 μm, 2 μm, and 4 μm, respectively, according to some embodiments.
Figure 8B:
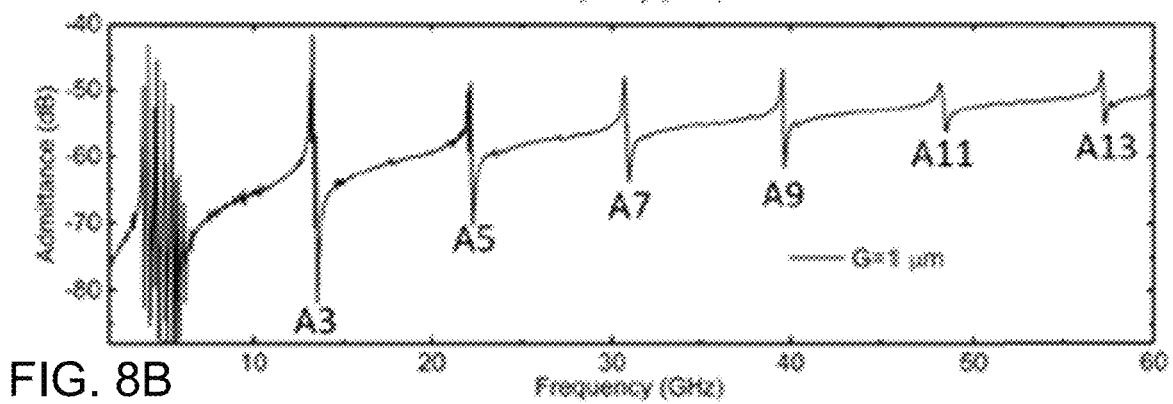
Figure 8C:
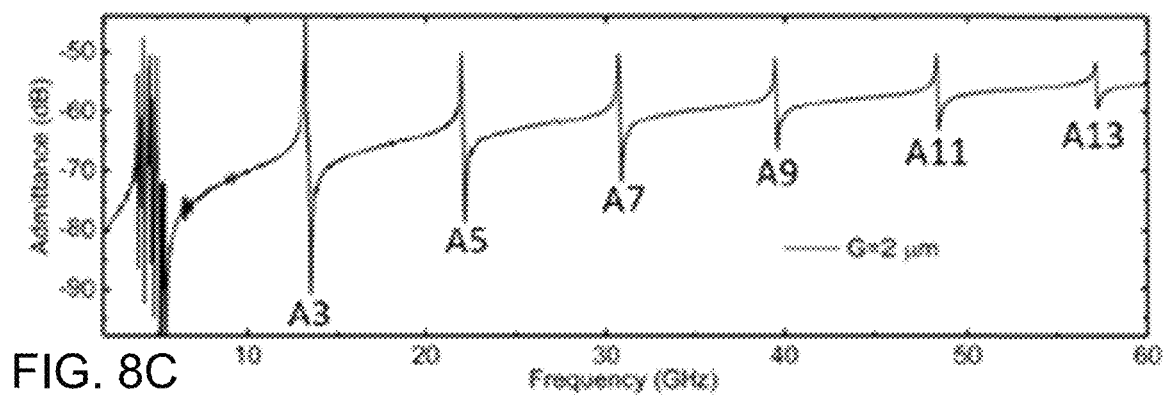
Figure 8D:
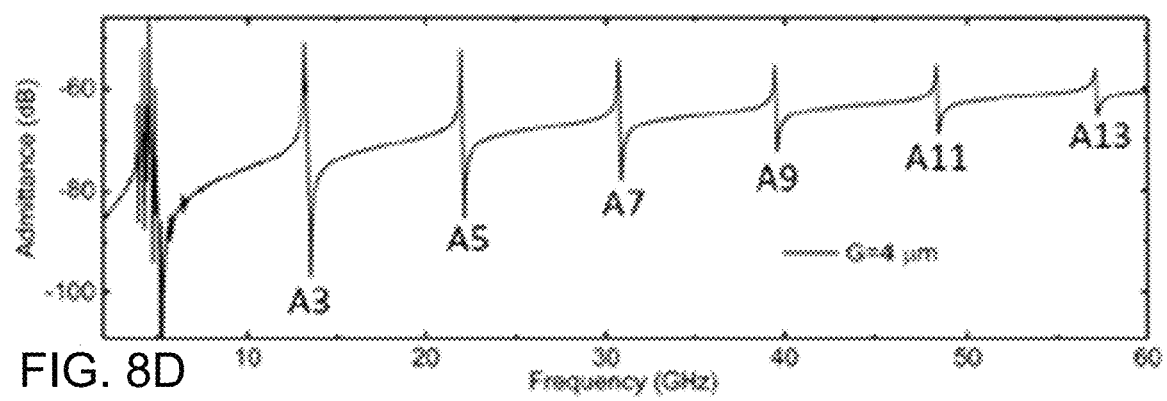
Figures 9A, 9B, 9C, 9D, 9E, 9F:
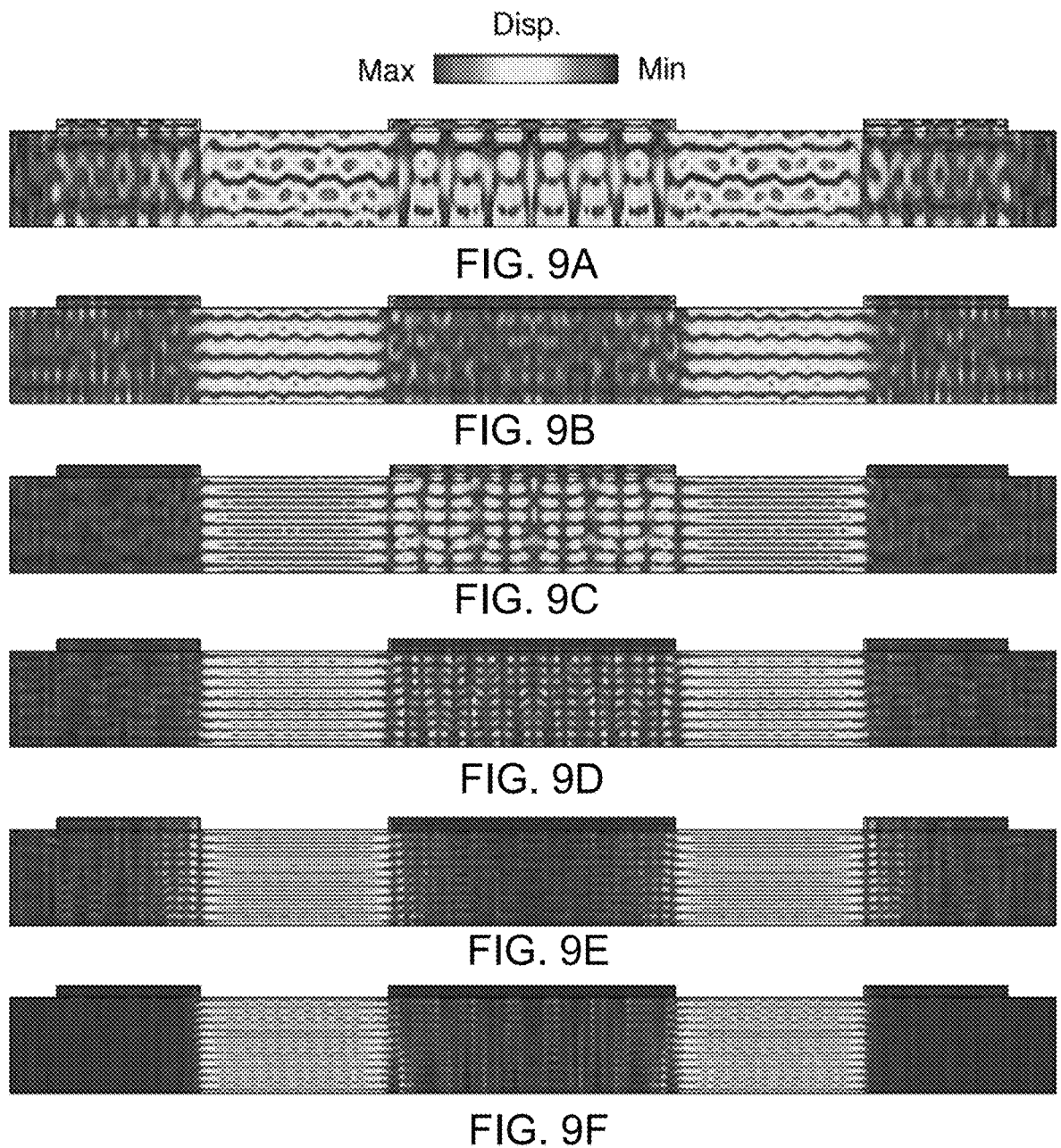
FIGS. 9A-9F are FEA-simulated displacement mode shapes of A3, A5, A7, A9, A11, and A13 modes, respectively, in a piezoelectric thin film according to some embodiments.

FIG. 7 is a simplified image of a two-dimensional (2D) model of an acoustic wave propagating in a piezoelectric plate with and without top electrodes according to an embodiment. As illustrated in FIG. 7, energy confinement can be characterized and compared between the acoustic impedance in the sections without and with electrodes. Since gold (Au) is one of the densest metals with good conductivity, the electrodes made by 50 nm-thick Au can generate significant mismatching of acoustic impedance, which can lead to improved energy confinement. The dispersion curves of the various A-modes in a 400 nm LiNbO$_3$ plate with 50 nm Au are plotted in FIG. 3 to compare with the dispersion curves without Au. The contrast between the eigenfrequencies of each A-mode validates the energy confinement between adjacent electrodes and shows better isolation in higher-order modes.

In addition to some acoustic impedance mismatching, the propagation direction of the higher-order modes can also contribute to better energy confinement and fewer spurious modes. Due to the 2D nature, the wave vectors ($\vec{k}$) of the A-modes can be decomposed into longitudinal ($\hat{x}$) and vertical ($\hat{z}$) components $$\vec{k} = k_l \cdot \hat{x} + k_m \cdot \hat{z} \tag{10}$$

$$k_l = \frac{2\pi}{\lambda_L} \tag{11}$$

$$\lambda_t = \frac{2\pi}{m} \tag{12}$$

$$k_m = \frac{2\pi}{\lambda_L} = \frac{\pi m}{t} \tag{13}$$

where $k_l$ is the longitudinal wavenumber, $k_m$ is the vertical wavenumber, and $\lambda_t$ is the vertical wavelength. In LiNbO$_3$ thin film, $k_m$ can be much larger than $k_l$, and the ratio ($k_m/k_l$) can be higher for the higher-order modes. In other words, higher-order modes propagate less acoustic energy into the longitudinal direction. Asymmetric A-modes can have free boundaries in the top and bottom surfaces of the LiNbO$_3$ thin film, which can give near 100% energy reflection. The decreased longitudinal energy propagation in the higher order modes can be another reason for the better energy confinement. In addition, a near-zero incidence angle at the top and bottom surfaces could help to suppress the mode conversion to mitigate spurious modes. These features, different from other acoustic technologies, could lead to good performance in the higher frequencies (higher order modes).

FIGS. 8A-8D are graphs that illustrate FEA-simulated results of resonators with inter-electrode gaps (G) of 0.5 microns (μm), 1 μm, 2 μm, and 4 μm, respectively, according to some embodiments. To validate resonant characteristics and spurious modes in the effects of electrodes, a resonator with the structure shown in FIGS. 4A-4B can be simulated for different electrode separations. As shown in FIGS. 8A-8D, the resonant frequency of each order is consistent with the analyses with respect to FIG. 3, and most of the significant spurious modes can be mitigated by increasing the gap between interdigital electrodes from 0.5 to 4 μm (and beyond) due to the optimization of the electric field as described herein.

TABLE 3

PHYSICAL DIMENSIONS OF THE DESIGNED A-MODE RESONATOR

| Parameter | Description | Value |
| --- | --- | --- |
| $W_e$ | Electrode width | 6 μm |
| G | Electrode separation | 4 μm |
| L | Cavity length | 80 μm |
| t | Thickness of LiNbO$_3$ | 400 nm |
| $t_e$ | Thickness of electrode | 50 nm |

FIGS. 9A-9F are FEA-simulated displacement mode shapes of A3, A5, A7, A9, A11, and A13 modes, respectively, in a piezoelectric thin film according to some embodiments. The dimensions of the simulated device are listed in Table 3. Consistent with a theoretical analysis of energy confinement, the FEA results show that the higher-order asymmetric (or antisymmetric) modes have spurious-free responses and less acoustic energy leakage to the LiNbO$_3$ sections covered by metal. Based on the above analyses, the thickness of the LiNbO$_3$ thin film used as an illustrative example herein can be 400 nm, and the $\lambda_L$ can be 8 μm such that the A3 to A13 modes can be scaled in a frequency range from 10-60 GHz.

Figure 10:
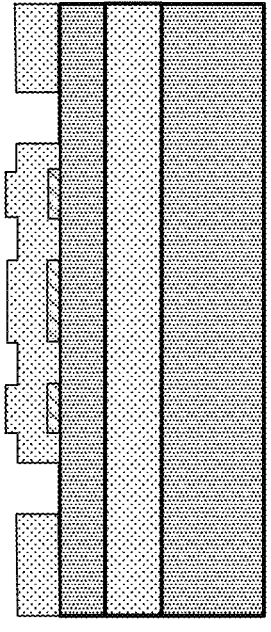
FIG. 10 is a set of cross-sectional images of a resonator illustrating a process for fabrication of the resonator according to an embodiment.
Figure 10:
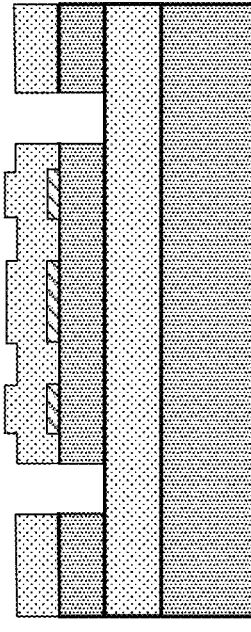
Figure 10:
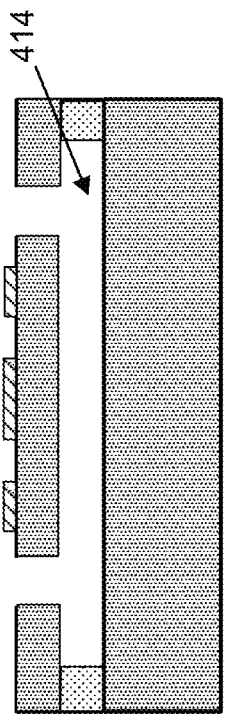
Figure 10:
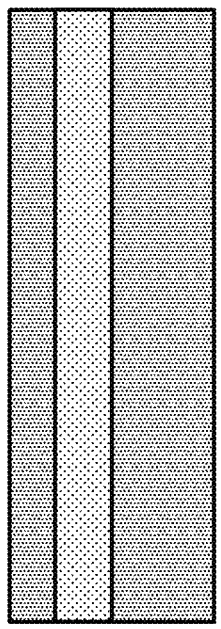
Figure 10:
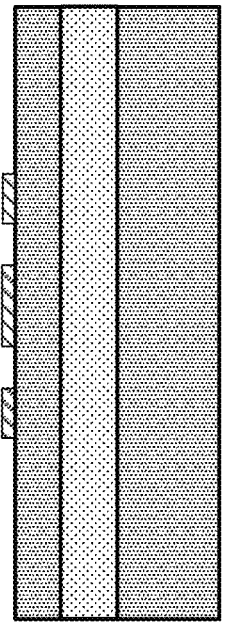
Figure 10:
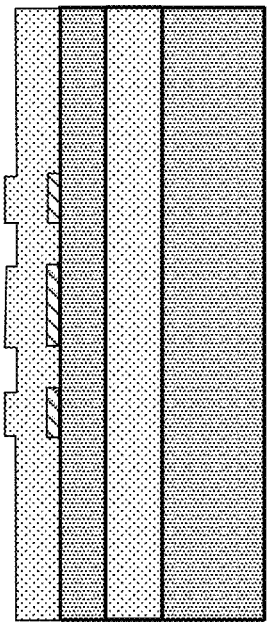

FIG. 10 is a set of cross-sectional images of a resonator illustrating a process 1000 for fabrication of the resonator according to an embodiment. To validate the analytical and modeling results, a Z-cut LiNbO$_3$ A-mode resonator can be fabricated on a 400 nm-thick Z-cut LiNbO$_3$ thin film, although other cuts and/or LiTaO$_3$ can also be employed for the piezoelectric thin film as discussed herein throughout.

With reference to FIG. 10, at operation 1010, the fabrication process 1000 includes transferring (e.g., a 400-nm-thick Z-cut LiNbO$_3$) piezoelectric thin film onto a (e.g., 500 μm-thick) LiNbO$_3$ (or LiTaO$_3$) carrier substrate with a thin layer of SiO$_2$ (2 μm) as the intermediate layer. At operation 1020, top electrodes made for 60 nm Au can then be deposited on the surface of the Z-cut LiNbO$_3$ thin film. At operation 1030, to form the release windows shown in FIGS. 4A-4B, a layer of plasma-enhanced chemical vapor deposition (PECVD) SiO$_2$ is first deposited on top of the piezoelectric thin film and aluminum electrodes. At operation 1040, the PECVD SiO$_2$ layer is etched to pattern the PECVD SiO$_2$ that then serves as a hard mask for etching the LiNbO$_3$ thin film. At operation 1050, the PECVD SiO$_2$ and LiNbO$_3$ thin films are etched to form the release windows in a reactive-ion etching (RIE) system with inductively-coupled plasma (ICP). At operation 1060, to form the free acoustic boundaries of a cavity 414, the SiO$_2$ under and on top of the LiNbO$_3$ thin film is removed through 10:1 buffered-hydrofluoric acid (HF)-based wet etching. As a final operation (not illustrated), after the wet etching, a critical point drying (CPD) can performed to dehydrate the resonator device.

Figure 11:
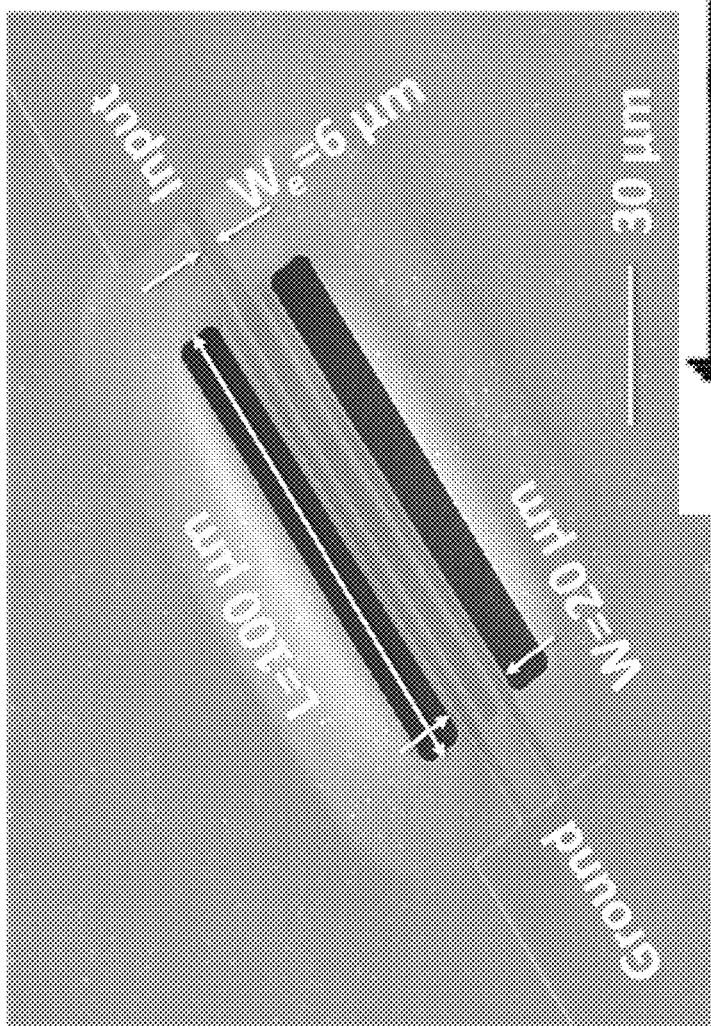
FIG. 11 is an optical microscope image of a fabricated A mode resonator according to an embodiment.

FIG. 11 is an optical microscope image of a fabricated A mode resonator similar to the LiNbO$_3$ resonator of FIG. 10 according to an embodiment. The resonator has a footprint of $2\times10^{-3}$ mm$^2$ and can meet stringent size requirement of front ends. Dimensions illustrated in FIG. 11 are illustrative only and not meant to be limiting.

Figure 12:
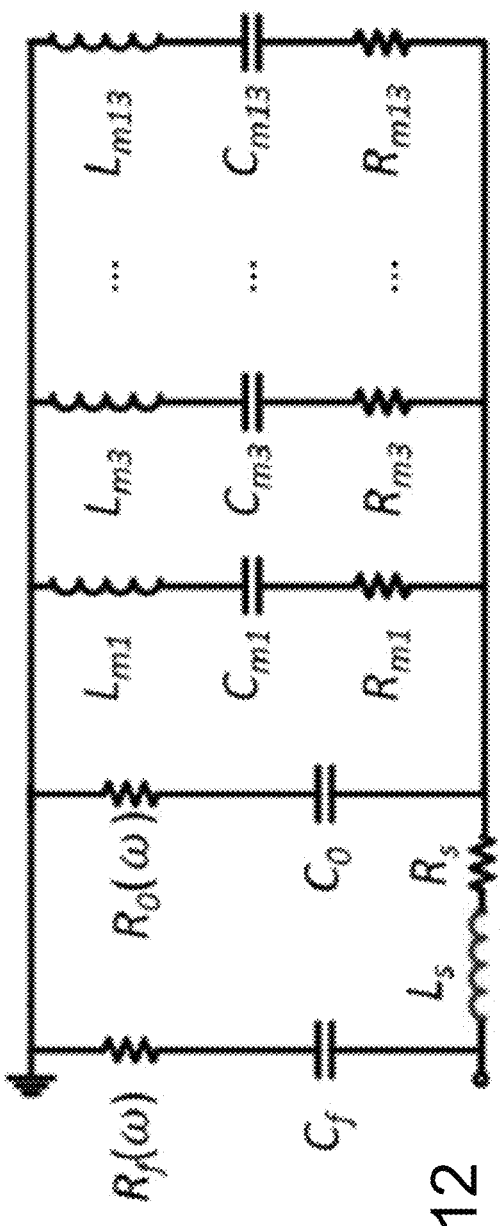
FIG. 12 is a circuit diagram of a multi-resonance equivalent modified Butterworth-Van Dyke (MBVD) circuit model according to an embodiment.
Figure 13A:
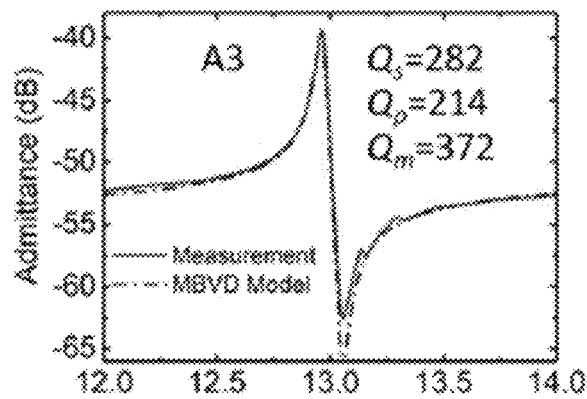
FIGS. 13A-13F are graphs illustrating measured and MVBD modeled response of the A3, A5, A7, A9, A11, and A13 modes according to various embodiments.
Figure 13B:
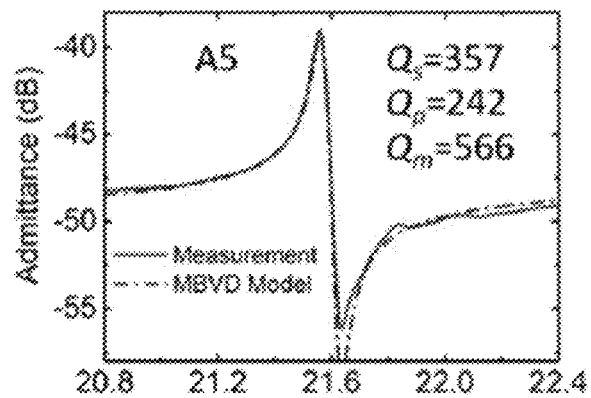
Figure 13C:
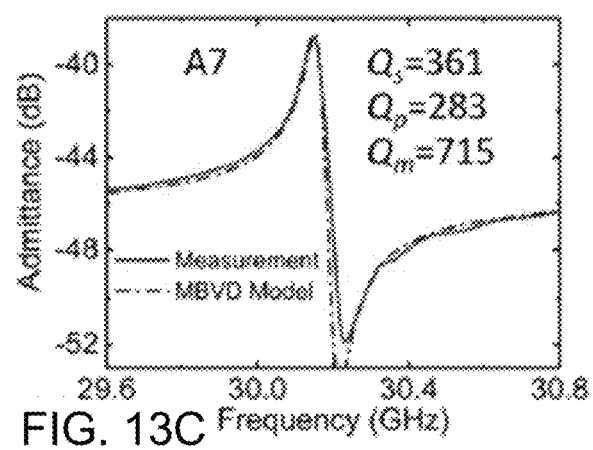
Figure 13D:
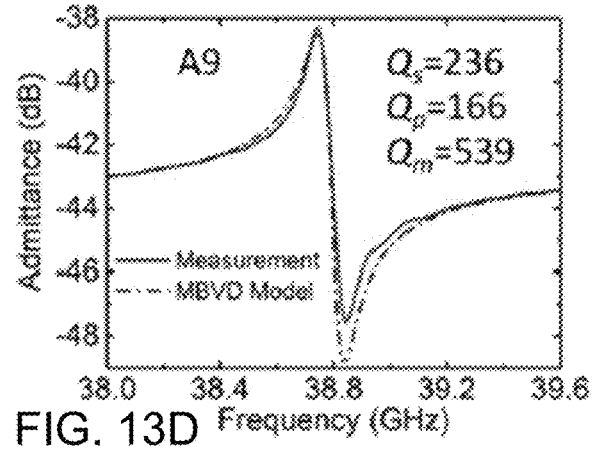
Figure 13E:
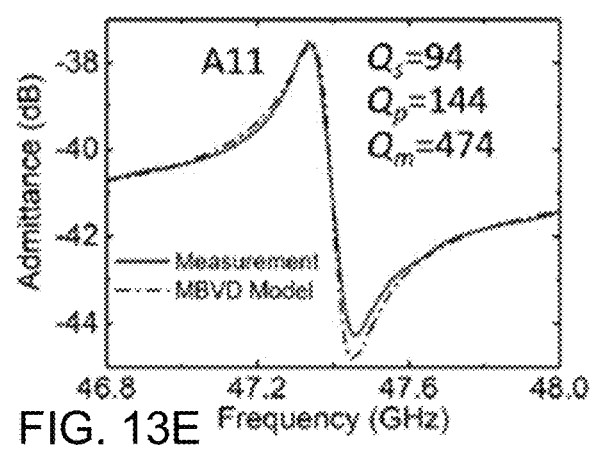
Figure 13F:
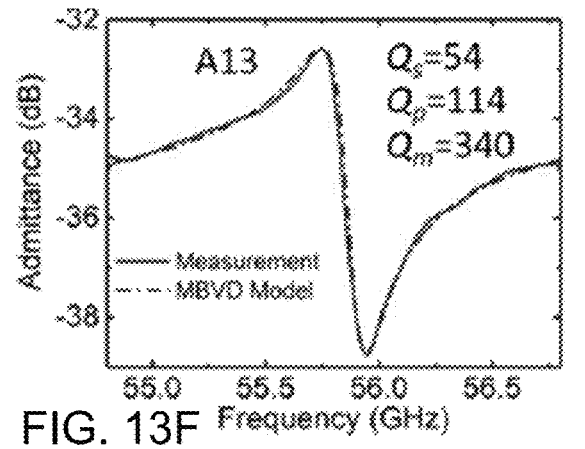

FIG. 12 is a circuit diagram of a multi-resonance equivalent modified Butterworth-Van Dyke (MBVD) circuit model according to an embodiment. A resonator can be characterized over a wide frequency range, for example, with a Keysight N5247B PNA-X microwave network analyzer in dry air and at room temperature.

FIGS. 13A-13F are graphs illustrating measured and MVBD modeled response of the A3, A5, A7, A9, A11, and A13 modes according to various embodiments. Consistent with the simulated responses in FIGS. 8A-8D, the measured responses in FIGS. 13A-13F can exhibit resonant frequencies at 13, 21.6, 30.2, 38.8, 47.2, and 55.7 GHz, corresponding to the anticipated A3, A5, A7, A9, A11, and A13 modes, respectively. In some embodiments, even-order asymmetric Lamb wave modes are not excited in the device.

A multi-resonance MBVD model, in which each resonance is captured by a motional branch of $R_m$, $L_m$, and $C_m$, can be used to interpret measurement results. As illustrated in FIG. 12, an additional series inductor ($L_s$) can be added to account for an inductance of the electrodes at high frequencies. An additional resistor ($R_s$) can be added to account for surface resistance of electrodes and leading lines, the value of which can depend on frequency due to skin effects. To account for some parasitic effects, $C_f$ and $R_f$ can be included as a feedthrough capacitance and dielectric loss in the LiNbO$_3$ substrate, respectively. $R_0$ can be added to account for the dielectricloss in the suspended LiNbO$_3$ thin film. The value of $R_f$ and $R_0$ is based on the loss tangent (tan δ) of the LiNbO$_3$ $$R_f = \frac{\tan\delta}{\omega C_f} \quad (14)$$

$$R_0 = \frac{\tan\delta}{\omega C_0} \quad (15)$$

An on-chip test structure including bus lines can be included in fabrication to measure the value of $C_f$. The parameters and measured key values are listed in Table 4.

The loaded quality factor can be affected by electric and mechanical losses in LiNbO$_3$ and Au thin films. Electric losses can be heavily influenced by the electrode thickness. For piezoelectric-type resonators, those electrode layers scale with frequency (1/f) due to the mass loading effect, which can lead to high resistive losses. Therefore, it is helpful to use highly conductive materials with large thickness to keep resistive losses low. However, highly conductive metals, such as Au, often have low acoustic impedances, which directly degrade the quality factors. More investigations can be carried out to achieve the optimized thickness of the electrodes (Au) to balance the electric and mechanical losses in electrodes. Consistent with the previous analysis of the energy confinements, the extracted mechanical Q ($Q_m$) of different orders decreases at a rate slower than frequency, which suggests that better energy confinements have been achieved for the higher order modes.

Figure 14B:
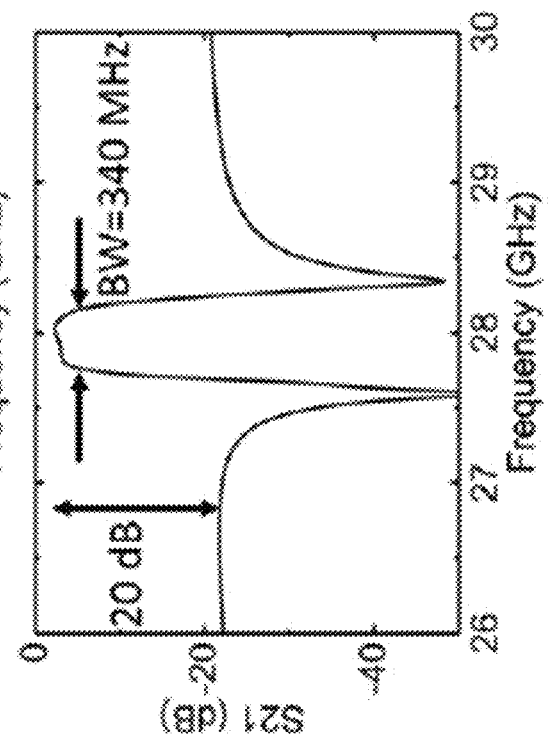
FIG. 14B is a graph of a measured response of the fabricated A-mode filter according to an embodiment.
Figure 14D:
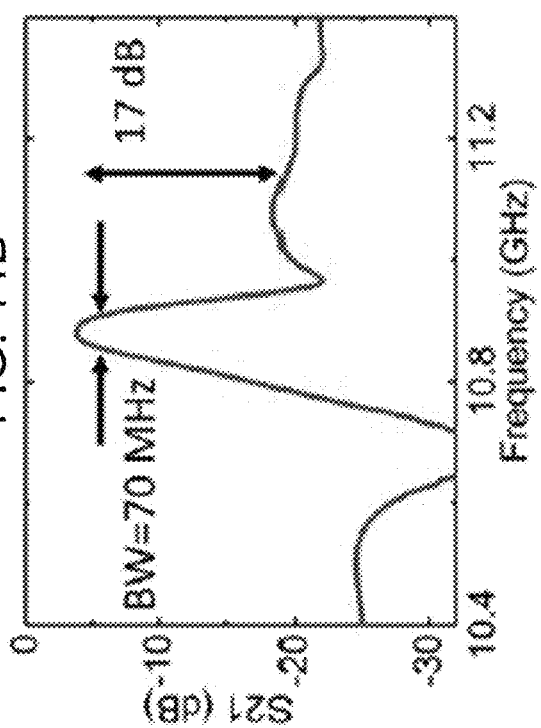
FIG. 14D is a graph of a simulated response of the hybrid filter of FIG. 14C in Band n261 according to an embodiment.
Figure 14A:
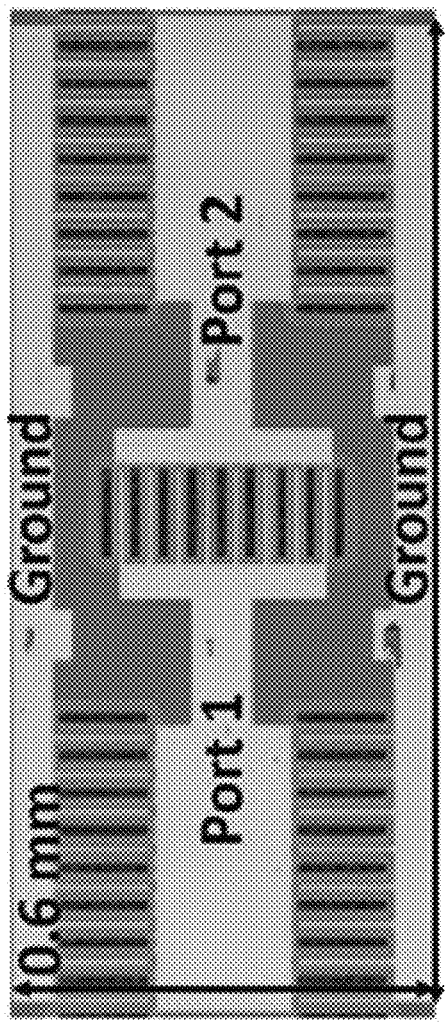
FIG. 14A is an optical microscope image of a fabricated A3 mode $LiNbO_3$ filter according an embodiment.

FIG. 14A is an optical microscope image of a fabricated A3 mode LiNbO$_3$ filter according an embodiment. Some dielectric loss in LiNbO$_3$ can be a source of the loss affecting the admittance at anti-resonance. The value of the loss tangent (tan δ) can be referred to the previous measurements of the dielectric properties of the single-crystal lithium niobate. However, the value of tan δ may not be constant across an entire measured frequency range, which can make fittings near the anti-resonance less accurate for some modes. More investigations of the dielectric properties of the LiNbO$_3$ thin films may be carried out to understand the dielectric loss of A-modes devices at millimeter wave frequencies, for example.

FIG. 14B is a graph of a measured response of the fabricated A-mode filter according to an embodiment. A-mode resonators can be applied to filtering as shown in FIGS. 14A-14D. In order to scale an A-mode filter toward 5G high-band, the fabricated A3 mode filter based on a 500-nm-thick LiNbO$_3$ thin film shows a footprint of 0.6 mm$^2$, a BW of 70 MHz, and a center frequency of 10.9 GHz. The measured result further validates the previous analyses that the A-mode resonances can be tuned by adjusting t and $\lambda_L$. However, due to the diminishing effect of overmoding on $k_t^2$, the acoustic-only A-mode filters in 5G high-band may only be used in narrow-band applications.

Figure 14C:
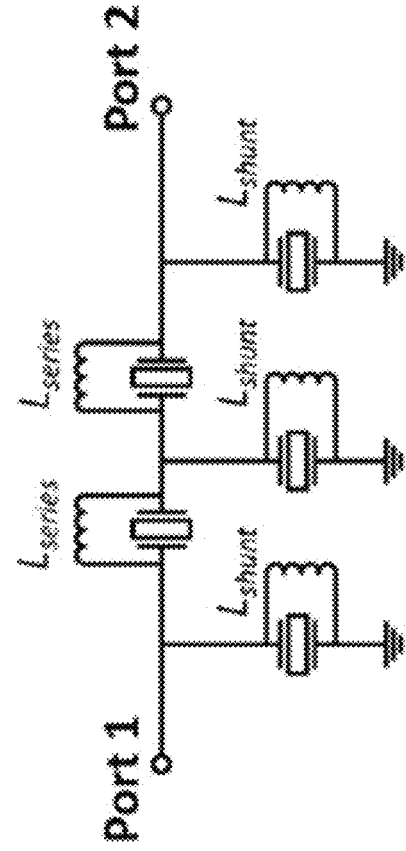
FIG. 14C is a circuit diagram of a hybrid filter topology structure according to an embodiment.

To overcome diminishing $k_t^2$ at higher-order modes, a hybrid method used at lower frequencies can be adopted for 5G high-band. FIG. 14C is a circuit diagram of a hybrid filter topology structure according to an embodiment. As depicted in FIG. 14C, each resonator array can be combined with a

TABLE 4

KEY MEASURED VALUES AND EXTRACTED PARAMETERS OF THE MULTIRESONANCE MBVD MODEL

| Mode | A3 | A5 | A7 | A9 | A11 | A13 |
|---|---|---|---|---|---|---|
| $f_0$ (GHz) | 13 | 21.6 | 30.2 | 38.8 | 47.4 | 55 |
| $R_m$ (Ω) | 105 | 135 | 140 | 210 | 410 | 436 |
| $C_m$ (fF) | 0.315 | 0.0964 | 0.0526 | 0.0363 | 0.0173 | 0.019 |
| $L_m$ (nH) | 478.2 | 564.2 | 528.77 | 464.9 | 653 | 428.3 |
| $L_s$ (pH) | 400 | 400 | 400 | 400 | 400 | 400 |
| $R_s$ (Ω) | 12 | 12 | 13 | 13 | 14 | 14 |
| $C_f$ | | | 10 fF | | | |
| $C_0$ | | | 9.3 fF | | | |
| tanδ | | | 0.007 | | | |
| $k_t^2$ | 3.8% | 1.2% | 0.74% | 0.45% | 0.31% | 0.22% |
| $Q_s$ | 282 | 357 | 361 | 236 | 94 | 54 |
| $Q_p$ | 214 | 242 | 283 | 166 | 144 | 114 |
| $Q_m$ | 372 | 566 | 715 | 539 | 474 | 340 | shunt inductor to compensate for the lack of adequate $k_t^2$. To show the feasibility of this approach, an example design for 5G NR n261 is simulated. In this example, the thickness of LiNbO$_3$ thin film can be thinned down to 300 nm to attain A5 at 28 GHz with $k_t^2$ of 1.2%. The A5 resonance can be assumed to have $Q_s$ of 700 with future optimization. The shunt inductors are 0.45 nH and assumed to have Q of 15 at 30 GHz. FIG. 14D is a graph of a simulated response of the hybrid filter of FIG. 14C in Band n261 according to an embodiment. As shown in FIG. 14D the hybrid A5 mode filter can support BW up to 340 MHz in 5G NR n261.

Figure 15:
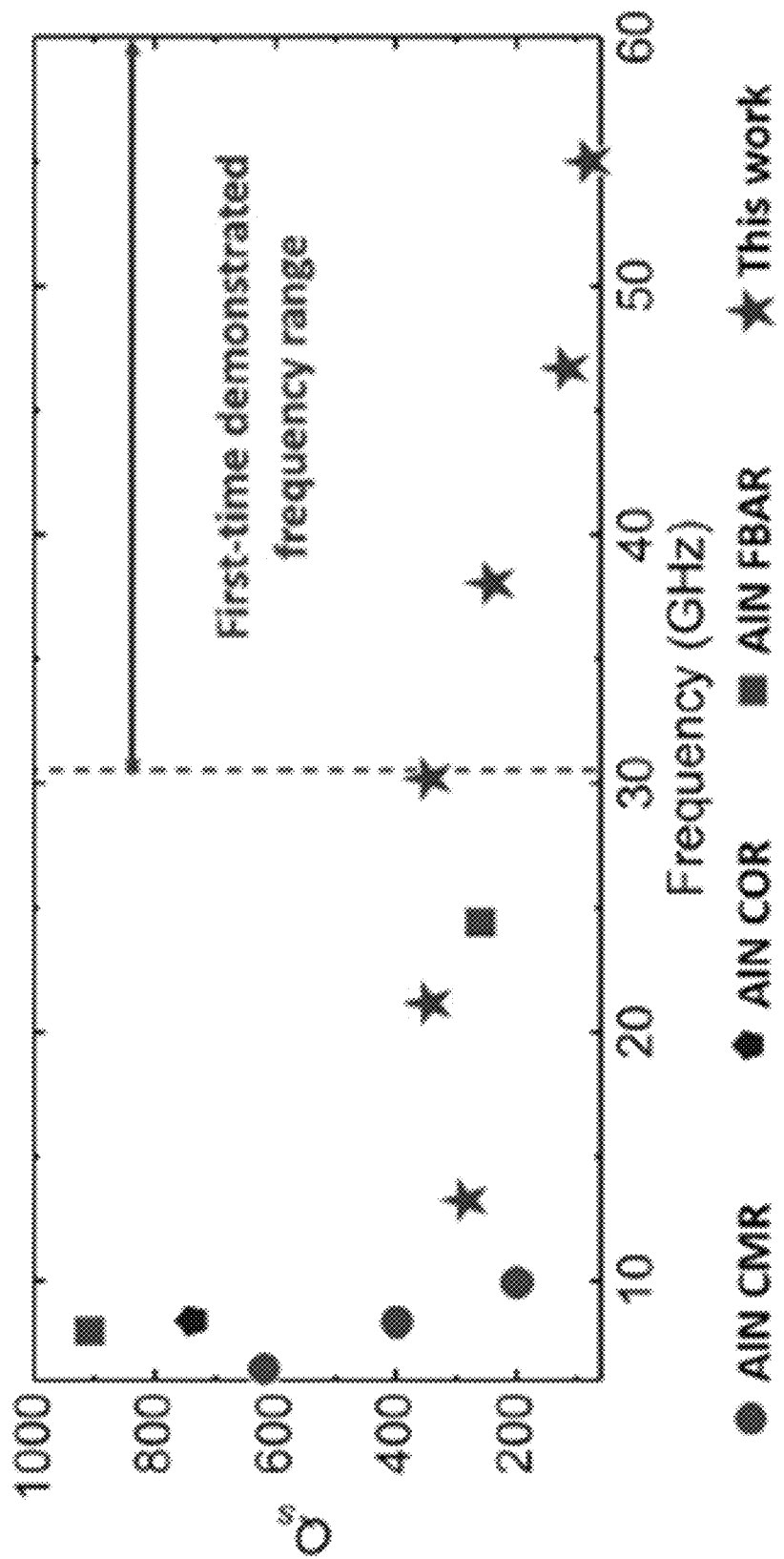
FIG. 15 is a graph illustrating comparisons of the state-of-the-art piezoelectric electromechanical resonators above 6 gigahertz (GHz) according to an embodiment.

FIG. 15 is a graph illustrating comparisons of the state-of-the-art piezoelectric electromechanical resonators above 6 GHz according to an embodiment. In addition to the applications in filtering, MEMS resonators operating at frequencies of greater than 6 GHz are also one of the vital building blocks for 5G frequency synthesizers. Based on A-Mode resonators, an RF-MEMS oscillator has been primarily demonstrated with the highest reported oscillation frequency and outstanding performance. Further investigations are ongoing to understand and demonstrate the potential of the A-mode resonators for front-end applications in filtering and frequency synthesis.

Antisymmetric Lamb wave modes in LiNbO$_3$ thin film have been demonstrated in a wide range of operating frequencies. As a comparison, the loaded Q of the state-of-the-art piezoelectric electro-mechanical resonators operating over 6 GHz is summarized in FIG. 15. A resonant frequency of 55 GHz and an extracted mechanical Q of 340 in a fabricated device are a demonstration of the piezoelectric MEMS devices at such high frequencies. Further development and optimization of LiNbO$_3$ antisymmetric Lamb wave mode resonators could lead to miniature front-end technologies in the higher frequencies with better performance for the future wireless communication systems.

With additional reference to FIG. 1, illustrated is the displacement mode shape of a first-order antisymmetric (A1) mode, although an asymmetric A1 mode would look similar and is applicable to the present discussion. Further illustrated in FIG. 1 is a displacement mode shape of a third-order antisymmetric (A3) mode, although an asymmetric A3 would look similar and is applicable to the present discussion. Asymmetric Lamb wave modes are a class of Lamb-wave modes that can be characterized by their particular anti-symmetry about a median plane. A cross-section of a resonator can be treated as a two-dimensional (2D) cavity. Longitudinal and thickness dimensions of the cavity can set the resonance. A resonant frequency of an odd-order mode (e.g., such as the A1 or the A3 modes) can be determined by:

$$f_0^m = \frac{v_L}{2t}\sqrt{(\alpha m)^2 + \left(2\frac{t}{\lambda_L}\right)^2} \quad (16)$$

where m is the mode order (e.g., 1 for the A1 mode, 3 for the A3 mode, or the like), $V_L$ is an acoustic velocity in the longitudinal direction (e.g., +X axis), t is a thickness of the cavity, a is a ratio between velocities along the thickness and longitudinal directions, and $\lambda_L$ is a longitudinal wavelength. Based on Equation (16), a resonance of an A-mode (e.g., an antisymmetric mode) device can be set by the thickness and the mode order in the thickness direction. For a 500 nm thick Z-cut LiNbO$_3$ thin film and a mode order of 3, the A3 mode can be scaled beyond 10 GHz.

Figure 16:
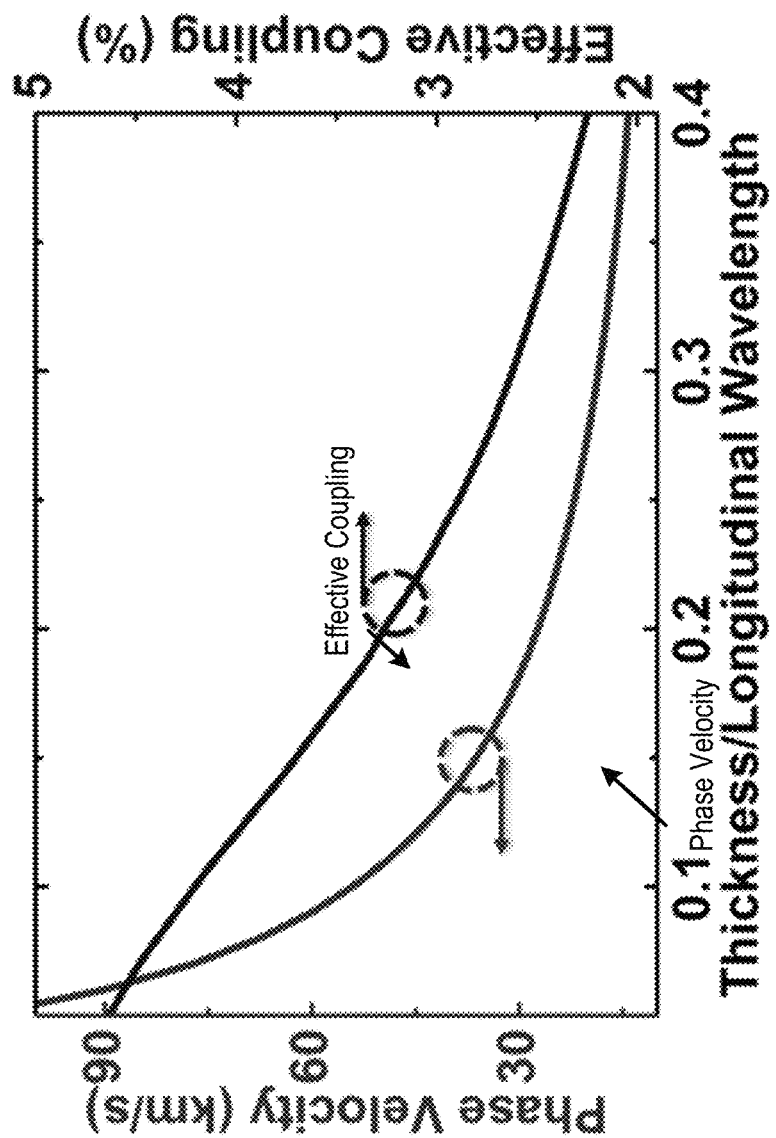
FIG. 16 is a graph illustrating a simulated phase velocity and effective electro-mechanical coupling factor ($k_{eff}^2$) of the A3 mode as a function of a ratio of film thickness to longitudinal wavelength ($h/\lambda_L$) according to some embodiments.

FIG. 16 is a graph illustrating a simulated phase velocity and effective electro-mechanical coupling factor ($k_{eff}^2$) of the A3 mode as a function of a ratio of film thickness to longitudinal wavelength (h/$\lambda_L$) according to embodiments. The frequency scaling described in reference to FIG. 1 can be further confirmed by simulating (e.g., a Comsol-simulation) the phase velocity. A lower h/$\lambda_L$, e.g., a thinner film, can produces a higher $k_t^2$. As a result, it can be interesting to consider a ratio h/$\lambda_L$ that is 0.1.

Figure 17:
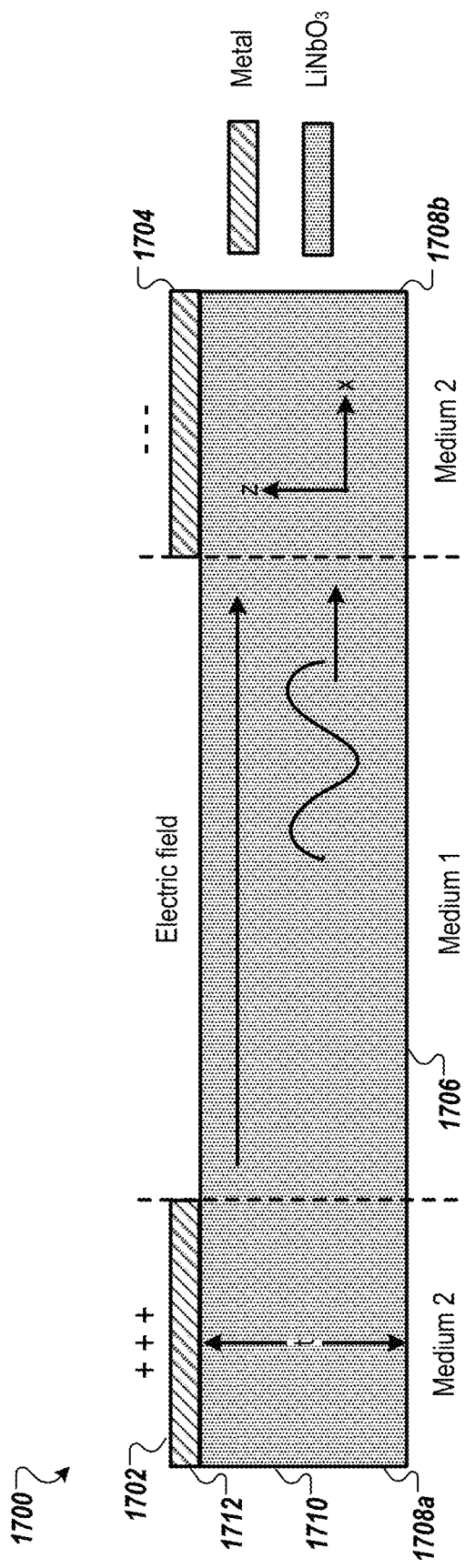
FIG. 17 is a cross-section view of an acoustic resonator illustrating a simplified electric field distribution and a model of a 2-D acoustic wave propagating in an A-mode $LiNbO_3$ resonator according to some embodiments.

FIG. 17 is a cross-section view of an acoustic resonator 1700 illustrating a simplified electric field distribution and a model of a 2-D acoustic wave propagating in an A-mode LiNbO$_3$ resonator according to some embodiments. Spurious modes adjacent to the intended mode (e.g., the A3 mode) can introduce ripples in a passband of a filter, e.g., an acoustic filter including the resonator 1700. In the asymmetric mode devices such as resonators, transducers, and filters described in the present disclosure, acoustic energy can be largely confined between a positive electrode 1702 and a negative electrode 1704. It should be noted that although the resonator 1700 is depicted as having the positive electrode 1702 and the negative electrode 1704; although, in other embodiments, the polarities of the electrodes can be reversed. The spurious modes can originate from insufficient confinement in the longitudinal direction. Energy confinement of the A3 mode between interdigital transducers (IDTs) of the resonator can ensure a spurious-free and high-Q response so that the resonator can be used in the acoustic filter.

In FIG. 17, a first section 1706 (e.g., Medium 1) can be a section without electrodes. A second section 1708a (e.g., Medium 2) can be a section with an electrode, such as the positive electrode 1702. A third section 1708b (e.g., Medium 2) can be a section with an electrode, such as the negative electrode 1704. Comparing wave numbers in the first section 1706 and the second sections 1708a and 1708b can allow for better understanding of the energy confinement. A quantitative understanding of the wave reflections at the interfaces between metalized and un-metalized regions can be achieved, allowing estimation of confinement between adjacent interfaces. In some embodiments, the thickness (t) of a LiNbO$_3$ thin film 1710 (e.g., slab) can be set to 500 nm and a covered metal 1712 (including the positive electrode 1702 and the negative electrode 1704) can be 100-nm-thick aluminum.

Figure 18A:
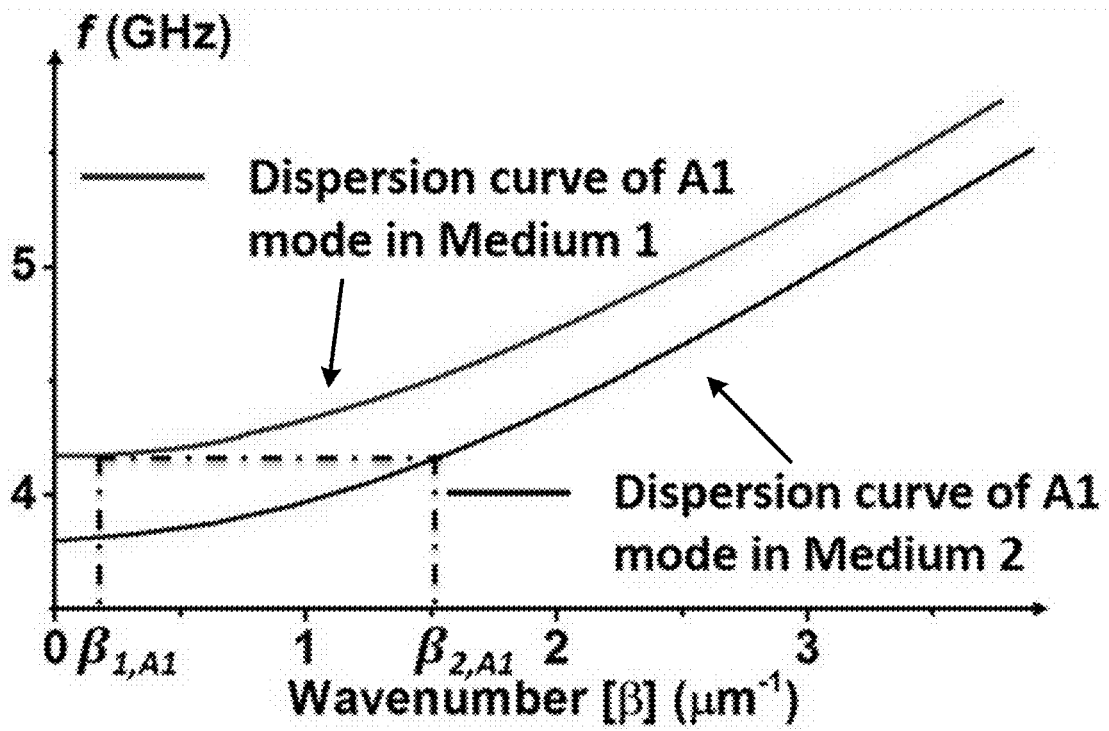
FIGS. 18A-18B are graphs respectively illustrating dispersion curves of A1 and A3 modes in two different mediums according to some embodiments.
Figure 18B:
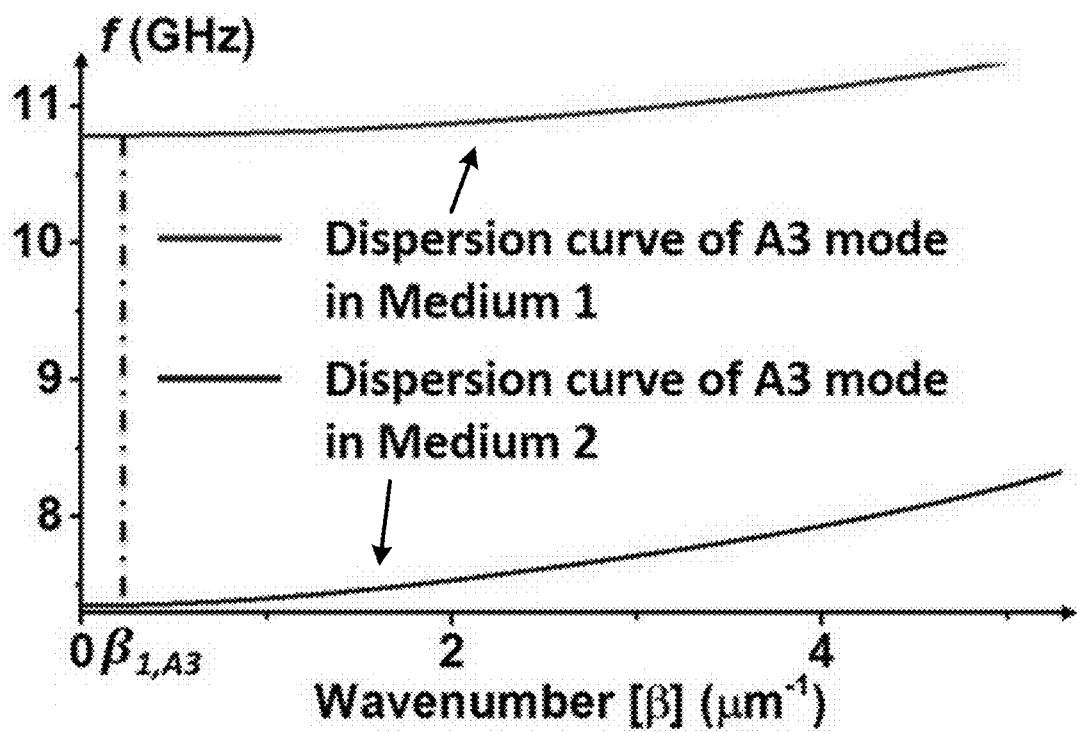

FIGS. 18A-18B are graphs respectively illustrating dispersion curves of the A1 and A3 modes in two different mediums according to some embodiments. Referring again to FIG. 17, the two different mediums can be a first medium corresponding to the first section 306 (e.g., Medium 1) and a second medium corresponding the second section 308a and the third section 308b (e.g., Medium 2). As seen in FIGS. 18A-18B, the dispersion curves of the A1 and A3 waves respectively in the first medium (e.g., Medium 1) and the second medium (e.g., Medium 2) can be calculated, e.g., using COMSOL finite element analysis (FEA). For an A1 wave, the longitudinal wavenumber in the second medium (e.g., Medium 2) ($\beta_{2,A1}$) can be several times of that in the first medium (e.g., Medium 1) ($\beta_{1,A1}$), which can lead to insufficient confinement and spurious modes. On the other hand, the difference between the longitudinal wavenumbers in these two mediums can be larger for the A3 mode, as illustrated in FIG. 18B. Therefore, the A3 wave can have better energy confinement between IDTs compared with the A1 wave, which can result in a spurious-free and high-Q response.

TABLE 5

| Parameter | Description | Value |
|---|---|---|
| L | Resonator total length | 100 μm |
| W | Resonator total width | 20 μm |
| $W_e$ | Electrode width | 6 μm |
| g | Gap between electrodes | 3 μm |
| t | Thickness of LiNbO$_3$ | 500 nm |
| $t_e$ | Thickness of metal electrodes | 100 nm |
| N | Number of electrodes | 3 |

Figure 19A:
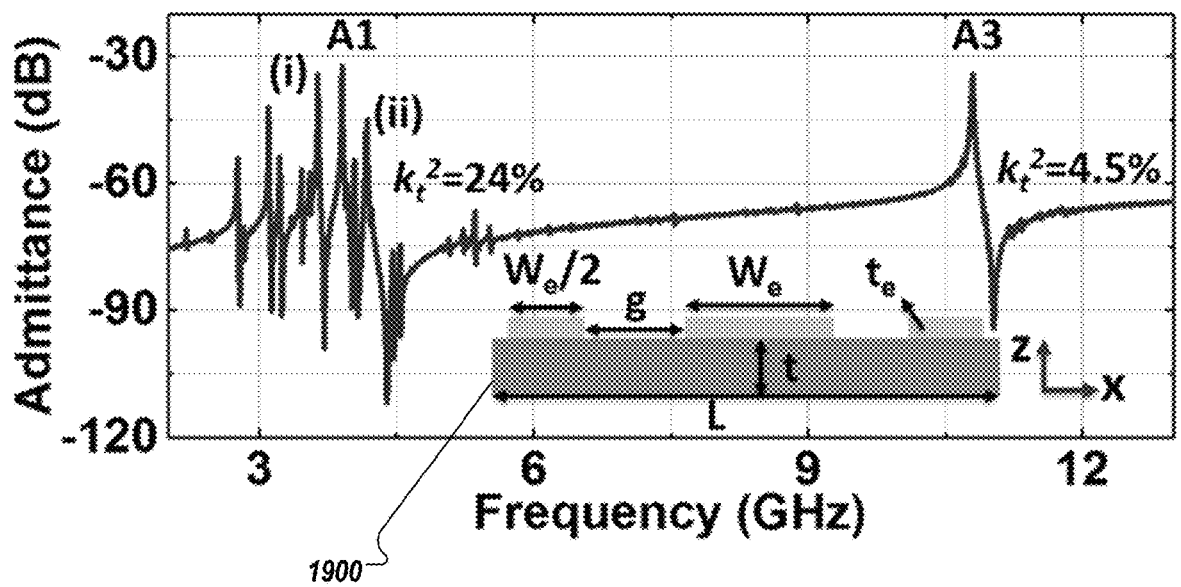
FIG. 19A a graph illustrating a simulated admittance response of an acoustic resonator (depicted as an inset) according to some embodiments.

FIG. 19A a graph illustrating a simulated admittance response of an acoustic resonator 500 (depicted as an inset) according to some embodiments. In particular, the simulated admittance response is of a Z-cut LiNbO$_3$ A-mode resonator 1900. In some embodiments, the acoustic resonator 1900 can include the three-electrode resonator on top of a mechanically suspended 1900 nm thick Z-cut LiNbO$_3$ thin film. The design parameters are summarized in Table 5.

Figure 19B:
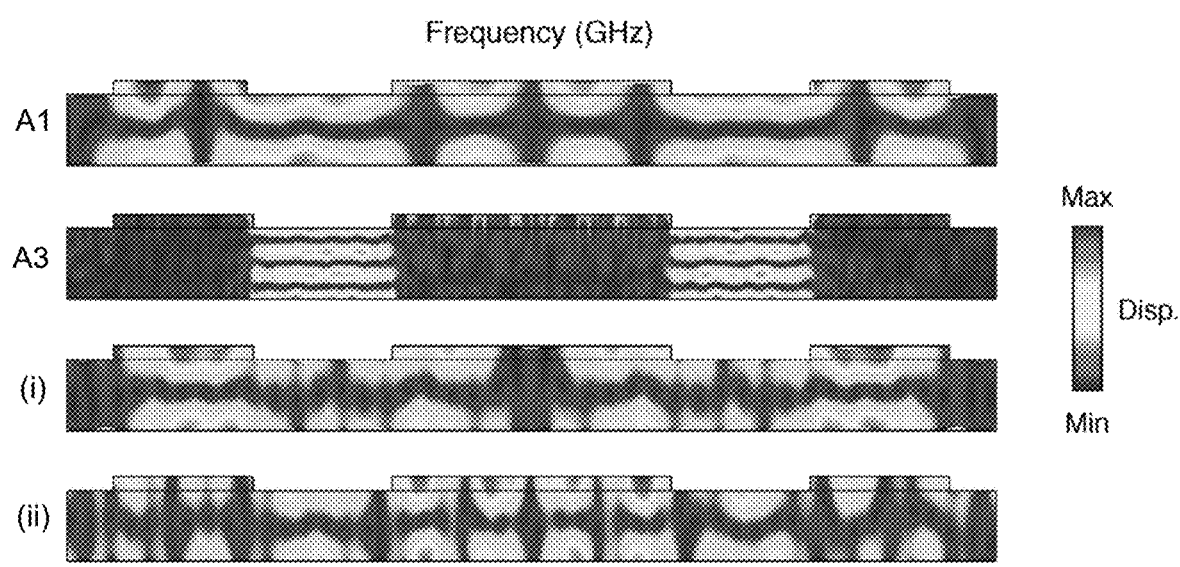
FIG. 19B are a series of images illustrating the FEA-simulated displacement mode shapes of A1 and A3 as well as spurious modes (i & ii) of the acoustic resonator of FIG. 19A according to some embodiments.

FIG. 19B are a series of images illustrating the FEA-simulated displacement mode shapes of A1 and A3 as well as spurious modes (i & ii) of the acoustic resonator 1900 according to some embodiments. Exemplary dimensions of the simulated resonator are listed in Table 5. Simulations (e.g., with 2D COMSOL FEA) of the resonator 1900 (shown as a cross-sectional mock-up in the inset in FIG. 19A) can further validate resonant characteristics and energy confinement. The simulation results show that the A3 mode can have a spurious-free response and can have less acoustic energy leakage to the LiNbO$_3$ sections covered by metal electrodes).

Figure 20A:
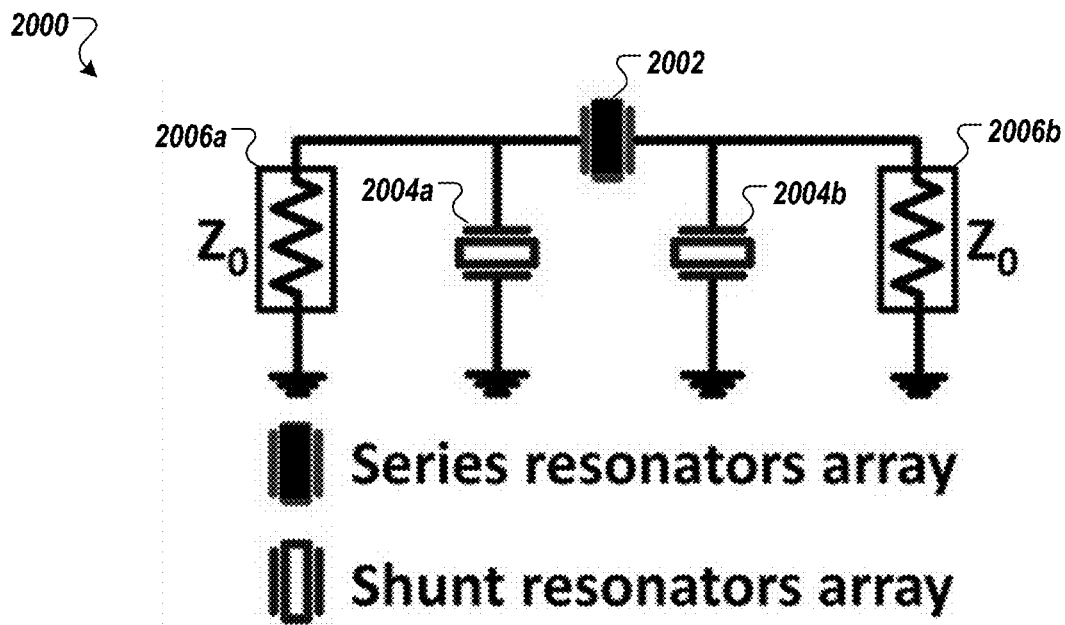
FIG. 20A is a schematic diagram of a ladder filter designed according to some embodiments.

FIG. 20A is a schematic diagram of a ladder filter 2000 designed according to some embodiments. In some embodiments, the ladder filter 2000 can be an acoustic filter. A simple ladder topology for the filter can provide sharp roll-off and large fractional bandwidth. The ladder filter 2000 includes a series resonator array 2002 and at least two shunt resonator arrays 2004a and 2004b. Each resonator array 2002, 2004a, 2004b can include a plurality of resonators (such as resonator 1700 of FIG. 17 or resonator 1900 of FIG. 19A). The resonators in each of the resonator arrays 2002, 2004a, and 2004b can be identical and can collectively have the same resonance. The array configuration that is used can provide large static capacitances (C$_0$) and can reduce the ladder filter (e.g., system) impedance 2006a and 2006b (Z$_0$). To achieve the maximum bandwidth allowed by the attained k$_t^2$, the resonant frequencies of series resonator array 2002 and the shunt resonators arrays 2004a and 2004b can be designed with a frequency offset between them so that the parallel resonance of the shunt resonators 2004a and 2004b closely aligns with the series resonance of the series resonator 2002. For example, the frequency can be can be at least partially determined by varying the gap (g) between electrodes (also referred to as the electrode gap, or simply the gap). It should be noted that the gap is schematically depicted in FIG. 19A.

Figure 20B:
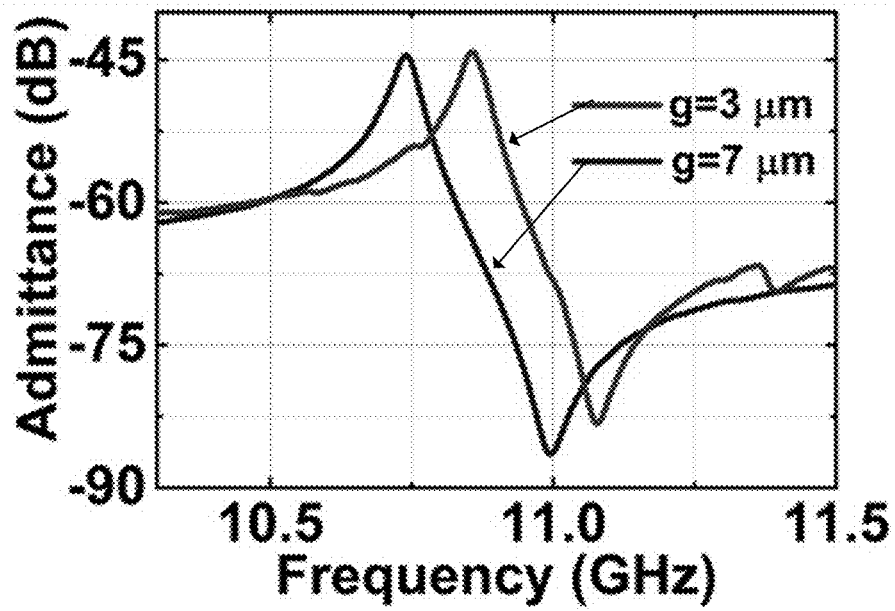
FIG. 20B is a graph illustrating simulated admittance responses of series and shunt resonators with different electrode gaps according to some embodiments.

FIG. 20B is a graph illustrating the simulated admittance responses of series and shunt resonators with different electrode gaps according to embodiments of the present disclosure. The series and shunt resonators can be similar to the resonators of the resonator arrays 2002, 2004a, and 2004b. The simulated admittance responses of FIG. 20B show a frequency offset of 200 MHz. According to the dispersion curves in FIG. 18B, the required resonant frequency offset can be attained by varying the distance between interdigitated electrodes (e.g., the gap, g, between electrodes) and hence the longitudinal wavelength. As illustrated in FIG. 20B, the simulated responses of a single series resonator and a single shunt resonator have a frequency offset of 200 MHz.

In one embodiment, the gap of the acoustic resonator of each of a first shunt resonator array (e.g., 2004a) and of a second shunt resonator array (e.g., 2004b) is a first gap, and the gap of the acoustic resonator of the series resonator array 2002 is a second gap that is different in size than the first gap. Therefore, the gaps for the series and shunt resonators can be chosen as 3 μm and 7 μm, respectively (see FIGS. 24A-24B), but can range between 1 μm and 25 μm. In some embodiment, a first resonant frequency of the first shunt resonator array and of the second shunt resonator array is determined by the first gap and a second resonant frequency of the series resonator array is determined by the second gap, and wherein the first gap is between 5 μm to 8 μm and the second gap is between 2 μm to 4 μm. In one embodiment, the first shunt resonator array, the second shunt resonator array, and the series resonator arrays each comprise an identical number of acoustic resonators.

Figure 21:
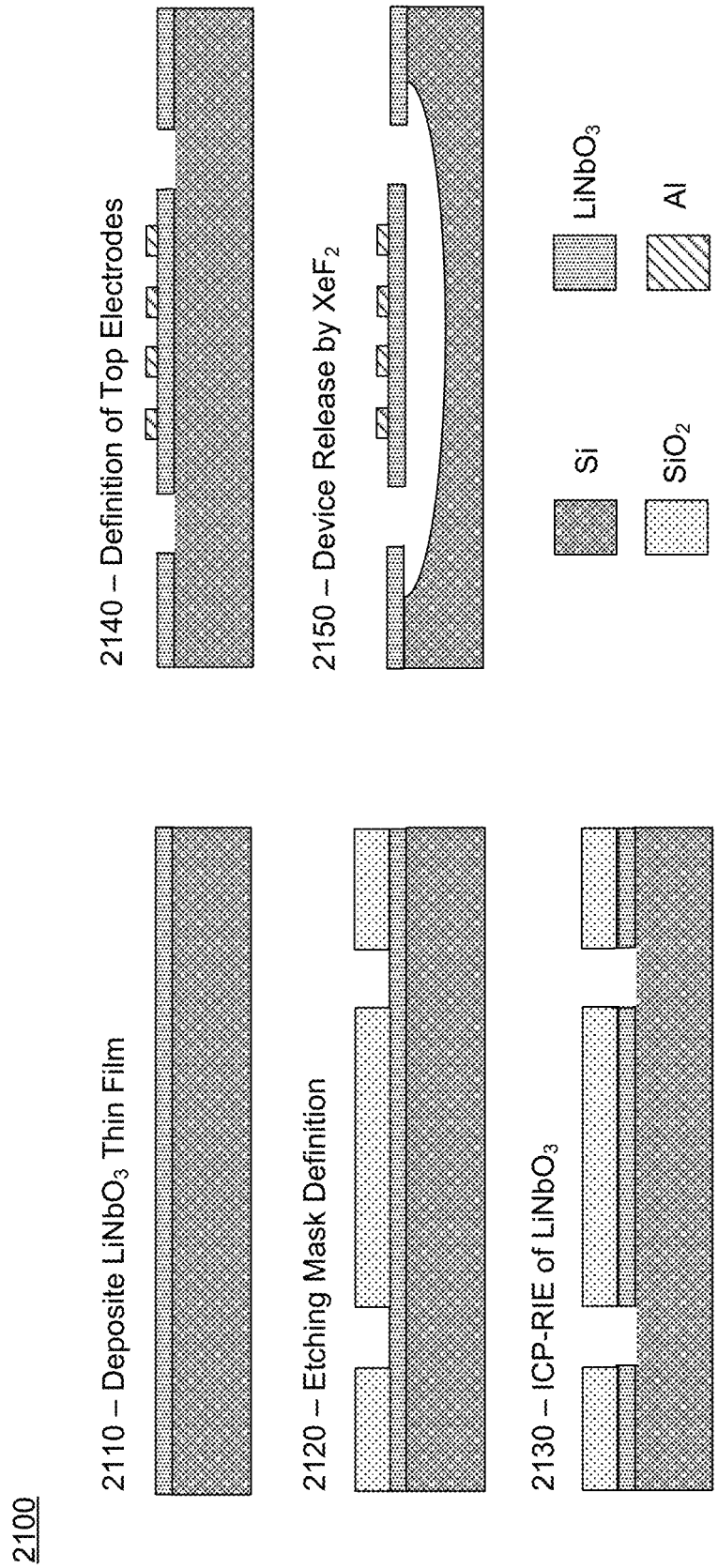
FIG. 21 is a set of cross-sectional images of a resonator illustrating a fabrication process for fabricating a resonator according to some embodiments.

FIG. 21 is a set of cross-sectional images of a resonator illustrating a fabrication process 2100 for fabricating a resonator according to some embodiments. The resonator can be any acoustic resonator discussed herein. The designed resonators and filters can be fabricated using a 500 nm transferred Z-cut LiNbO$_3$ piezoelectric thin film following the process outlined by FIG. 21 in order to validate the analytical and modeling results. The fabricated resonators (e.g., devices) can be characterized with a network analyzer (e.g., a Keysight N5230A PNA-L network analyzer) in dry air and at room temperature.

With additional specificity, at operation 2110, LiNbO$_3$ piezoelectric thin film is deposited on a silicon (Si) carrier substrate. At operation 2120, an etching mask (such as PECVD SiO$_2$) is defined on top of the piezoelectric thin film to form release windows. At operation 2130, the LiNbO$_3$ piezoelectric thin film is etched to form the release windows in a reactive-ion etching (RIE) system with inductively-coupled plasma (ICP). At operation 2140, the top electrodes are defined via one or more process steps. At operation 2150, to form the free acoustic boundaries of a cavity, the silicon (Si) under the LiNbO$_3$ piezoelectric thin film is released using, for example, xenon difluoride (XeF$_2$). As a final operation (not illustrated), after the wet etching, a critical point drying (CPD) can performed to dehydrate the resonator device.

Figure 22:
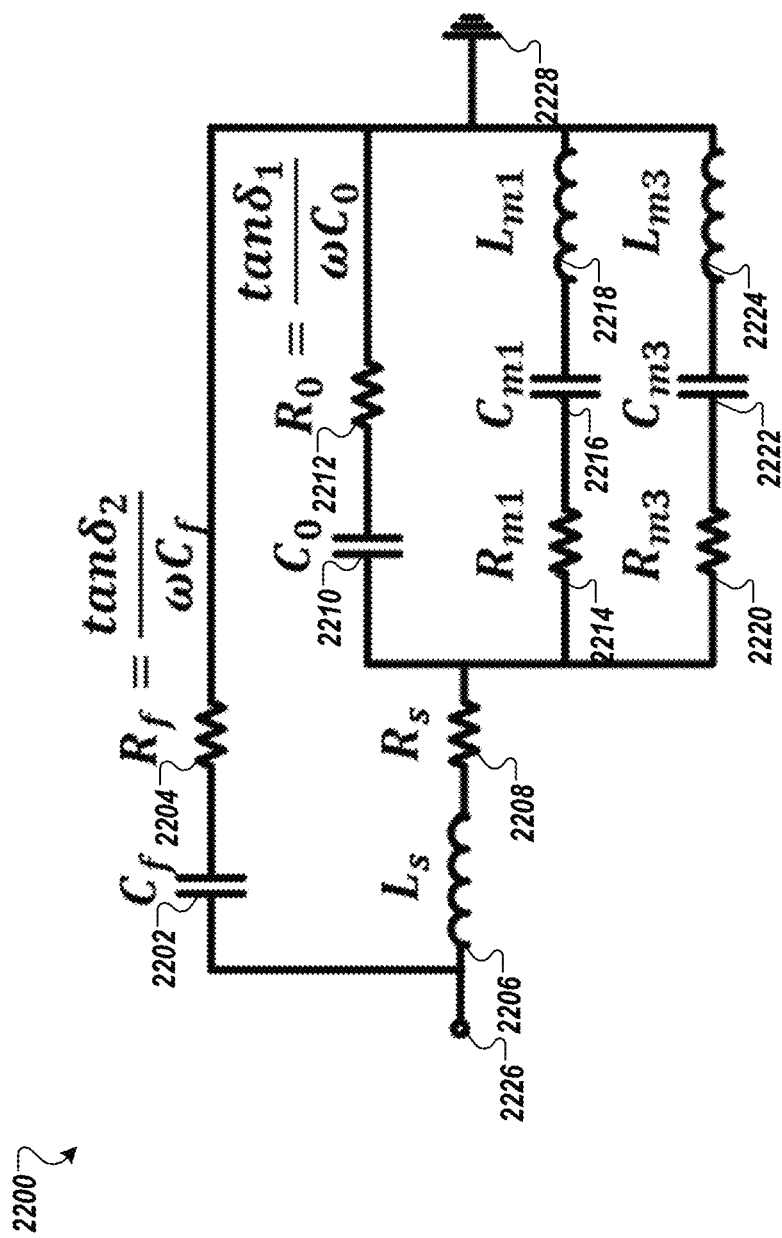
FIG. 22 is a schematic diagram illustrating a multi-resonance modified Butterworth-Van Dyke (MBVD) model according to some embodiments.

FIG. 22 is a schematic diagram illustrating a multi-resonance modified Butterworth-Van Dyke (MBVD) model 2200 according to some embodiments. The multi-resonance MBVD model 2200 can model certain resonance behavior and losses using circuitry coupled together, as illustrated. This circuitry can include a capacitor 2202 coupled in series to resistor 2204, which are coupled to a first terminal 2226. The capacitor 2202 and the resistor 2204 can be coupled in parallel to an inductor 2206 coupled in series to a resistor 2208, which are also coupled to the first terminal 2226. The inductor 2206 and the resistor 2208 can be coupled in series to a parallel-connected RLC network that includes resistors, capacitors, and inductors. Circuitry of the RLC network can include a number of branches coupled in parallel. For example, a first branch can include a capacitor 2210 and a resistor 2212 coupled in series, a second branch can include a resistor 2214, a capacitor 2216, and an inductor 2218 coupled in series, and a third branch can include a resistor 2220, a capacitor 2222, and an inductor 2224 coupled in series. The resistor 2204 and the RLC network can in turn be coupled to a ground potential 2228.

In various embodiments, the resistor 2214, the capacitor 2216, and the inductor 2218 can correspond to a motional branch of A1 mode resonance. The resistor 2220, the capacitor 2222, and the inductor 2224 can correspond to a motional branch of A3 mode resonance. The capacitor 2210 can model a static capacitance. The resistor 2212 can model loss in the LiNbO$_3$ film. The inductor 2206 can represent a series inductance of the IDTs. The resistor 2208 can represent a series resistance of the IDTs. The capacitor 2202 can model a feedback capacitance. The resistor 2204 can model loss in a silicon (Si) substrate. The resistance of the resistor 2204 can be expressed as $$R_f = \frac{\tan \delta_2}{\omega C_f} \quad (17)$$

and the resistance of the resistor 2212 can be expressed as $$R_f = \frac{\tan \delta_1}{\omega C_0} \quad (18)$$

where $C_f$ is the capacitance of the capacitor 2202 and $C_0$ is the capacitance of the capacitor 2210. The element $\tan \delta_2$ can be a loss tangent of the LiNbO$_3$ thin film and the element $\tan \delta_2$ can be a loss tangent of the Si substrate.

Figures 23, 23A, 23B:
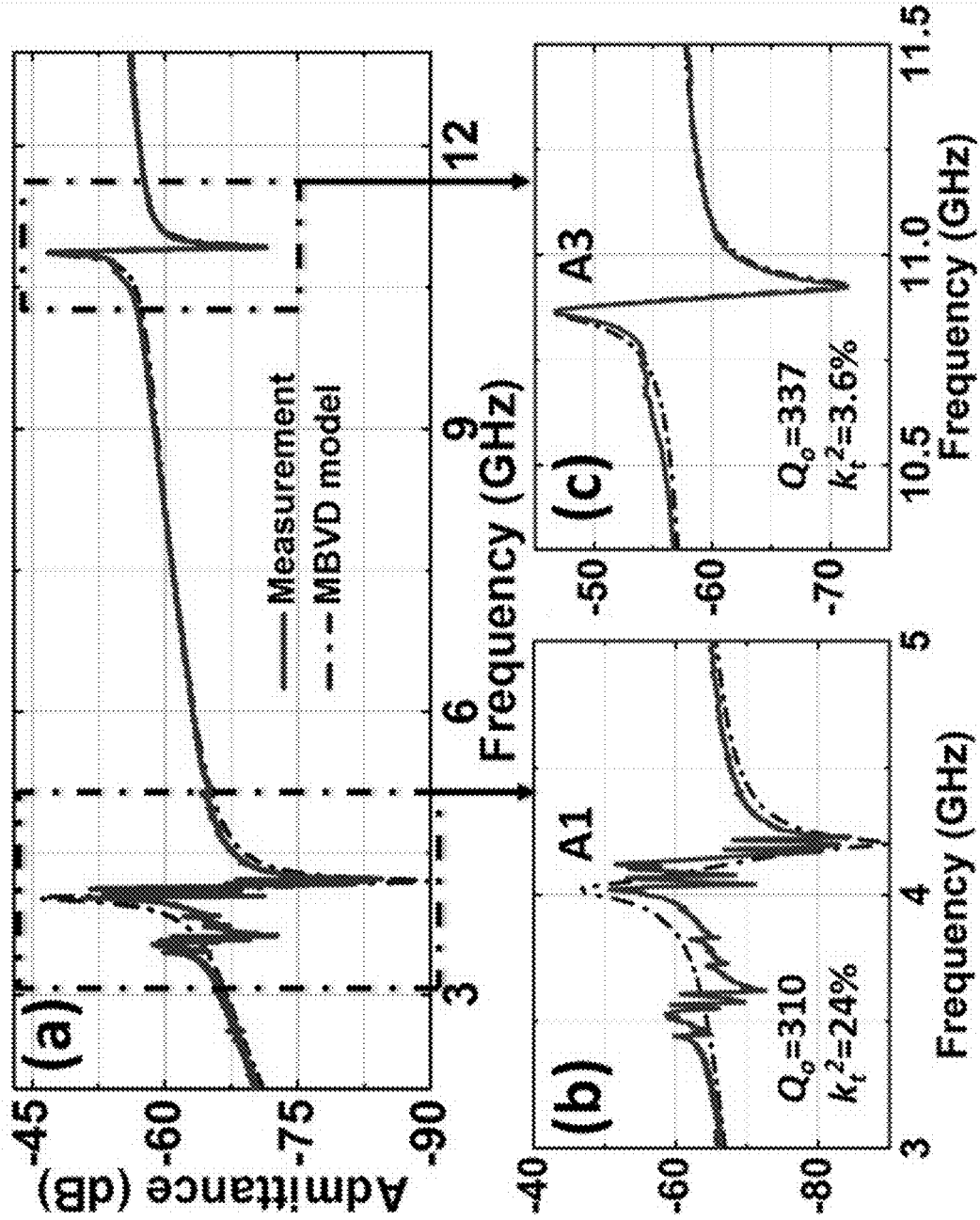
FIG. 23 is a graph that illustrates a measured response of a Z-cut LiNbO$_3$ A-mode resonator according to some embodiments.
FIG. 23A is a zoomed-in view of a portion of the graph of FIG. 23 according to some embodiments.
FIG. 23B is a zoomed-in view of a portion of the graph of FIG. 23 according to some embodiments.

FIG. 23 is a graph that illustrates a measured response of a Z-cut LiNbO$_3$ A-mode resonator according to some embodiments. Similar to the simulation results of FIG. 19A, the measurement result shown in FIG. 23 exhibits two resonant frequencies at 4 GHz and 10.8 GHz, which can correspond to the anticipated A1 and A3 modes respectively. The measurement can also be compared to the multi-resonance MBVD model of FIG. 22 in order to extract the performance parameters listed in Table 6 below. The MBVD modeled response (e.g., the response of the MVBD model of FIG. 22) is also shown in FIG. 10. The A3 mode shows a spurious-free response with a $k_t^2$ of 3.6% and a Q of 337. The Q can be high for piezoelectric MEMS resonators operating at this frequency range. FIG. 23A is a zoomed-in view of a portion of the graph of FIG. 23 according to some embodiments, which shows the admittance response for the A1 mode. FIG. 23B is a zoomed-in view of a portion of the graph of FIG. 23 according to some embodiments, which shows the admittance response for the A3 mode.

TABLE 6

| Parameters | Value |
| --- | --- |
| $f_0$ | 10.8 GHz |
| $Q_0$ | 337 |
| $k_t^2$ | 3.6% |
| FoM | 12 |
| $R_{m3}$ | 148 Ω |
| $C_{m3}$ | 0.21 fF |
| $L_{m3}$ | 1.04 µH |
| $C_0$ | 7.6 fF |
| $R_s$ | 40 Ω |
| $C_f$ | 12 fF |
| $L_s$ | 100 pF |
| $\tan \delta_1$ | 0.05 |
| $\tan \delta_2$ | 0.005 |

FIG. 24 is an optical image of a fabricated ladder filter 1100 that includes series resonators 1104 and shunt resonators 1102 according to some embodiments. FIG. 24A is a zoomed-in SEM optical image of the electrode gap of shunt resonators 1104 according to some embodiments. FIG. 24B is a zoomed-in SEM optical image of the electrode gap of series resonators according to some embodiments. The fabricated ladder filter 1100 has an overall footprint of 0.7×0.5 mm$^2$. Electrode gaps of the series resonator arrays 1104 (7 µm) and shunt resonator arrays 1102 arrays (3 µm) are labeled in the zoomed-in SEM images of the shunt resonators 1102 and the series resonators 1104.

Figure 25A:
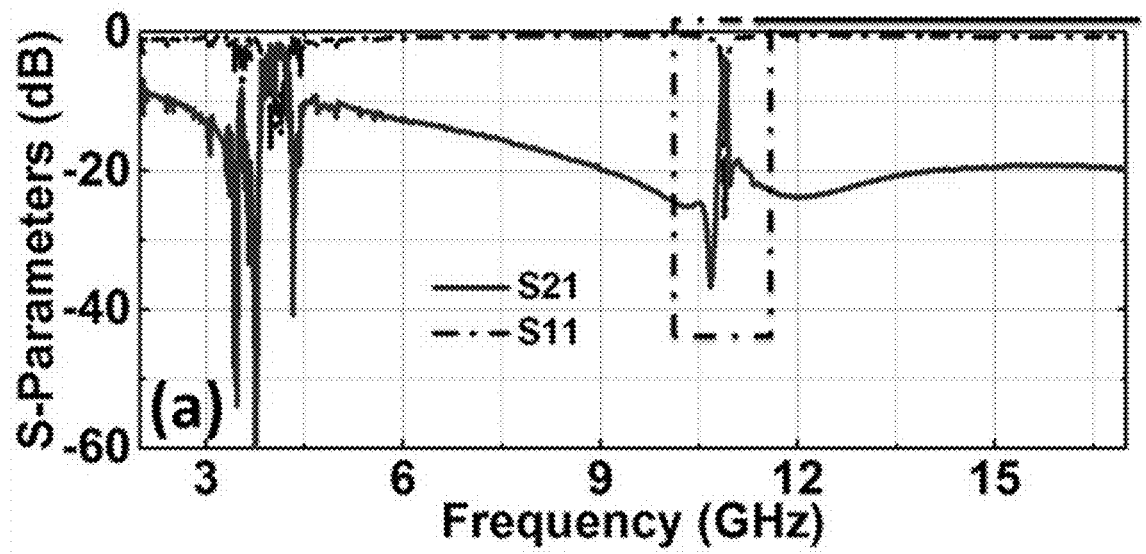
FIG. 25A is a graph that illustrates a wide-frequency-range measured response of a fabricated ladder filter according to some embodiments.
Figure 25B:
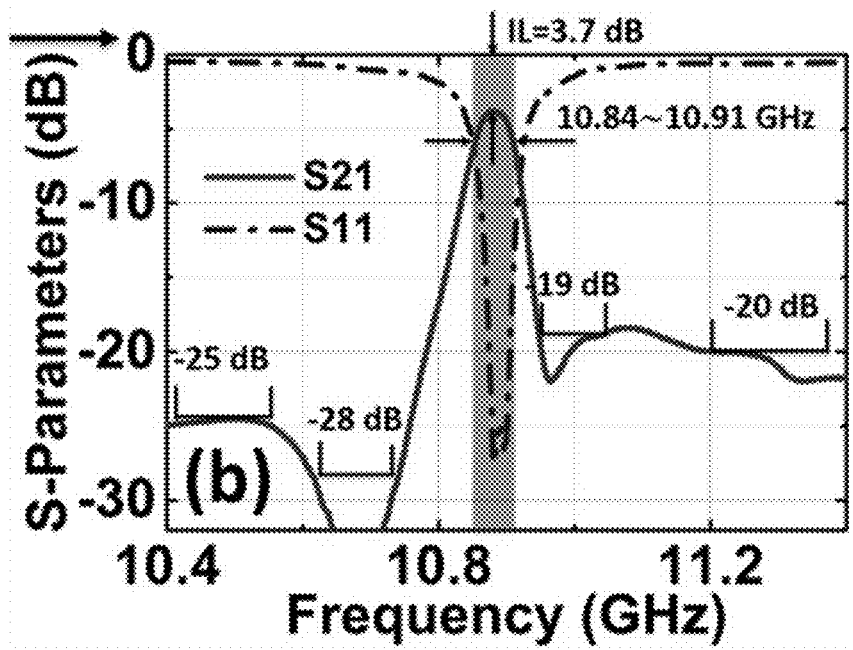
FIG. 25B is a graph that illustrates a zoomed-in view of an intended passband of a wide-frequency-range measured response of a fabricated ladder filter according to some embodiments.

FIG. 25A is a graph that illustrates a wide-frequency-range measured response of a fabricated ladder filter according to some embodiments. FIG. 25B is a graph that illustrates a zoomed-in view of an intended passband of a wide-frequency-range measured response of a fabricated ladder filter according to some embodiments. The responses shown in FIGS. 25A-25B are measured S21 and S11 responses matched to a system impedance of 140Ω. The demonstration of scaling a LiNbO$_3$ filter beyond 10 GHz has shown an IL of 3.7 dB, an out-of-band rejection of −20 dB, an in-band ripple of below 0.1 dB, and a bandwidth of 70 MHz. Measured parameters of the fabricated ladder filter are shown in Table 7 below.

TABLE 7

| Parameters | Value |
| --- | --- |
| Center frequency | 10.8 GHz |
| $Z_0$ | 140 Ω |
| Insertion loss | 3.7 dB |
| 3-dB bandwidth | 70 MHz |
| OoB rejection | −20 dB |
| In-band ripple | <0.1 dB |

Figure 26:
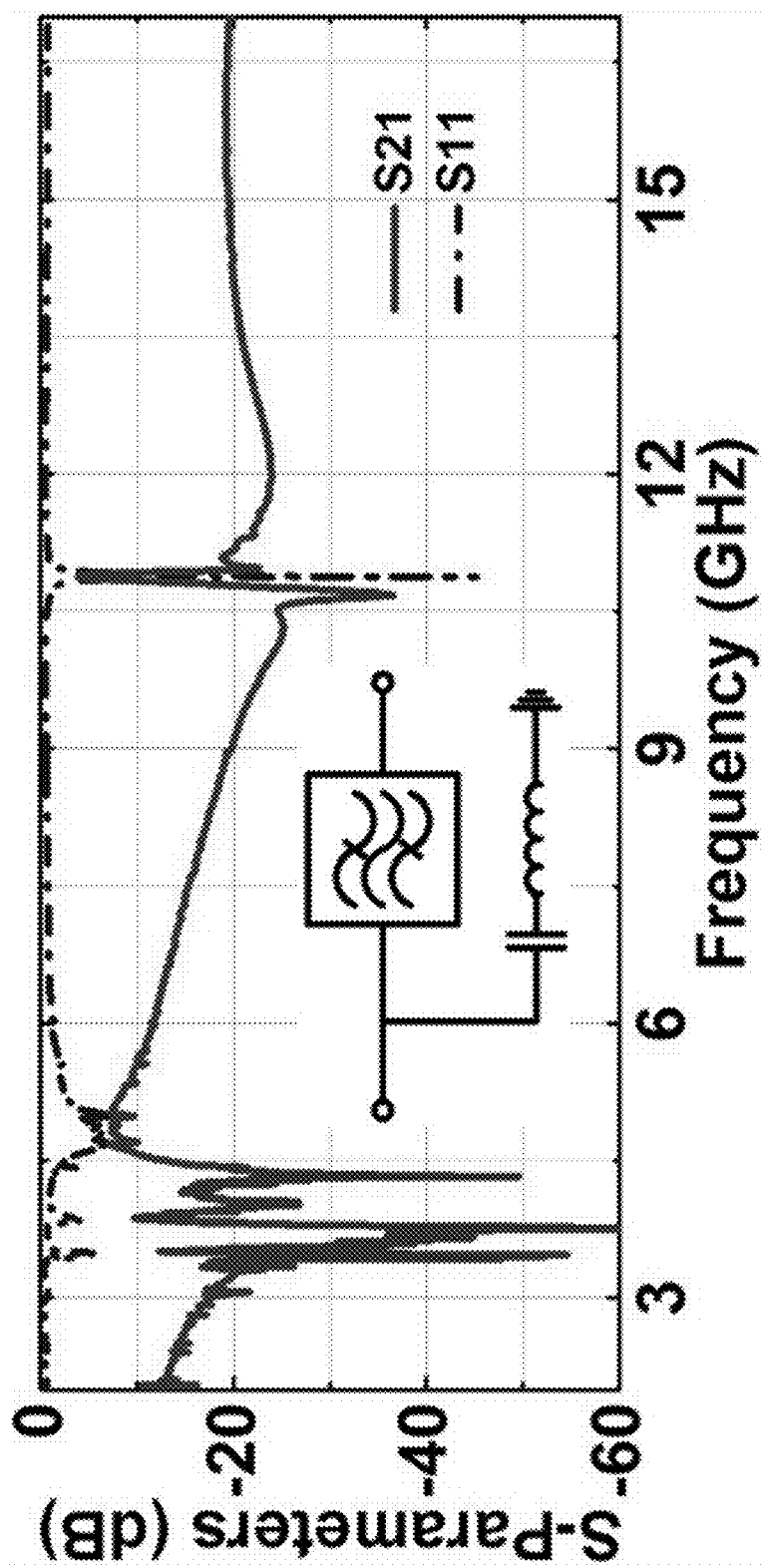
FIG. 26 is a graph that illustrates a wide-frequency-range response of a fabricated ladder filter with a shunt LC branch according to some embodiments.

FIG. 26 is a graph that illustrates a wide-frequency-range response of a fabricated ladder filter with a shunt LC branch according to embodiments of the present disclosure. The achieved bandwidth can be lower than the intended frequency offset, which can be due to the large parasitic capacitance paralleled with the series resonators array, which can be mitigated by reducing the size of bus lines and lead lines. As illustrated, an unwanted passband around 4 GHz induced by the A1 mode resonance can be suppressed by applying a shunt LC branch without compromising the performance of the intended passband.

The design of a third-order asymmetric Lamb wave mode resonator in LiNbO$_3$ described in the present disclosure can allow for fabrication of acoustic filters at higher frequencies than 4G bands. The demonstrated filter (e.g., acoustic filter or ladder filter) at 10.8 GHz can allow scaling LiNbO$_3$-based acoustic devices towards the 5G frequency bands well beyond 10 GHz.

As 5G promises to open new horizons for paradigm-shifting applications, miniature wideband filters in sub-6 GHz are one of the outstanding challenges in front-end. Currently, the commercial solutions are SAW resonators and thin-film bulk acoustic wave BAW resonators. However, their moderate electromechanical coupling ($kt^2 < 10\%$) are insufficient to meet several allocated 5G new bands. Although the bandwidth can be increased by integrating passive electromagnetic components with acoustic resonators, the enhancement comes at the cost of complex manufacturing processes and large sizes.

Alternatively, the first-order antisymmetric (A1) Lamb wave mode resonators based on lithium niobate (LiNbO$_3$)

thin films have recently been studied as a compelling solution for sub-6 GHz wideband filters due to their high $kt^2$ (>20%) and record-break FoM. Despite their prospect of enabling wideband and low loss filters, the demonstrated A1 devices so far are all laden with the spurious modes. The presence of spurious modes remains a major bottleneck for further advancing A1 device into real applications as it creates unwanted ripples in comprising filters.

To overcome this challenge, the present disclosure focuses on the suppression of the spurious modes in $LiNbO_3$ A1 resonators. We first identify the origins of spurious modes in the conventional $LiNbO_3$ A1 design that includes top interdigital electrodes in physical contact with a suspended $LiNbO_3$ thin film. It is concluded that the dispersion mismatch between metalized and unmetalized sections of the $LiNbO_3$ thin-film causes the most significant spurious modes.

An improved design that exploits dispersion matching across the resonator is then proposed and analyzed. The dispersion matching can be achieved by micromachining the $LiNbO_3$ thin film to form a recessed structure for top electrodes. The recessed electrodes have been used in SAW resonators for better energy confinement (higher dispersion mismatch). In a similar fashion but for a contrasting purpose, this work utilizes recessed structures to minimize the trapping of the acoustic energy. The dispersion matching of A1 in $LiNbO_3$ based on different metal electrodes is analytically modeled and validated with finite element analysis. The relationship between the recessed depth and electrode thickness is discussed. To validate our analysis and modeling, different designs of devices have been fabricated on a 650-nm-thick Z-cut $LiNbO_3$ thin film with all of them showing near spurious-free measured responses. These devices have shown strong potential for enabling high-performance A1 devices for future 5G front-ends.

Figure 27A:
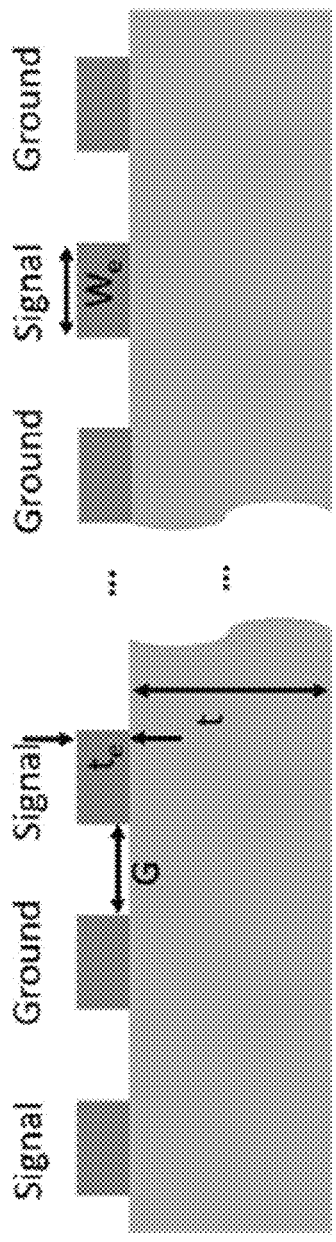
FIG. 27A is cross-section view of a LiNbO$_3$ A1 mode resonator according to some embodiments.

FIG. 27A is cross-section view of a $LiNbO_3$ A1 mode resonator according to some embodiments. To efficiently excite the A1 in a $LiNbO_3$ thin film, the top-only resonators are typically used for the least fabrication complication. To achieve high performance, the acoustic energy is confined in the main body of the devices by etching through $LiNbO_3$ thin film to form free boundaries, and the energy confinement may introduce unwanted higher-order A1 modes, which are treated as spurious modes. To simplify the relationship between the fundamental A1 and other higher-order A1 spurious modes, the cross-section of the resonator can be viewed as a two-dimensional (2D) cavity.

The resonant frequency ($f_0^{A1}$) of the A1 mode in a 2D cavity with a thickness of t and length of l is given by:

$$f_0^{A1} = \sqrt{\left(\frac{v_t}{2t}\right)^2 + \left(\frac{v_l}{2l}\right)^2} \quad (19)$$

where $v_t$ and $v_L$ are the acoustic velocities in the vertical and lateral directions. Based on our previous work, the thickness of $LiNbO_3$ (t) is chosen to be 650 nm in this work for 5G new radio (NR), but other thicknesses are envisioned depending on other design parameters. To achieve sufficient static capacitance for system impedance matching, the $LiNbO_3$ A1 devices typically include multiple pairs of electrodes or unit cells, as illustrated in FIG. 27A, which include alternating signal electrodes and ground electrodes, e.g., as interdigitated electrodes (IDTs). Each unit is treated as a quasi-isolated resonant body from the rest. The length (l) of the resonant body, which influences the resonant frequency, depends on the structure of the A1 devices. In the ideal case where A1 is excited in a $LiNbO_3$ thin film without electrical and mechanical loading, l is decided by the distribution of the applied electric fields.

Figure 27B:
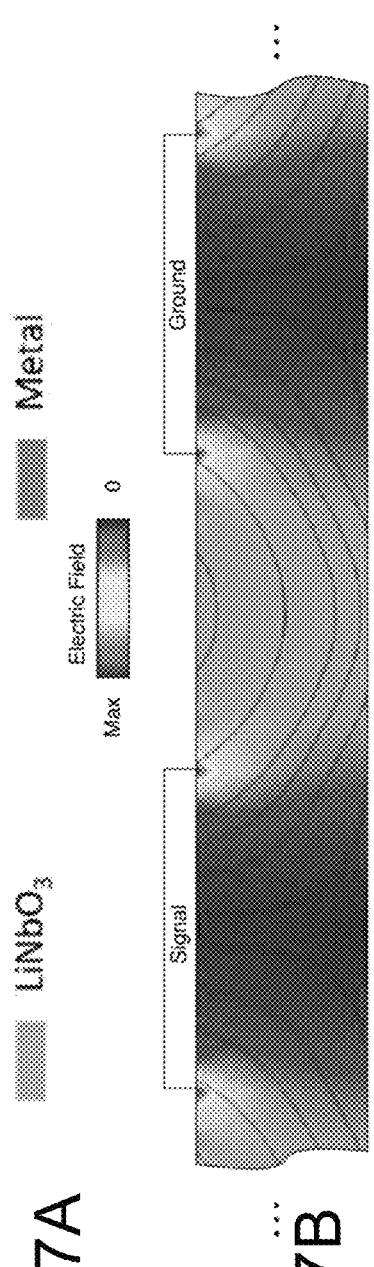
FIG. 27B is an FEA-simulated image illustrating the result of electric field distribution with electric field lines of the resonator of FIG. 27A according to an embodiment.

FIG. 27B is an FEA-simulated image illustrating the result of electric field distribution with electric field lines of the resonator of FIG. 27A according to an embodiment. More specifically, l is the distance between the respective zero-E-field planes under the signal and ground electrodes. At such planes, the mechanical deformations of A1 are decoupled with the electrical field. These zero-E-field planes are referred to onward as the electrical boundaries. Without considering the mechanical loading, l is equal to the sum of the electrode separation (G) and electrode width ($W_e$). However, in the actual $LiNbO_3$ A1 devices, which use top electrodes for the generation of the electric field, both electrical boundaries and mechanical interfaces affect the value of l.

Figure 27C:
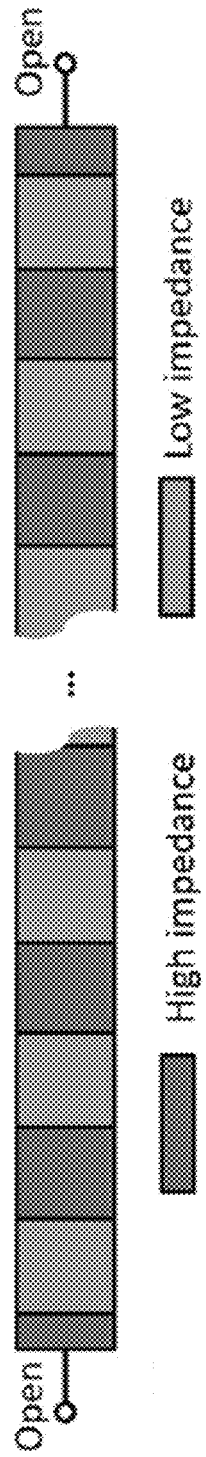
FIG. 27C is an FEA-simulated image illustrating an equivalent model of the resonator of FIG. 27A according to an embodiment.

FIG. 27C is an FEA-simulated image illustrating an equivalent model of the resonator of FIG. 27A according to an embodiment. The mechanical interfaces refer to the positions of the top electrodes as they are created by the acoustic impedance mismatch between the $LiNbO_3$ sections with and without top electrodes. Specifically, as seen in FIG. 27C, the whole resonator body can be modeled as the alternatingly cascading the high impedance and low impedance sections. Similar to EM, acoustic waves reflect at the interface or boundary between two media with different acoustic impedance. The mechanical boundaries divide the A1 devices into two sets of sections. The first set of sections are the $LiNbO_3$ sections without top electrodes, for which the value of l is equal to the value of G. The other set of sections are the $LiNbO_3$ sections with top electrodes, for which the value of l is equal to the value of $W_e$.

As l can have multiple values in the Equation 19, A1 modes with different resonant frequencies can be excited in the device with top electrodes. Among these A1 modes, the fundamental mode features the largest $k_t^2$. From the point of energy, $k_t^2$ of the excited A1 depends on the mutual energy ($U_m$) between the electrical and mechanical domains. $U_m$ is the integration between the electrical field and stress. As the A1 mode confined by the electrical boundaries (l=$W_e$+G) features the largest mutual energy, it can be treated as the fundamental mode. In contrast, the A1 modes confined by the mechanical interfaces are treated as the higher-order spurious modes.

TABLE 8

Design Parameters of A1 Resonators

| Sym. | Parameter | Value |
|---|---|---|
| t | $LiNbO_3$ thickness | 650 nm |
| G | Electrode separation | 4-8 μm |
| $t_e$ | Electrode thickness | 70 nm |
| $W_e$ | Electrode width | 3 μm |
| L | Electrode length | 60 μm |

As the mechanical interfaces lead to the internal reflections of the acoustic waves, multiple orders of the lateral A1 spurious modes can be presented. The resonant frequencies of the higher-order A1 spurious modes ($f_0^{mn}$) in the same 2D cavity are given by:

$$f_0^{mn} = \frac{v_l}{2t}\sqrt{(am)^2 + \left(n\frac{t}{l}\right)^2} \quad (20)$$

where m and n are the mode orders in the vertical and longitudinal directions, respectively. α is the ratio between the velocities in vertical and lateral directions. According to Hooke's law of elasticity, the specific spurious modes only can be generated in the case where $U_m$ is nonzero. Based on our previous work, only the higher-order spurious modes with odd orders in the vertical and lateral directions can be excited from the nonzero integral of $U_m$. As the performance of the comprised filters is mainly affected by the spurious modes near the passband, the resonant frequencies of the spurious modes close to $f_0^{A1}$ will be identified and analyzed.

In a LiNbO$_3$ thin film of several hundred microns in thickness, a is much larger than t/l in Equation 20. In this case, for higher-order spurious modes (m>1) in the vertical direction, the $f_0^{mn}$ would be around m times higher than $f_0^{A1}$, which are far away from the passband. For the lateral (e.g., longitudinal) higher-order A1 modes with m=1, especially the third-order (n=3), the resonant frequencies ($f_0^{1n}$) are close to $f_0^{A1}$. In addition to the resonant frequencies, the lateral higher-order A1 modes also feature a high kt$^2$. From the point of energy, kt$^2$ of the higher-order A1 also depends on the $U_m$ between the electrical and mechanical domains. Assuming the stress field of the higher-order A1 mode follows the sine distribution in the lateral direction, kt$^2$ of the m$^{th}$ order A1 mode is 1/m$^2$ of the fundamental A1 mode. Considering the large kt$^2$ of the fundamental A1, third-order A1 would feature kt$^2$ over 3%, leading to ripples over a wide frequency range.

To further understand the mechanical interfaces induced by the electrical and mechanical loadings, the electrical loading is first studied. The electrical loading leads to nonzero mechanical stress due to the piezoelectricity, inducing the reflection of the acoustic waves at the electrode edges. To validate the effect of the electrical loading, the massless top electrodes are defined in the COMSOL-based finite element analysis (FEA).

Figure 28A:
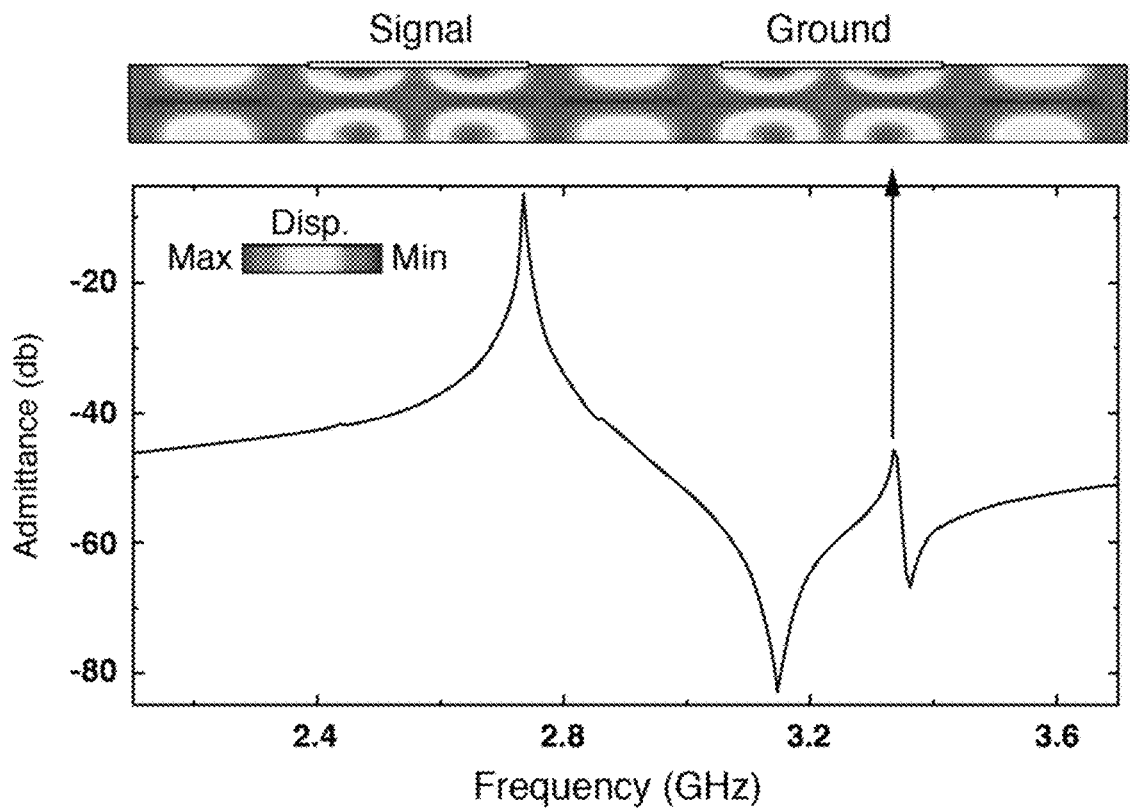
FIG. 28A is a graph and corresponding FEA-simulated result of admittance versus frequency of an A1 mode resonator with only electrical loading according to an embodiment.

FIG. 28A is a graph and corresponding FEA-simulated result of admittance versus frequency of an A1 mode resonator with only electrical loading according to an embodiment. This simulated response of the lateral third-order A1 mode is excited due to the electrical loading. Additionally, the mechanical loading from the top electrodes leads to the change of the equivalent density and Young's modules at the electrode edges. While the reflection caused by electrical loading does not vary with electrode thickness, the reflection from the mechanical loading increases for thicker electrodes. The greater reflections subsequently induce more significant spurious modes.

Figure 28B:
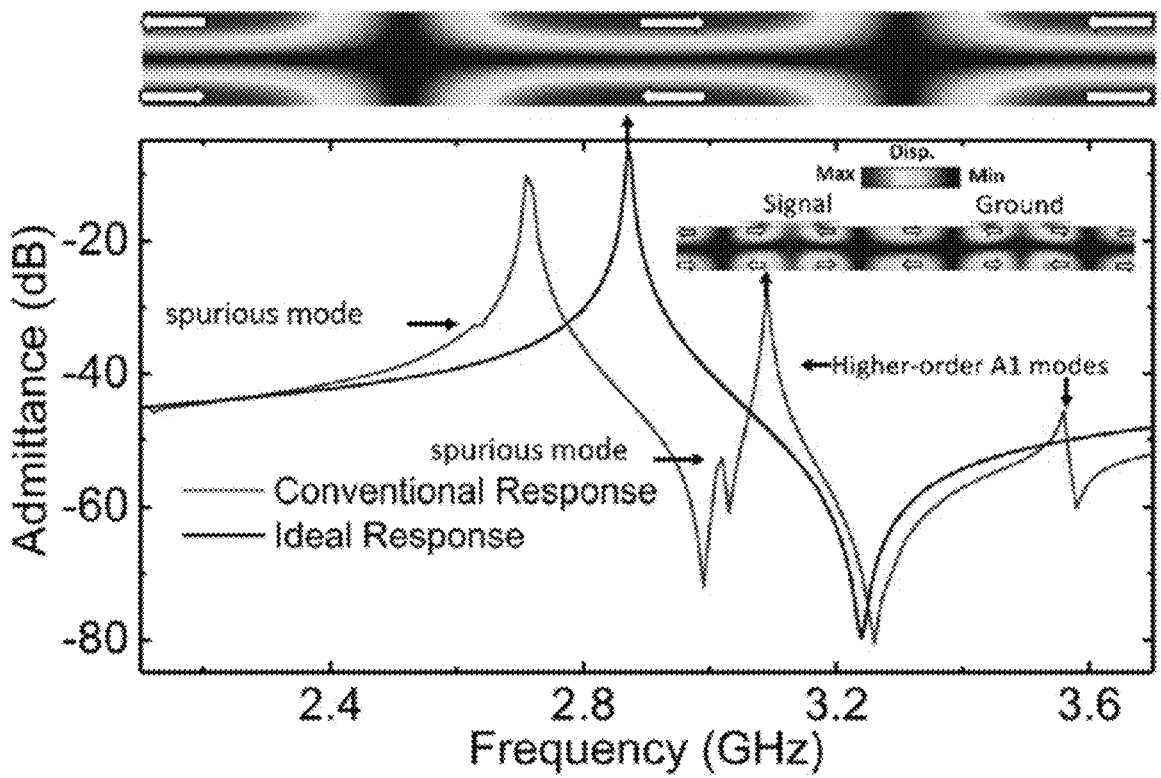
FIG. 28B is a graph and corresponding FEA-simulated result of admittance versus frequency of an A1 mode resonator with both electrical loading and mechanical loading according to an embodiment.

FIG. 28B is a graph and corresponding FEA-simulated result of admittance versus frequency of an A1 mode resonator with both electrical loading and mechanical loading according to an embodiment. To validate our analysis, the A1 mode resonator devices are simulated with FEA. As illustrated in FIG. 28B, the simulated response based on the structure shown in FIG. 27A presents three main resonances. Consistent with our analysis, one of these three resonances is the fundamental A1 featuring the largest kt$^2$, while others at higher frequencies are the lateral third-order and fifth-order A1. It is worth noting that the induced spurious modes are more significant after applying mechanical loading, which is consistent with our analyses. As a comparison shown in FIG. 28A and FIG. 28B, the ideal design is simulated by applying ideal periodic lateral electric fields without electrical and mechanical loadings on the top surface of LiNbO$_3$ thin film. The spurious-free response of the ideal design validates our analysis that the mechanical interfaces caused by the electrical and mechanical loadings are the primary sources of the lateral higher-order A1 spurious modes.

Figure 29B:
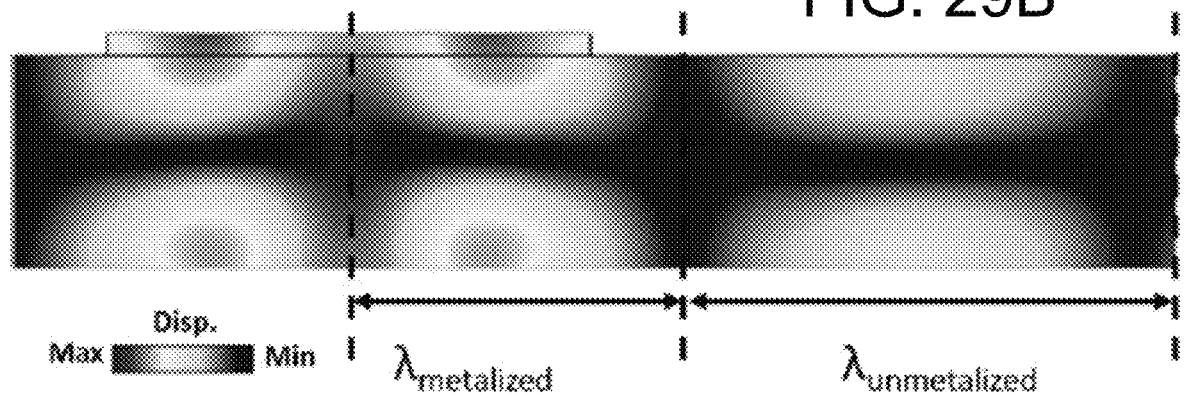
FIG. 29B is an FEA-simulated image of the A1 mode resonator of the graph of FIG. 29A according to an embodiment.
Figure 29A:
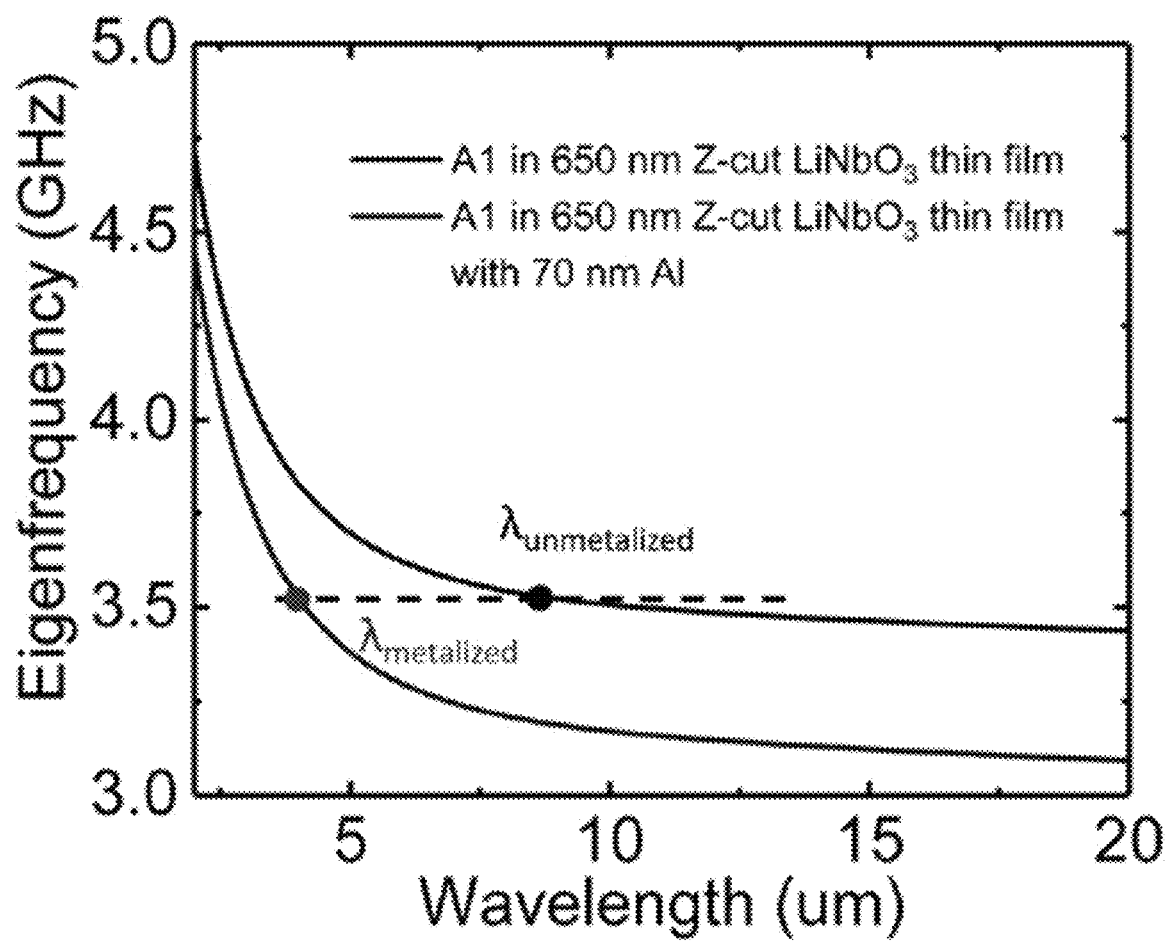
FIG. 29A is a graph illustrating calculated dispersion curves of an A1 mode resonator with and without aluminum electrodes according to some embodiments.

To study the reflections at the mechanical interfaces quantitatively, we use the dispersion mismatch to scale as the dispersion in specified film stacks takes the electrical and mechanical loadings into consideration simultaneously. FIG. 29A is a graph illustrating calculated dispersion curves of an A1 mode resonator with and without aluminum electrodes according to some embodiments. FIG. 29B is an FEA-simulated image of the A1 mode resonator of the graph of FIG. 29A according to an embodiment. Aluminum electrodes of 70 nm in thickness are first used. At the same eigenfrequency, A1 has different wavelengths in the LiNbO$_3$ sections with and without electrodes. This outcome is consistent with the displacement mode shapes in the COMOSL-based FEA. Although aluminum is a comparatively light material and preferred for reducing the reflections, the mismatch in dispersion caused by electrodes is still significant. In addition to the lateral higher-order A1 modes, the dispersion mismatch at the mechanical interfaces also can generate the higher-order fundamental symmetric (S0) and antisymmetric (A0) modes near the targeted frequency range. In some embodiments, the reflections are partially suppressed by reducing the feature size of the electrodes to make the ratio between G/(G+W$_e$) close to 1 to partially suppress the spurious modes. However, this method cannot entirely suppress the higher-order A1 modes and requires a small feature size of the resonators (W$_e$), which limits the freedom of design and leads to reduced power handling capability. In sum, we have identified the origins of spurious modes and the dispersion mismatch between metalized and un-metalized sections is the main reason. A new design is needed to achieve dispersion matching.

Figure 30:
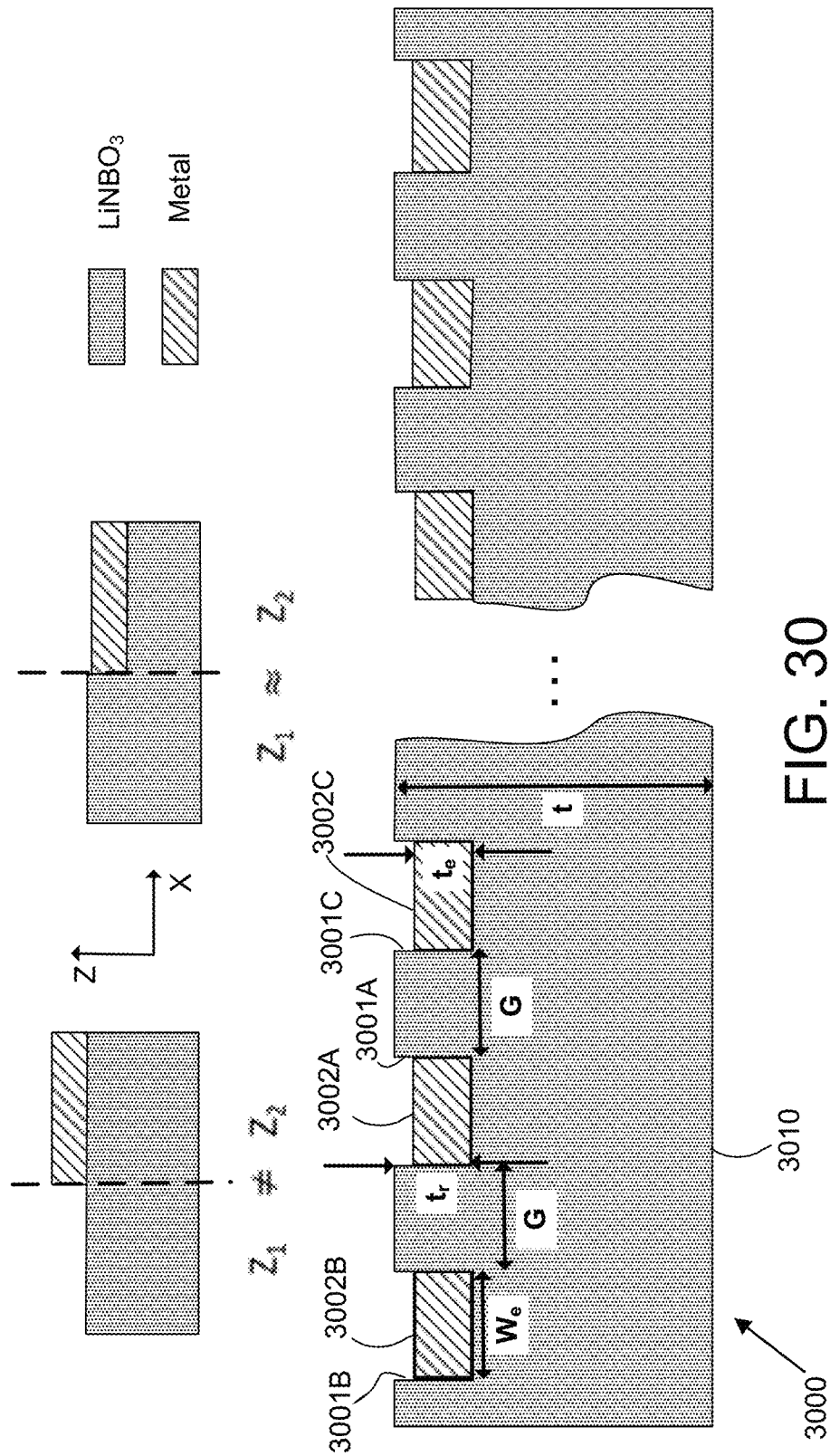
FIG. 30 is a cross-section view of a dispersion-matched recessed A1 mode resonator according to various embodiments.

From the analysis of the spurious mode origins, one way to mitigate spurious modes is to tune the dispersion in metalized sections to match the dispersion characteristics in the unmetalized sections. FIG. 30 is a cross-section view of a dispersion-matched recessed A1 mode resonator 3000 according to various embodiments. In these embodiments, the resonator 3000 includes a piezoelectric thin film 3010 suspended above a carrier substrate (see, for example, FIG. 10). In one embodiment, the piezoelectric thin film 3010 is lithium niobate (LiNbO$_3$) adapted to propagate an acoustic wave in a first-order asymmetric (A1) mode excited by a component of an electric field that is oriented in a longitudinal direction along a length of the piezoelectric thin film 3010. The A1 mode is one of a fundamental A1 mode or a higher-order A1 mode. The piezoelectric thin film can be between 550 nm to 750 nm, but other thicknesses are envisioned depending on design of other parameters.

In various embodiments, the piezoelectric thin film 3010 includes a first recess 3001A formed within the piezoelectric thin film of a first height (t$_r$) and oriented perpendicular to the longitudinal direction. The piezoelectric thin film 3010 includes a signal electrode 3002A disposed within the first recess 3001A and in physical contact with the piezoelectric thin film 3010, where the signal electrode is of a second height (t$_e$) that is less than the first height. The piezoelectric thin film 3010 includes a second recess 3001B formed within the piezoelectric thin film of the first height and oriented perpendicular to the longitudinal direction. A first ground electrode 3002B is disposed within the second recess 3001B and in physical contact with the piezoelectric thin film 3010, where the first ground electrode 3002B is of the second height and is separated from the signal electrode by a gap (G) defined by a longitudinal distance. The acoustic wave resonates within the gap, which is substantially confined between the two electrodes. The longitudinal distance can be between 2 µm to 10 µm, for example, or of some other similar range as will be discussed. The ground and signal electrodes can be alternatively positioned one after the other along the length of the piezoelectric thin film 3010, e.g., as interdigitated electrodes.

For example, in an embodiment, the piezoelectric thin film 3010 further includes a third recess 3001C formed within the piezoelectric thin film 3010 of the first height and oriented perpendicular to the longitudinal direction. The piezoelectric thin film 3010 includes a second ground electrode 3002C disposed within the third recess 3001C and in physical contact with the piezoelectric thin film 3010, where the ground electrode is of the second height and is separated from the signal electrode 3002A by a second gap (G) defined the longitudinal distance, and where the acoustic wave also resonates within the second gap. The second gap can be substantially the same longitudinal distance as the first gap.

In some embodiments, the first height and the second height can be formed such as to substantially suppress at least one of a longitudinal spurious mode, oriented in the longitudinal direction, or a vertical spurious mode, oriented in a thickness direction of the piezoelectric thin film. As will be discussed in more detail, the first height can be between 80 to 100 nm and the second height be between 60 to 80 nm.

The recessed electrodes (compared to the surface of the piezoelectric thin film 3010) are thus introduced to adjust the thickness of $LiNbO_3$ in the metalized sections to shift their dispersion characteristics, where the value of Z is the thickness in the vertical direction. In practice, the thickness of the top electrodes ($t_e$) should be close to the recessed depth ($t_r$) to minimize the surface discontinuities. Similar to the previous analysis, we first use aluminum as the top electrodes to validate our proposal and for purposes of experimentation.

Figure 31A:
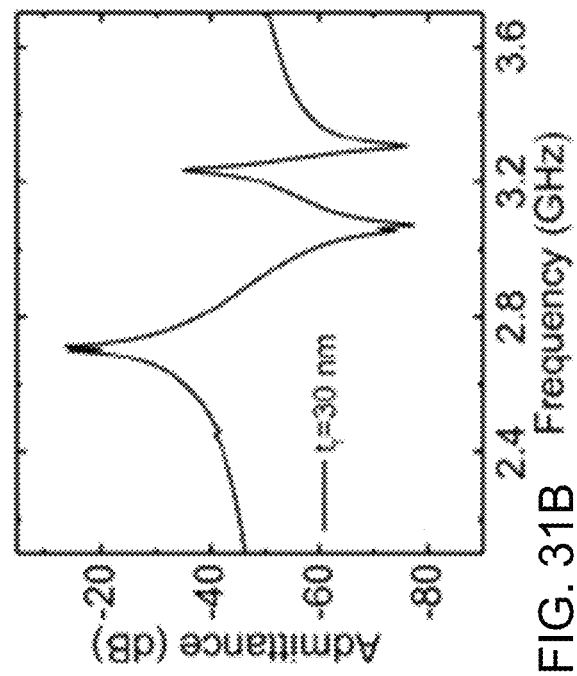
FIG. 31A is a graph illustrating calculated dispersion curves of an A1 mode resonator in different film stacked according to an embodiment.
Figure 31B:
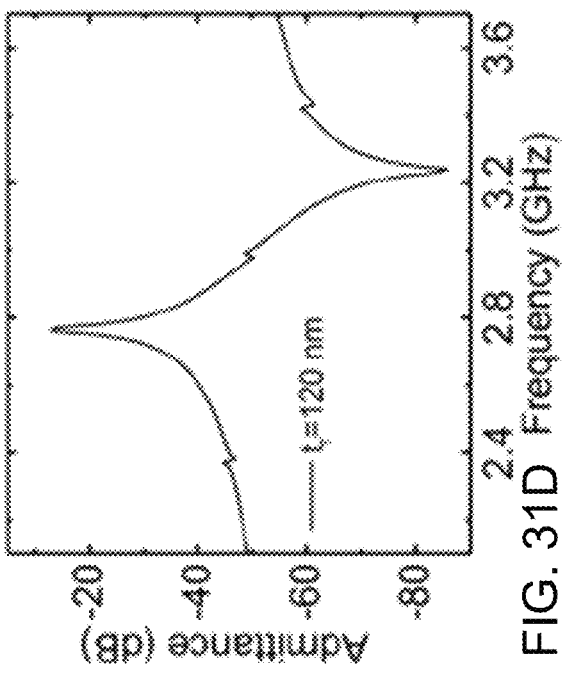
FIGS. 31B-31D are graphs illustrating FEA-simulated results based on the structure of the A1 mode resonator illustrated in FIG. 30 with recessed depth ($t_r$) and electrode depth ($t_e$) of different values according to various embodiments.
Figure 31C:
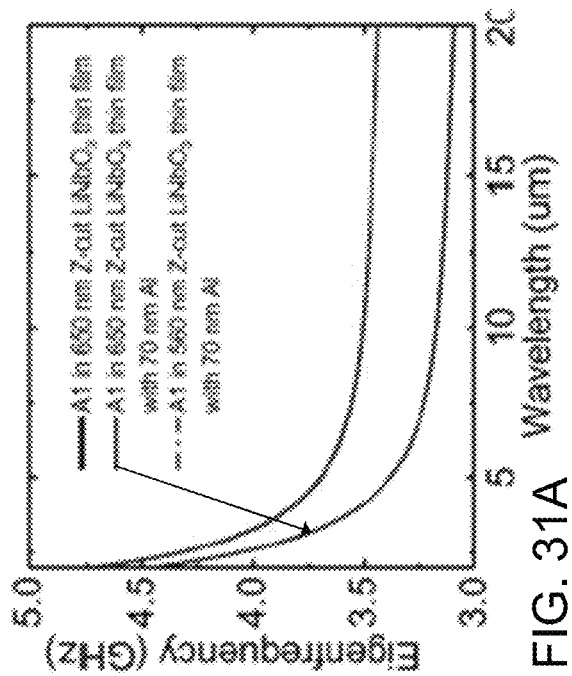
Figure 31D:
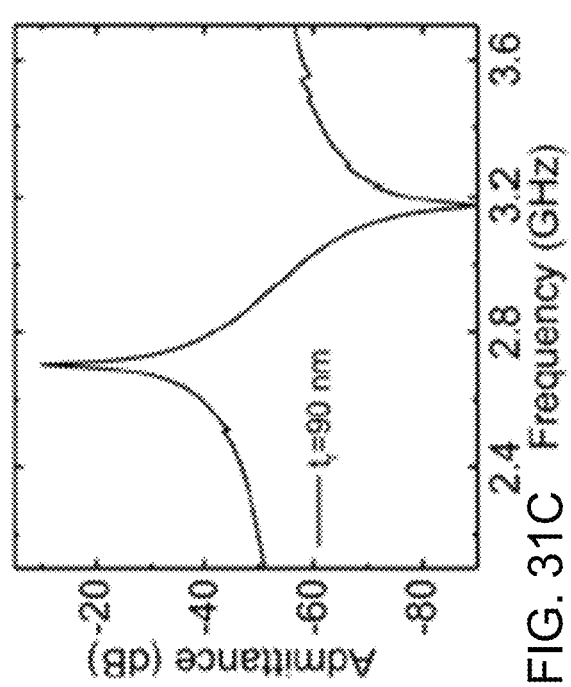

To balance the electrical and mechanical loading from 70 nm thick Al, the 650 nm thick $LiNbO_3$ thin film can be thinned down to 560 nm, for example. FIG. 31A is a graph illustrating calculated dispersion curves of an A1 mode resonator in different film stacked according to an embodiment. The proposed $LiNbO_3$ A1 resonator devices are simulated with different recessed depths ($t_r$) and 70 nm thick Al as electrodes. The structures of FIG. 31A have the same G of 4 µm, We of 3 µm, and cell number of 10 for purposes of experimentation and comparison. In the recessed design with a 20 nm depth, the dispersion mismatch still exists, and the lateral third-order A1 spurious mode is pronounced, which is illustrated in FIG. 31B. After increasing the recessed depth to 90 nm, which is an optimized value to match to 650 nm thick $LiNbO_3$, the FEA-simulated response presents a spurious-free result, which is illustrated in FIG. 31C. Further increasing the recessed depth breaks the balance and re-generates spurious modes. However, the spurious modes excited in the recessed structure with a depth of 120 nm are subdued, as illustrated in FIG. 31D. This is because the electric field is optimized in the recessed structures, causing the electrical boundaries, at where the electric field strength is zero, to approach the mechanical interfaces at the edges of the top electrodes.

Figure 32B:
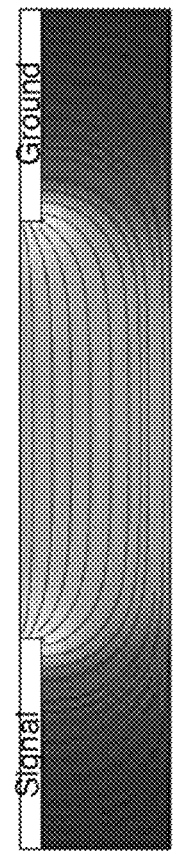
FIGS. 32A-32D are a set of FEA-simulated images of electric field distributions with electric field lines for different values of recessed depth ($t_r$) of the A1 resonator illustrated in FIG. 30 according to some embodiments.
Figure 32D:
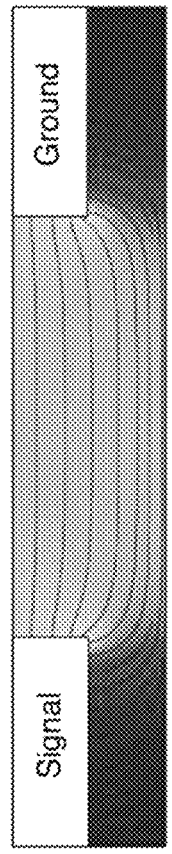
Figure 32A:
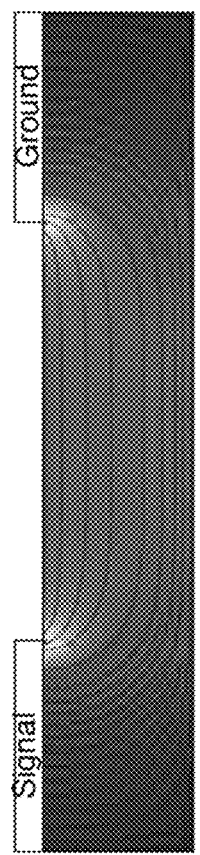
Figure 32C:
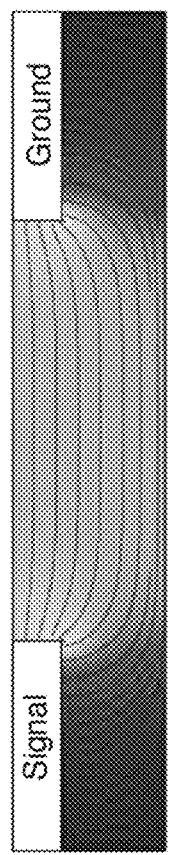
Figure 33A:
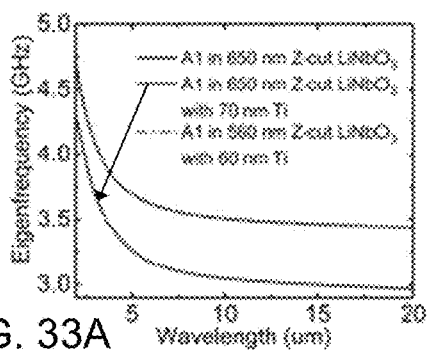
FIGS. 33A-33J are graphs illustrating calculated dispersion of A1 modes in different film stacks and FEA-simulated results of the conventional and recessed designs and based on different metals used for electrodes according to various embodiments.
Figure 33B:
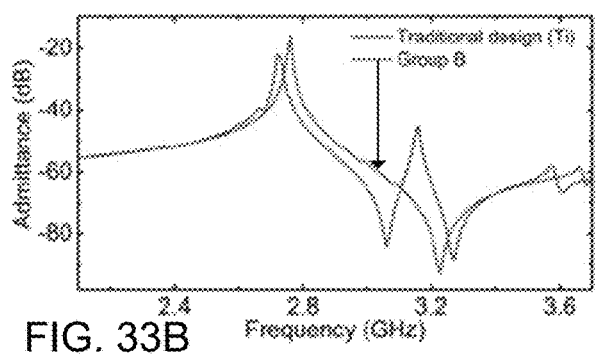
Figure 33C:
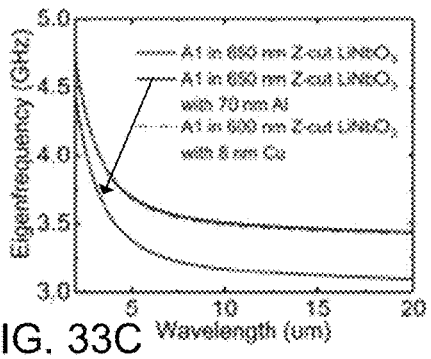
Figure 33D:
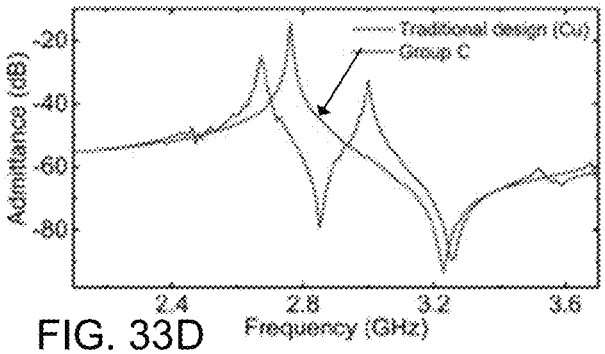
Figure 33E:
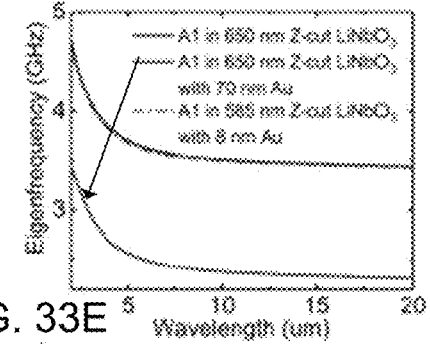
Figure 33F:
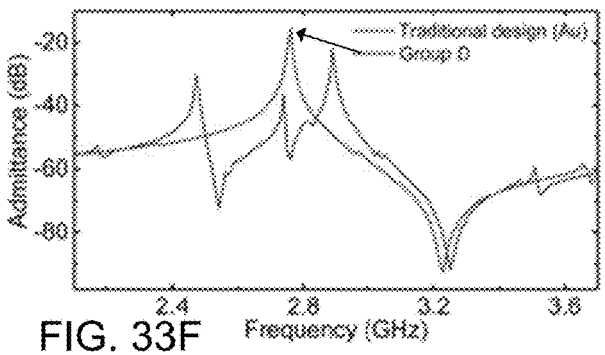
Figure 33G:
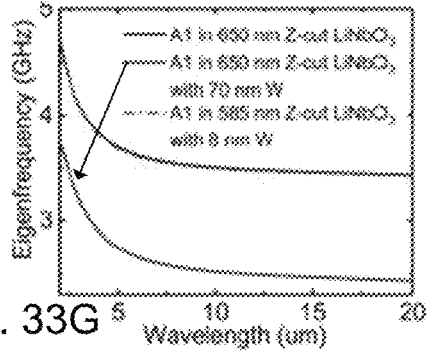
Figure 33H:
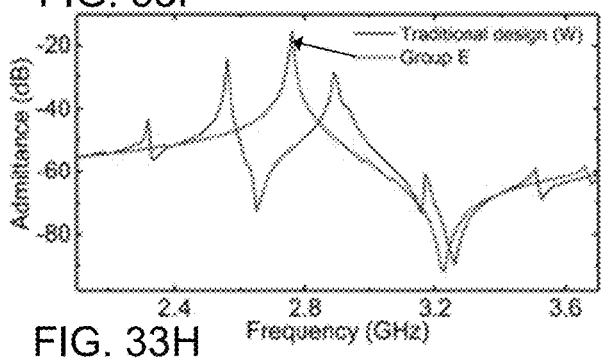
Figure 33I:
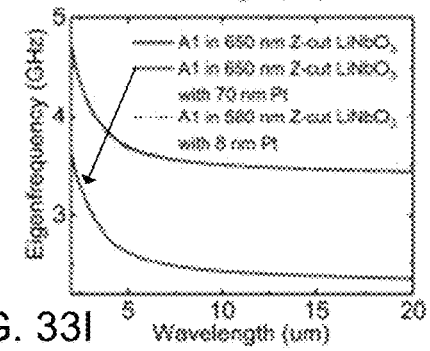
Figure 33J:
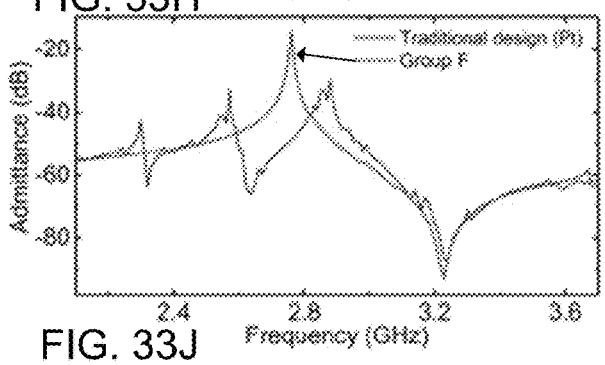

FIGS. 32A-32D are a set of FEA-simulated images of electric field distributions with electric field lines for different values of recessed depth ($t_r$) of the A1 resonator illustrated in FIG. 30 according to some embodiments. For example, the value of $t_r$ in FIG. 32A is zero ("0"), in FIG. 32B is (1/6)·t, in FIG. 32C is (1/3)·t, and in FIG. 32D is (1/2)·t, where t is the thickness of the piezoelectric thin film 3010.

As illustrated, the electric field is focused in the piezoelectric thin film section without electrodes, and it is closer to being the ideal lateral electric field in the deeper recessed structure.

TABLE 9

Parametes of Typically Used Metals

| Metal | Density ($kg/m^3$) | Electrical Resistivity ($n\Omega \cdot m$) |
|---|---|---|
| Al | 2700 | 26.5 |
| Ti | 4500 | 420 |
| Cu | 8960 | 16.78 |
| Au | 19300 | 22.14 |
| W | 19300 | 52.8 |
| Pt | 21450 | 105 |

TABLE 10

Designs Based on Different Metals

| Group | Metal | $t_e$ (nm) | $t_e$ (nm) |
|---|---|---|---|
| A | Al | 70 | 90 |
| B | Ti | 60 | 90 |
| C | Cu | 8 | 65 |
| D | Au | 8 | 65 |
| E | W | 8 | 70 |
| F | Pt | 8 | 65 |

In addition to Al, the recessed structure also can be applied to other metals. Table 9 lists the parameters of typically used metals (e.g., titanium (Ti), copper (Cu), gold (Au), platinum (Pt), and tungsten (W)) for acoustic devices. Table 10 presents the designs of recessed devices based on different metals. To show feasibility, the dispersion of film stacks involving these metals is calculated to find the optimal combination.

FIGS. 33A-33J are graphs illustrating calculated dispersion of A1 modes in different film stacks and FEA-simulated results of the conventional and recessed designs and based on different metals used for electrodes according to various embodiments. As illustrated, a heavier metal leads to a more substantial mismatch due to its greater mechanical loading effect. As a comparison, the FEA-simulated results based on the conventional and recessed structures (with the corresponded optimized designs) are presented in FIGS. 33B, 33D, 33F, 33H, and 33J. The spurious modes caused by the electrical and mechanical loadings are all suppressed in the recessed designs.

Figure 34:
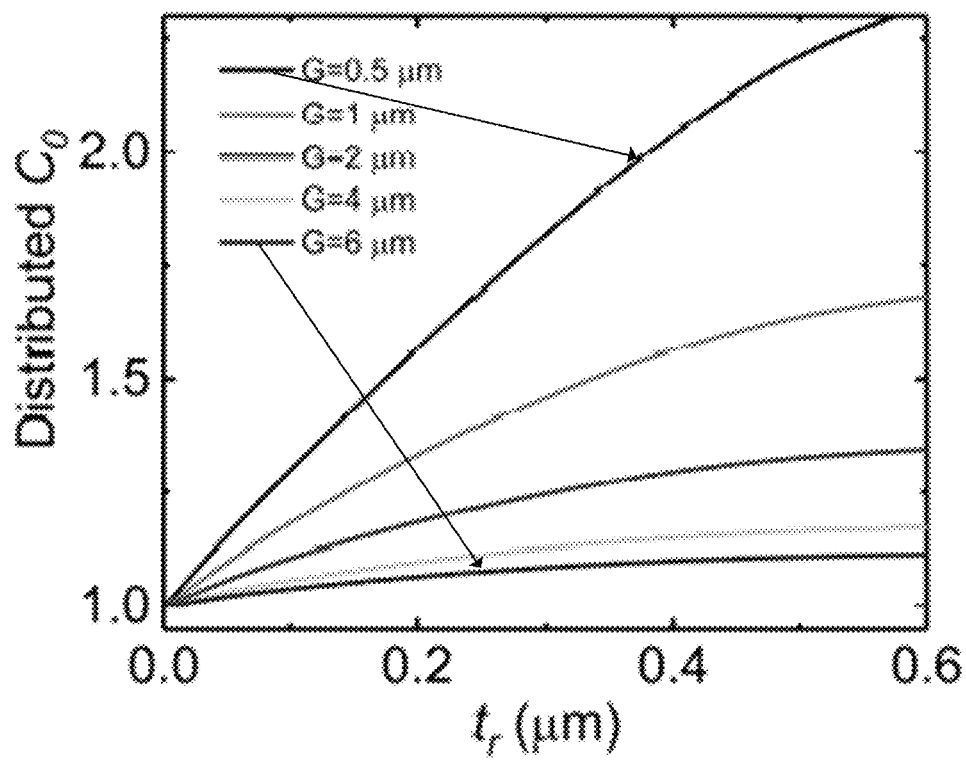
FIG. 34 is a graph illustrating the effects of the recessed depth on the distributed static capacitance per unit area ($C_0$) of the A1 mode resonators based on a 650 nanometer (nm) thick LiNbO$_3$ film according to various embodiments.
Figure 35:
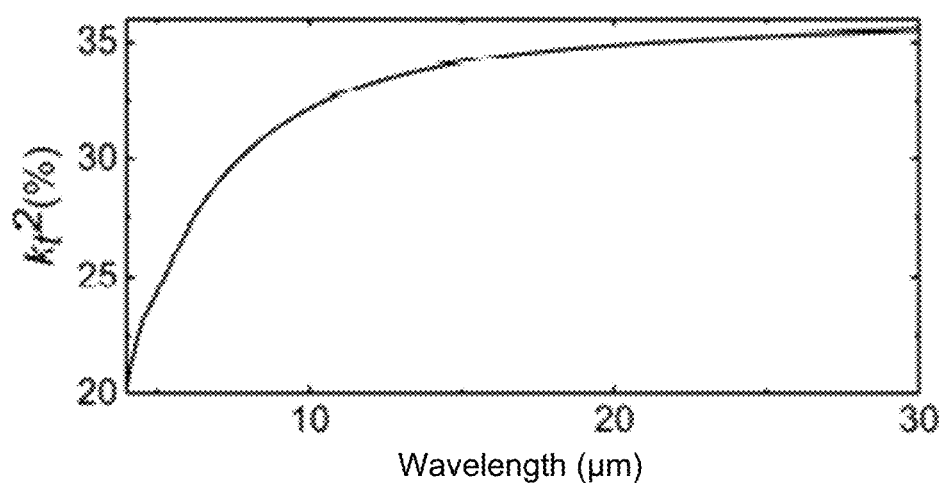
FIG. 35 is a graph illustrating the calculated electromechanical coupling coefficients (k) of the A1 mode in the recessed design of FIG. 30 according to an embodiment.

In addition to the suppression of the spurious modes, the recessed designs also can help to increase the static capacitance per unit area (referred to as distributed $C_0$ onward), resulting in smaller device footprints for matching to 50Ω. FIG. 34 is a graph illustrating the effects of the recessed depth on the distributed static capacitance per unit area ($C_0$) of the A1 mode resonators based on a 650 nanometer (nm) thick $LiNbO_3$ film according to various embodiments. This distributed $C_0$ in the recessed designs is normalized to its counterpart in a conventional configuration ($t_r$=0). The results suggest that a larger $t_r$ leads to a greater distributed $C_0$, and the trend is more significant in a device with smaller gap, G. To maximize distributed $C_0$, the gap, G, should be as small as possible while $t_r$ should be as large as possible. However, as described in the previous section, G also affects the wavelength of A1. As shown in FIG. 35, a smaller wavelength leads to a smaller $kt^2$. Therefore, a tradeoff should be made between the footprint (or distributed $C_0$) and $kt^2$. Considering the large fractional bandwidth (FBW) of 5G NR, the minimum value of the gap, G, in this work is set to be 4 µm to achieve sufficient $kt^2$. Due to the limitations of our in-house fabrication, the width of the top electrodes is set to be 3 µm, and the recessed depth ($t_r$) is limited to be less than 100 nm, which were selected for purposes of experimentation. Other combinations of these parameters are envisioned.

Although all investigated metals can, in theory, work in the recessed design, some of them are not a practicable due to the required small thickness for dispersion matching and its potential high electric loss. In practice, the material for top electrodes should feature high conductivity and allow for sufficient thickness. Therefore, thick electrodes with a density of less than $LiNbO_3$'s are preferred. Based on the parameters listed in Table 9 and Table 10, aluminum (Al) is the best option, although titanium (Ti) or an aluminum-titanium alloy are also viable choices. For purposes of experimentation and explanation, we focus on implementing top electrodes in aluminum to demonstrate the proposed method.

Figure 36:
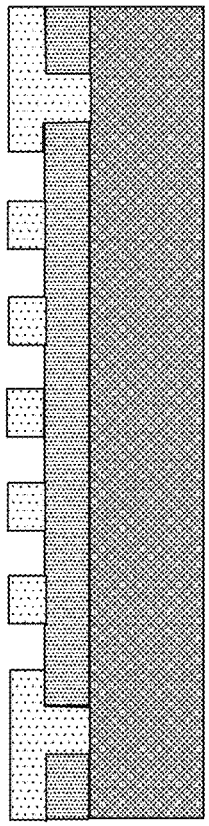
FIG. 36 are cross-section images of a process for fabrication of the A1 mode resonator design using recessed electrodes according to some embodiments.
Figure 36:
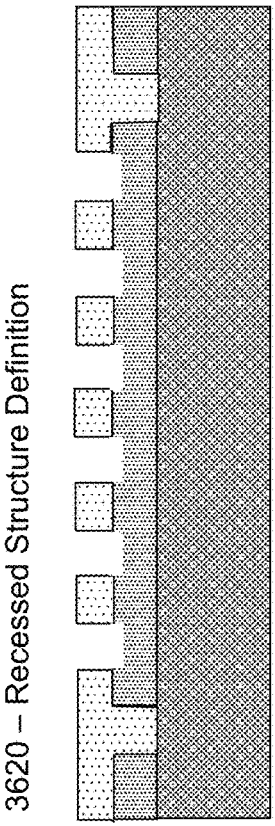
Figure 36:
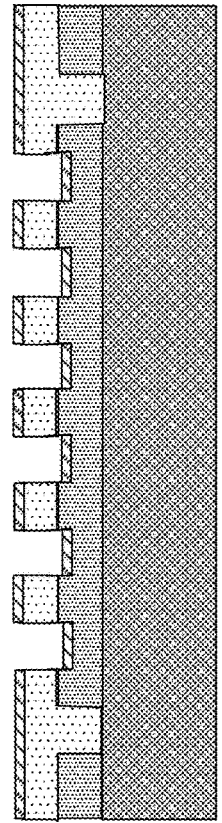
Figure 36:
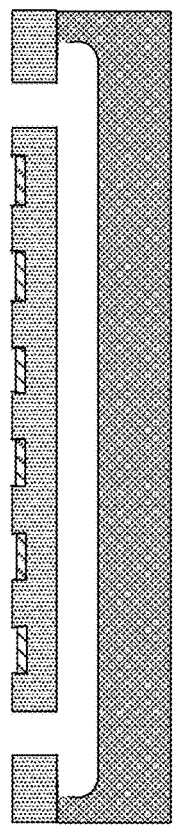
Figure 36:
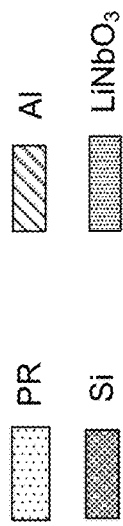

FIG. 36 are cross-section images of a process 3600 for fabrication of the A1 mode resonator design using recessed electrodes according to some embodiments. The designed A1 resonators were fabricated on a 650 nm thick Z-cut $LiNbO_3$ thin-film following the process described with reference to FIG. 21. While Z-cut $LiNbO_3$ is discussed by way of example for the piezoelectric thin film, other cuts and/or or $LiTaO_3$ can also be used as discussed herein. Additional process steps, as illustrated in FIG. 36, are incorporated to micro-machine the recessed electrodes.

At operation 3610, a photoresist is first patterned for defining the recesses in which the top electrodes, e.g., signal electrodes and ground electrodes, are to be disposed. At operation 3620, the $LiNbO_3$ sections, which will be covered by electrodes, are thinned in an inductively coupled plasma (ICP)-reactive ion etching (RIE) system. At operation 3630, a layer of metal (e.g., a 70 nm thick Al layer) is deposited over the patterned photoresist. The photoresist remaining after the step of $LiNbO_3$ thinning further serves as the photoresist for electrodes lift-off, thus achieving the self-alignment of electrodes and recessed sections. At operation 3640, the metal layer is subsequently evaporated and lifted-off, e.g. via photoresist removal, leaving the top electrodes in the recessed sections. At operation 3650, to complete the process 3600, the Si under $LiNbO_3$ is removed with $XeF_2$-based dry etching to suspend the devices.

Figure 37A:
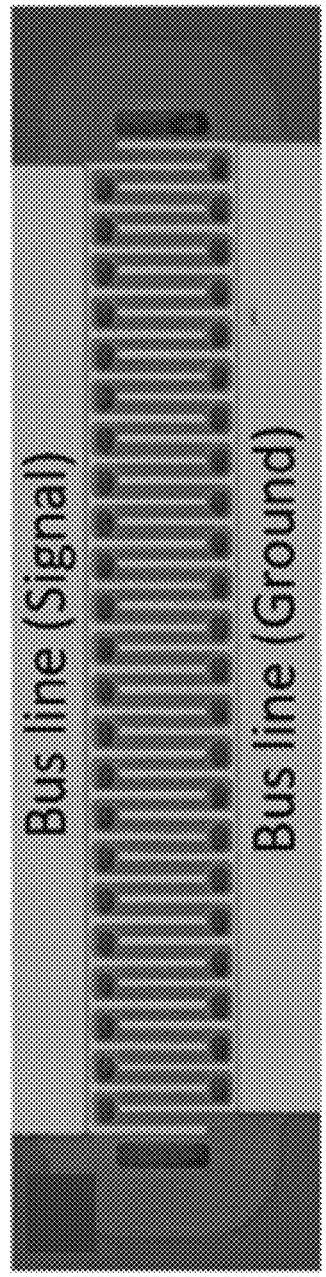
FIG. 37A is a microscope image of the fabricated A1 mode resonator based on the suspended 650 nm thick LiNbO$_3$ film according to an embodiment.
Figure 37D:
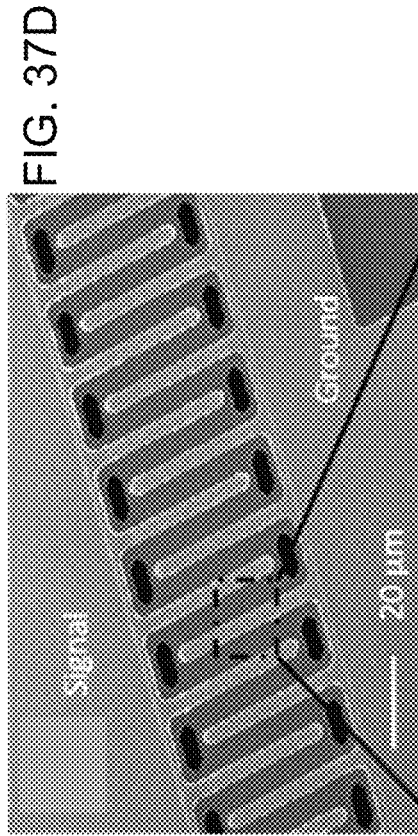
FIGS. 37D-37E are a scanning electron microscope (SEM) image of a fabricated A1 resonator with recessed electrodes and a zoomed-in view of a recessed electrode thereof, respectively, according to an embodiment.
Figure 37B:
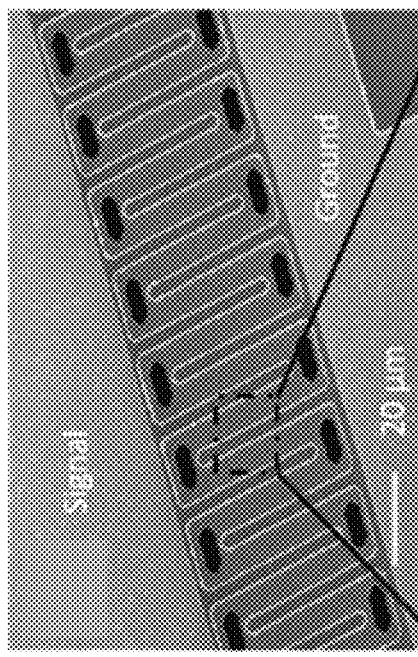
FIGS. 37B-37C are a scanning electron microscope (SEM) image of a conventional fabricated A1 resonator without recessed electrodes and a zoomed-in view of an electrode thereof, respectively, according to an embodiment.
Figure 37E:
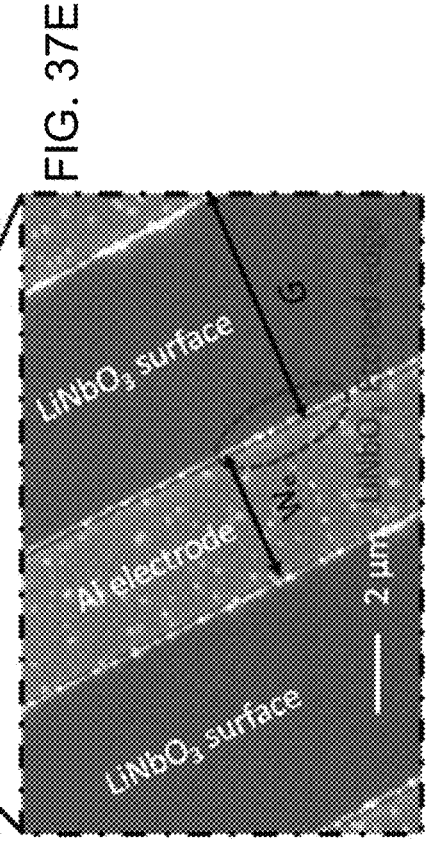
Figure 37C:
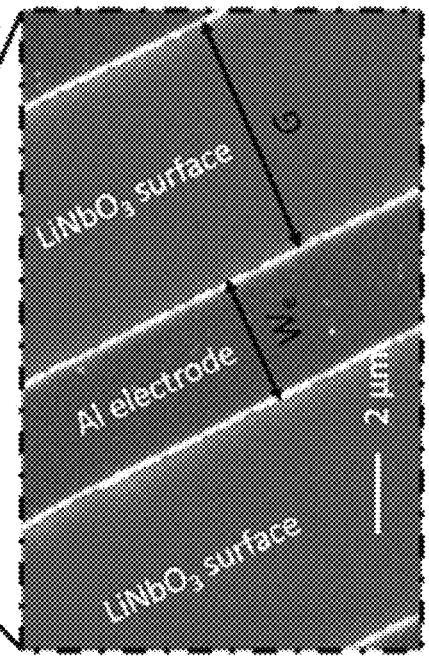

FIG. 37A is a microscope image of the fabricated A1 mode resonator based on the suspended 650 nm thick $LiNbO_3$ film according to an embodiment. To reveal the difference between the traditional and recessed structures, the devices based on these two structures with the same lateral dimensions were fabricated. The SEM images of the fabricated traditional and recessed devices are illustrated in FIG. 37B and FIG. 37D, respectively. The zoomed-in views clearly show the difference between the electrodes protruding off the $LiNbO_3$ surface (FIG. 37C) and the electrodes disposed within the recessed grooves (FIG. 37E). In the recessed designs, the thickness of the $LiNbO_3$ under the electrodes is thinned down to be 560 nm, and the thickness of the A1 in the recessed grooves is 70 nm, although other dimensions are envisioned. For example, three different groups of devices with different lateral dimensions are designed, and their parameters are listed in Table 11. In each group, both conventional design ($t_r$=0) and recessed design ($t_r$=90 nm) were fabricated to demonstrate the feasibility of our proposed method.

TABLE 11

Design Parameters and Measured Key Values of the Fabricated A1 Devices

| Device | G | $W_e$ | $t_e$ | $t_r$ | Recessed | $Q_{MB}$ | $k_t^2$ |
|---|---|---|---|---|---|---|---|
| Group 1 | 4 µm | 3 µm | 70 nm | 0 nm | No | 70 | 19% |
| | | | | 70 nm | Yes | 327 | 28% |
| Group 2 | 6 µm | 3 µm | 70 nm | 0 nm | No | 170 | 20% |
| | | | | 70 nm | Yes | 350 | 28% |
| Group 3 | 8 µm | 3 µm | 70 nm | 0 nm | No | 790 | 19% |
| | | | | 70 nm | Yes | 692 | 28% |

Figure 38A:
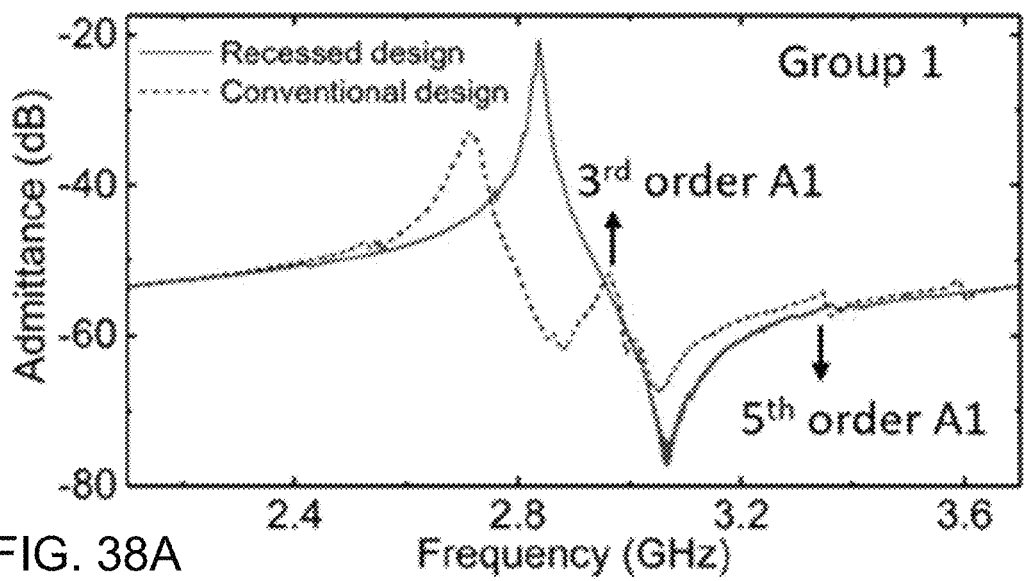
FIGS. 38A-38C are graphs illustrating measurement results of various resonator devices based on conventional and recessed designs having different lateral dimensions, in three groups as specified in Table 11, according to various embodiments.
Figure 38B:
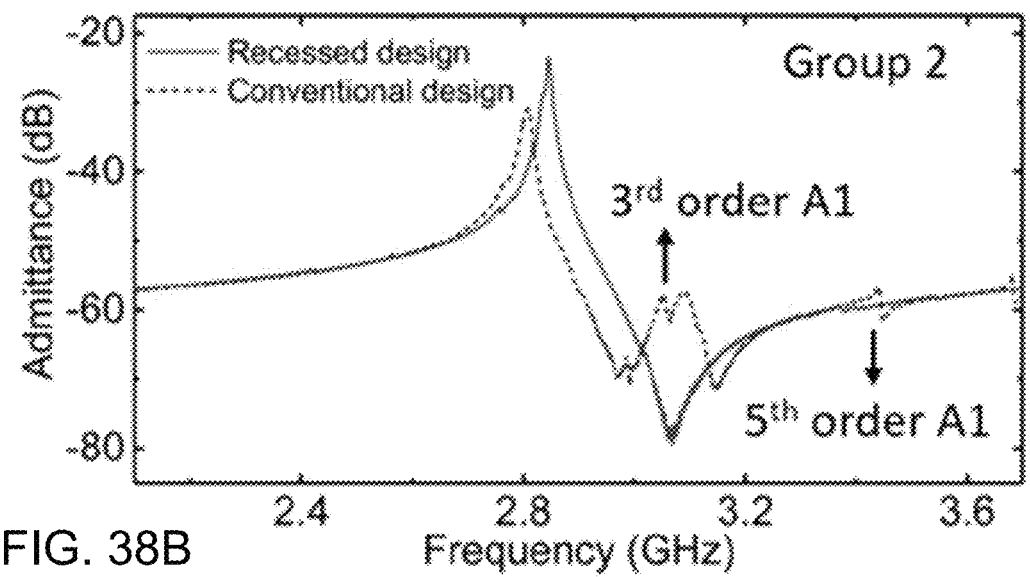
Figure 38C:
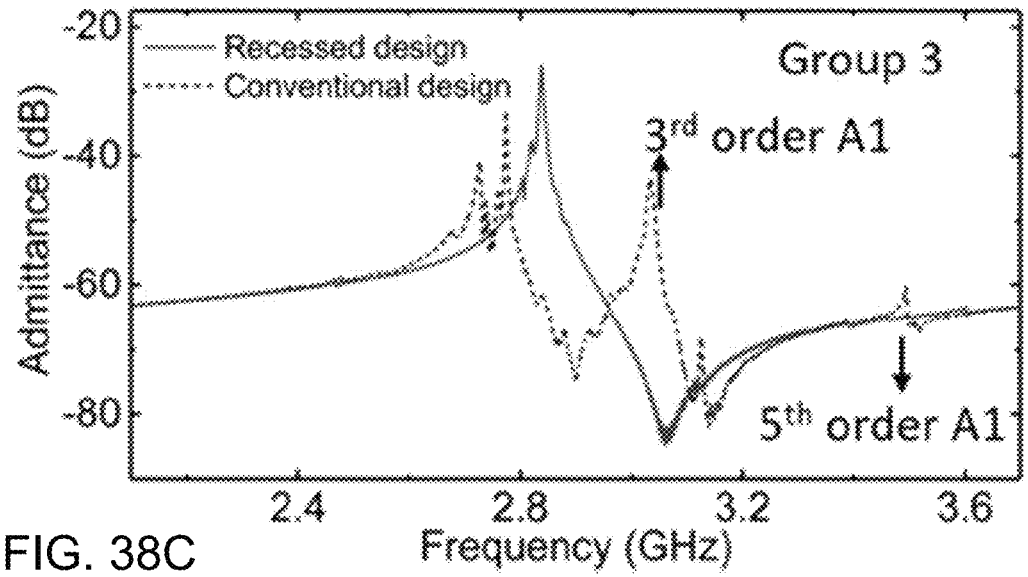

The fabricated devices were characterized at room temperature in the air with a Keysight N5249A PNA network analyzer. FIGS. 38A-38C are graphs illustrating measurement results of various resonator devices based on conventional and recessed designs having different lateral dimensions, in three groups as specified in Table 11, according to various embodiments. Consistent with our theoretical analyses, the devices based on the conventional design show several spurious responses with significant $kt^2$, while the fundamental A1 features a low $kt^2$ (<20%). The resonant frequencies of the excited higher-order A1 in the conventional designs are also consistent with Equation 20 that 3rd order and 5th order A1 feature higher resonant frequencies in the group with larger G.

On the other hand, all of the devices employing the recessed electrodes exhibit near spurious-free responses with a maximum $Q_{3dB}$ of 692 and $kt^2$ of 28%. Good agreement is obtained between the measurement and the analysis. Consistent with the calculated dispersion curves (FIG. 31), A1 in the recessed design exhibits higher resonant frequency than in the conventional design. In addition to $kt^2$ and resonant frequencies, the relatively high Qs achieved in the recessed devices suggest that the surface micromachining of the $LiNbO_3$ thin film does not pose a lower limit than the existing loss-inducing factors. Comparing these three recessed devices with the same $W_e$, the $Q_{3dB}$ is higher for a greater G. This is likely caused by the lower metal coverage and subsequently smaller mechanical loss from metal.

In this work, we have demonstrated a new method to suppress the spurious modes in $LiNbO_3$ A1 mode resonators. The simple fabrication process for the recessed electrodes is also described and demonstrated. All fabricated devices based on the proposed method exhibit spurious-free responses with high Qs and enhanced $kt^2$. The design variations show the broad applicability of our proposed recessed structure. Upon further optimization, this method would help $LiNbO_3$ A1 mode devices become the promising solution in next-generation 5G front-ends for signal processing.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims can generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein can be combined in a particular implementation or embodiment. The terms "first," "second," "third," "fourth," etc. as used herein are meant as labels to distinguish among different elements and can not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus comprising:
   a piezoelectric thin film suspended above a carrier substrate, wherein the piezoelectric thin film comprises one of lithium niobate ($LiNbO_3$) or lithium tantalate ($LiTaO_3$) adapted to propagate an acoustic wave in a Lamb wave mode excited by a component of an electric field that is oriented in a longitudinal direction along a length of the piezoelectric thin film;
   a signal electrode disposed on, and in physical contact with, the piezoelectric thin film and oriented perpendicular to the longitudinal direction;
   a ground electrode disposed on, and in physical contact with, the piezoelectric thin film and oriented perpendicular to the longitudinal direction, wherein the ground electrode is separated from the signal electrode by a gap comprising a longitudinal distance and in which the acoustic wave resonates; and
   a release window formed within the piezoelectric thin film adjacent to the ground electrode.

2. The apparatus of claim 1, wherein the piezoelectric thin film comprises one of a Z cut, a Y cut, or an X cut.

3. The apparatus of claim 1, wherein the carrier substrate also comprises one of $LiNbO_3$ or $LiTaO_3$, the apparatus further comprising a cavity formed between the carrier substrate and the piezoelectric thin film, wherein a length of the gap between the signal electrode and the ground electrode comprises a length of the cavity.

4. The apparatus of claim 1, wherein a resonant frequency of the Lamb wave mode is determined at least in part by the longitudinal distance of the gap, and the longitudinal distance is between 1 microns (μm) and 25 μm.

5. The apparatus of claim 1, wherein the signal electrode and the ground electrode comprise gold and are of a thickness between 40 and 60 nanometers (nm).

6. The apparatus of claim 1, wherein a thickness of the piezoelectric thin film is between 350 nm and 700 nm.

7. The apparatus of claim 1, wherein the Lamb wave mode is one of a first-order asymmetric (A1) mode, a third-order asymmetric (A3) mode, a fifth-order asymmetric (A5) mode, a seventh-order asymmetric (A7) mode, a ninth-order asymmetric (A9) mode, an eleventh-order asymmetric (A11) mode, or a thirteenth-order asymmetric (A13) mode.

8. The apparatus of claim 1, wherein the ground electrode is a first ground electrode, the apparatus further comprising:
   a second ground electrode disposed on, and in physical contact with, the piezoelectric thin film and oriented perpendicular to the longitudinal direction, wherein the second ground electrode is also separated from the signal electrode by a second gap comprising the longitudinal distance, and wherein the acoustic wave also resonates within the second gap; and
   a second release window formed within the piezoelectric thin film adjacent to the second ground electrode.

9. The apparatus of claim 8, wherein the signal electrode, the first ground electrode, and the second ground electrode are interdigital electrodes, and wherein a width of each of the first ground electrode and the second ground electrode is half of a width of the signal electrode.

10. An acoustic filter comprising:
    a first shunt resonator array coupled to a ground;
    a second shunt resonator array coupled to the ground; and
    a series resonator array coupled between the first shunt resonator array and the second shunt resonator array, wherein the first shunt resonator array, the second shunt resonator array, and the series resonator array each comprises an acoustic resonator comprising:
        a piezoelectric thin film suspended above a carrier substrate, wherein the piezoelectric thin film comprises one of lithium niobate ($LiNbO_3$) or lithium tantalate ($LiTaO_3$) adapted to propagate an acoustic wave in a Lamb wave mode excited by a component of an electric field that is oriented in a longitudinal direction along a length of the piezoelectric thin film;

a signal electrode disposed on, and in physical contact with, the piezoelectric thin film and oriented perpendicular to the longitudinal direction;
a ground electrode disposed on, and in physical contact with, the piezoelectric thin film and oriented perpendicular to the longitudinal direction, wherein the ground electrode is separated from the signal electrode by a gap comprising a longitudinal distance and in which the acoustic wave resonates; and
a release window formed within the piezoelectric thin film adjacent to the ground electrode.

11. The acoustic filter of claim 10, further comprising:
a series inductor coupled in parallel to the series resonator array;
a first shunt inductor coupled in parallel to the first shunt resonator array; and
a second shunt inductor coupled in parallel to the second shunt resonator array, the series inductor, the first shunt inductor, and the second shunt inductor are selected to increase an electromechanical coupling of the acoustic filter.

12. The acoustic filter of claim 10, further comprising:
a first impedance element coupled to the ground and coupled in parallel with the first shunt resonator array; and
a second impedance element coupled to the ground and coupled in parallel with the second shunt resonator array, wherein the series resonator array is further coupled between the first impedance element and the second impedance element.

13. The acoustic filter of claim 10, wherein the piezoelectric thin film comprises one of a Z cut, a Y cut, or an X cut.

14. The acoustic filter of claim 10, wherein a resonant frequency of the Lamb wave mode is determined at least in part by the longitudinal distance of the gap, and the longitudinal distance is between 2 µm and 10 µm.

15. The acoustic filter of claim 10, wherein the Lamb wave mode is one of a first-order asymmetric (A1) mode, a third-order asymmetric (A3) mode, a fifth-order asymmetric (A5) mode, a seventh-order asymmetric (A7) mode, a ninth-order asymmetric (A9) mode, an eleventh-order asymmetric (A11) mode, or a thirteenth-order asymmetric (A13) mode.

16. The acoustic filter of claim 10, wherein the carrier substrate also comprises $LiNbO_3$ or $LiTaO_3$, the acoustic resonator further comprises a cavity formed between the carrier substrate and the piezoelectric thin film, and wherein a length of the gap between the signal electrode and the ground electrode comprises a length of the cavity.

17. The acoustic filter of claim 16, wherein the gap of the acoustic resonator of each of the first shunt resonator array and of the second shunt resonator array is a first gap, and the gap of the acoustic resonator of the series resonator array is a second gap that is different in size than the first gap.

18. The acoustic filter of claim 17, wherein a first resonant frequency of the first shunt resonator array and of the second shunt resonator array is determined by the first gap and a second resonant frequency of the series resonator array is determined by the second gap, and wherein the first gap is between 5 µm to 8 µm and the second gap is between 2 µm to 4 µm.

19. The acoustic filter of claim 10, wherein the ground electrode is a first ground electrode, the acoustic resonator further comprising:
a second ground electrode disposed on, and in physical contact with, the piezoelectric thin film and oriented perpendicular to the longitudinal direction, wherein the second ground electrode is also separated from the signal electrode by a second gap comprising the longitudinal distance, and wherein the acoustic wave also resonates within the second gap; and
a second release window formed within the piezoelectric thin film adjacent to the second ground electrode.

20. The acoustic filter of claim 19, wherein the signal electrode, the first ground electrode, and the second ground electrode are interdigital electrodes, and wherein a width of each of the first ground electrode and the second ground electrode is half of a width of the signal electrode.

21. The acoustic filter of claim 10, wherein the first shunt resonator array, the second shunt resonator array, and the series resonator arrays each comprise an identical number of acoustic resonators.

22. An apparatus comprising:
a piezoelectric thin film suspended above a carrier substrate, wherein the piezoelectric thin film comprises one of lithium niobate ($LiNbO_3$) or lithium tantalate ($LiTaO_3$) adapted to propagate an acoustic wave in a first-order asymmetric (A1) mode excited by a component of an electric field that is oriented in a longitudinal direction along a length of the piezoelectric thin film;
a first recess formed within the piezoelectric thin film of a first height and oriented perpendicular to the longitudinal direction;
a signal electrode disposed within the first recess and in physical contact with the piezoelectric thin film, wherein the signal electrode is of a second height that is less than the first height;
a second recess formed within the piezoelectric thin film of the first height and oriented perpendicular to the longitudinal direction; and
a ground electrode disposed within the second recess and in physical contact with the piezoelectric thin film, wherein the ground electrode is of the second height and is separated from the signal electrode by a gap comprising a longitudinal distance, wherein the acoustic wave resonates within the gap.

23. The apparatus of claim 22, wherein the A1 mode is one of a fundamental A1 mode or a higher-order A1 mode.

24. The apparatus of claim 22, wherein the first height and the second height are formed such as to substantially suppress at least one of a longitudinal spurious mode, oriented in the longitudinal direction, or a vertical spurious mode, oriented in a thickness direction of the piezoelectric thin film.

25. The apparatus of claim 22, wherein the first height is between 80 nm to 100 nm and the second height is between 60 nm to 80 nm.

26. The apparatus of claim 22, wherein each of the signal electrode and the ground electrode comprise aluminum, titanium, or a combination thereof.

27. The apparatus of claim 22, wherein the longitudinal distance is between 1 µm to 25 µm.

28. The apparatus of claim 22, wherein a thickness of the piezoelectric thin film is between 550 nm to 750 nm.

29. The apparatus of claim 22, wherein the ground electrode is a first ground electrode, the apparatus further comprising:
a third recess formed within the piezoelectric thin film of the first height and oriented perpendicular to the longitudinal direction; and
a second ground electrode disposed within the third recess and in physical contact with the piezoelectric thin film, wherein the second ground electrode is of the second height and is separated from the signal electrode by a second gap comprising the longitudinal distance, and wherein the acoustic wave also resonates within the second gap.

30. The apparatus of claim 29, wherein the signal electrode, the first ground electrode, and this ground electrode are interdigital electrodes.

* * * * *